US007539340B2

United States Patent
Kochi et al.

(10) Patent No.: US 7,539,340 B2
(45) Date of Patent: May 26, 2009

(54) APPARATUS AND METHOD FOR THREE-DIMENSIONAL COORDINATE MEASUREMENT

(75) Inventors: Nobuo Kochi, Tokyo (JP); Yasuko Tsuruga, Tokyo (JP)

(73) Assignee: Topcon Corporation, Tokyo (JP)

( * ) Notice: Subject to any disclaimer, the term of this patent is extended or adjusted under 35 U.S.C. 154(b) by 1261 days.

(21) Appl. No.: 10/830,456

(22) Filed: Apr. 23, 2004

(65) Prior Publication Data

US 2004/0264764 A1 Dec. 30, 2004

(30) Foreign Application Priority Data

Apr. 25, 2003 (JP) ............................ 2003-122714
Jun. 2, 2003 (JP) ............................ 2003-157216

(51) Int. Cl.
G06K 9/00 (2006.01)

(52) U.S. Cl. ...................................... 382/154

(58) Field of Classification Search ........................ None
See application file for complete search history.

(56) References Cited

U.S. PATENT DOCUMENTS 5,606,627 A * 2/1997 Kuo ............................ 382/154

2003/0039386 A1 * 2/2003 Ishitani et al. ............... 382/141

FOREIGN PATENT DOCUMENTS

JP 61-097510 A 5/1986
JP 03-255303 A 11/1991

OTHER PUBLICATIONS

K. Ebihara, "Medical and Biological Electron Microscopy", Japanese Society of Electron Microscopy, Jan. 20, 1982 (4th edition Aug. 20, 1988), pp. 278-299.

* cited by examiner

Primary Examiner—Matthew C. Bella
Assistant Examiner—Alex Liew
(74) Attorney, Agent, or Firm—Foley & Lardner LLP

(57) ABSTRACT

A three-dimensional coordinate measuring apparatus has a first and second incident angle adjusting sections for adjusting the attitude of the object in the directions of first and second neutral axes, respectively, to adjust the incident angle of the beam projected on the object from an imaging optical system relative to the object so that first and second stereoscopic images of the object can be formed, a matching process section for searching for corresponding points corresponding to measurement points in first and second search directions generally perpendicular to the first and second neutral axes, respectively, in the first and second stereoscopic images, and a shape measuring section for obtaining three-dimensional coordinate data of the object based on the relation between the measurement points and the corresponding points in the first and second stereoscopic images.

23 Claims, 39 Drawing Sheets (A) Original image (B) First neutral axis (horizontal tilt)

(D) Second neutral axis (vertical tilt)

(C)

(E)

(G) Synthesis result

Three-dimensional coordinate values synthesis result

X 50,000

(A)

(B)

Image acquisition and matching with plurality of tilt angles

Tilts

Pyramid structure

Matching method
with normalized correlation coefficient (A) OK (B) NG

FIG.18

| 0 | −1 | 0 |
|---|---|---|
| −1 | 5 | −1 |
| 0 | −1 | 0 |

Laplacian operator

FIG.19

| −1/2 | 1 | −1/2 |
|---|---|---|
| −1/2 | 1 | −1/2 |
| −1/2 | 1 | −1/2 |

Line detection operator

(A)

(B)

(A) Low resolution level (top level; first level)

(B) Intermediate resolution level (second level)

(C) High resolution level (bottom level; third level)

Tilted at plurality of angles in same direction.

Display of result (C)

(B)

(A)

APPARATUS AND METHOD FOR THREE-DIMENSIONAL COORDINATE MEASUREMENT

BACKGROUND OF THE INVENTION

1. Field of the Invention

This invention relates to an image measuring apparatus and an image measuring method for photographing right and left images with a camera attached to an electron microscope or an optical microscope as a photographing device by tilting an observing object or dividing or tilting a beam such as an electron beam or a light beam to observe the observing object and performing two- or three-dimensional measurement of the object photographed in the right and left images.

2. Description of the Related Art

In the case of a transmission electron microscope (TEM), the sample is tilted to obtain transmission images at different tilt angles, and stereo observation is performed using the images as right and left images. In the case of a scanning electron microscope (SEM), the sample or the electron beam is tilted to obtain reflection images at different tilt angles, and stereo observation is performed using the images as right and left images as described in *Medical and Biological Electron Microscopy* (pp. 278-299, published in 1982). In the field of semiconductor producing equipment, JP-A-2002-270126 and 270127 disclose an electron beam device and a data processing device for an electron beam device capable of appropriately processing stereoscopic detection data obtained from an electron microscope to permit precise three-dimensional observation of an image of a sample and performing three-dimensional shape measurement of the sample based on the observation.

In measuring a sample such as a semiconductor chip or a silicone wafer, however, the measurement accuracy varies depending upon the measuring direction in some data processing method for three-dimensional shape measurement. In general, the projections or depressions, or the wiring pattern formed on a semiconductor chip or a silicon wafer includes many lines extending in the in-plane horizontal and vertical directions. In the stereo observation method using right and left images described in the above patent documents, the incident angle of the electron beam of the electron microscope is changed by rotating a semiconductor chip as an observing object about the holder rotation axis or tilting the electron beam so that right and left images of the semiconductor chip can be obtained. In some three-dimensional shape measurement, a sensitive axis extends in an in-plane direction perpendicular to the holder rotation axis direction (for example, a vertical pattern direction of the semiconductor chip as an observing object) and an insensitive axis without measurement sensitivity extends in the same direction as the holder rotation axis direction (for example, a horizontal pattern direction of the semiconductor chip as an observing object). Thus, although accurate measurement can be made in the direction of the sensitive axis, measurement cannot be made in the direction of the insensitive even if right and left images of the semiconductor chip are used. The three-dimensional shape measuring method having a sensitive axis and an insensitive axis will be hereinafter referred to as "anisotropic shape measurement".

A semiconductor chip or a silicon wafer has a surface having projections or depressions (in the out-of-plane direction) formed by etching or multilayer wiring. The thickness distribution of the projections or depressions also has to be measured accurately. FIG. 26 is an explanatory view of right and left images of a semiconductor chip or silicon wafer having a surface with a projection. A surface of semiconductor chip or a silicon wafer has projections or depressions formed by etching, chemical vapor deposition (CVD), or spattering. The inclinations of the projections or depressions in the thickness direction thereof are large. Thus, in the case of parallel projection, some of slopes cannot be captured in one of the right and left images because of their inclination angle even if it is captured in the other. In this case, corresponding points of the slopes cannot be determined even if the right and left images are used, so that the three-dimensional shape measuring apparatus cannot measure the surface shape in the out-of-plane direction accurately.

This invention has been made to solve the above problem, and the first object of this invention is to provide a three-dimensional coordinate measuring apparatus and a three-dimensional coordinate measuring method which does not show no significant differences in measurement accuracy depending upon the measurement direction even in three-dimensional shape measurement using anisotropic shape measurement in which measuring accuracy varies depending upon the measurement direction. The second object of this invention is to provide a three-dimensional coordinate measuring apparatus and a three-dimensional coordinate measuring method capable of measuring the dimensions of the rises and falls in the out-of-plane directions on a surface of the object.

SUMMARY OF THE INVENTION

A three-dimensional coordinate measuring apparatus of this invention for accomplishing the above objects comprises, as shown in FIG. 1, an imaging optical system 10 for projecting a beam 7 in a direction generally parallel to the yaw axis of an object 9 to form an image of the object 9, a first incident angle adjusting section 21 for adjusting the attitude of the object 9 in the direction of a first neutral axis to adjust the incident angle of the beam 7 projected on the object 9 from the imaging optical system 10 relative to the object 9 so that a first stereoscopic image of the object 9 can be formed, a first image detecting section 26 for receiving the first stereoscopic image of the object 9 formed by the imaging optical system 10 with the incident angle adjusted by the first incident angle adjusting section 21, a second incident angle adjusting section 22 for adjusting the attitude of the object 9 in the direction of a second neutral axis including an in-plane tilt axis to adjust the incident angle of the beam 7 relative to the object 9 so that a second stereoscopic image of the object 9 can be formed, a second image detecting section 28 for receiving the second stereoscopic image of the object 9 formed by the imaging optical system 10 with the incident angle adjusted by the second incident angle adjusting section 22, a matching process section 30 for searching for corresponding points corresponding to measurement points in a first search direction generally perpendicular to the first neutral axis in the first stereoscopic image and searching for corresponding points corresponding to measurement points in a second search direction generally perpendicular to the second neutral axis in the second stereoscopic image, and a shape measuring section 34 for obtaining three-dimensional coordinate data of the object 9 based on the relation between the measurement points and the corresponding points in the first and second stereoscopic images.

For easy understanding of the invention, the relation between the first stereoscopic image and the second stereoscopic image of the object 9 will be described. FIG. 2 is an explanatory view of right and left images of the first stereoscopic image of the object 9 and the tilt angles of the object in the right and left images. The object is a wafer, for example. In FIG. 2, (A) is the left image of the wafer plane, (B) is the right image of the wafer plane, (C) is a side view of the wafer along the line Y-Y in the left image, and (D) is a side view of the wafer along the line Y-Y in the right image. As the orthogonal coordinate system for the wafer 9, X-axis and Y-axis are provided. As the coordinate system for the holder 3 for placing the wafer 9 thereon, a holder rotation axis R and a tilt center axis S perpendicular to the holder rotation axis R are provided. The tilt center axis S corresponds to the sensitive axis of the anisotropic shape measurement. The holder rotation axis R corresponds to the insensitive axis of the anisotropic shape measurement.

As shown in FIGS. 2(A) and (B), in the first stereoscopic image, the holder rotation axis R and the X-axis of the wafer 9 coincide with each other. The attitude relation between the holder rotation axis R and the wafer 9 will be referred to as "horizontal tilt". When the tilt angle is zero, the tilt center axis S and the Y-axis of the wafer 9 coincide with each other. In the case shown in FIG. 2(A), the beam scanning direction 7DL is the same as the direction of the holder rotation axis R in the left image 24L of the wafer plane. A template image 29 is moved in the X-X direction of the wafer to extract the positions of the pixels as search objects in the image of the wafer 9. In the case shown in FIG. 2(B), the beam scanning direction 7DR is the same as the direction of the holder rotation axis R in the right image 24R of the wafer plane. The template image 29 is moved in the X-X direction of the wafer to extract the positions of the pixels as search objects in the image of the wafer 9. Since the beam scanning is performed to obtain an image of the wafer 9, the beam scanning directions 7DL and 7DR are not limited to the same direction as the direction of the holder rotation axis R but may be arbitrarily determined as long as they extend in an in-plane direction of the wafer.

As shown in FIG. 2(C), the wafer 9L is tilted by an angle of $\omega 1$ in the clockwise direction CW about the holder rotation axis R so that the left image 24L of the wafer plane can be photographed. As shown in FIG. 2(D), the wafer 9R is tilted by an angle of $-\omega 1$ in the counterclockwise direction CCR about the holder rotation axis R so that the right image 24R of the wafer plane can be photographed.

Then, a template process used in the anisotropic shape measurement is performed on the first stereoscopic image in which the holder rotation axis R coincides with the X-axis of the wafer 9. FIG. 3 is an explanatory view of the first stereoscopic image obtained under the horizontal tilt condition and having been subjected to the template process. As shown in FIG. 3, line segments in the X-axis direction of the wafer 9 coincident with the holder rotation axis R cannot be extracted properly although line segments in the Y-axis direction of the wafer 9 coincident with the tilt center axis S are precisely extracted.

FIG. 4 is an explanatory view of right and left images of the second stereoscopic image of the object 9 and the tilt angles of the object in the right and left images. In FIG. 4, (A) is the left image of the wafer plane, (B) is the right image of the wafer plane, (C) is a side view of the wafer along the line X-X in the left image, and (D) is a side view of the wafer along the line X-X in the right image. In the second stereoscopic image, the object is rotated within the plane by 90° from the attitude in the first stereoscopic image and tilted in the vertical direction. That is, as shown in FIG. 4(A) and (B), in the second stereoscopic image, the holder rotation axis R and the Y-axis of the wafer 9 coincide with each other. When the tilt angle is zero, the tilt center axis S and the X-axis of the wafer 9 coincide with each other.

In the case shown in FIG. 4(A), the beam scanning direction 7DL is the same as the direction of the holder rotation axis R in the left image 24L2 of the wafer plane. A template image 29 is moved in the Y-Y direction of the wafer to extract the positions of the pixels as search objects in the image of the wafer 9. In the case shown in FIG. 4(B), the beam scanning direction 7DR is the same as the direction of the holder rotation axis R in the right image 24R2 of the wafer plane. The template image 29 is moved in the Y-Y direction of the wafer to extract the positions of the pixels as search objects in the image of the wafer 9. Since the beam scanning is performed in order to obtain an image of the wafer 9, the beam scanning directions 7DL and 7DR are not limited to the same direction as the direction of the holder rotation axis R but may be arbitrarily determined as long as they extend in an in-plane direction of the wafer.

As shown in FIG. 4(C), the wafer 9L2 is tilted by an angle of $\phi 1$ in the clockwise direction CW about the holder rotation axis R so that the left image 24L2 of the wafer plane can be photographed. As shown in FIG. 4(D), the wafer 9R2 is tilted by an angle of $-\phi 1$ in the counterclockwise direction CCR about the holder rotation axis R so that the right image 24R2 of the wafer plane can be photographed.

Then, a template process used in the anisotropic shape measurement is performed on the second stereoscopic image in which the holder rotation axis R coincides with the Y-axis of the wafer 9. FIG. 5 is an explanatory view of the second stereoscopic image obtained under the vertical tilt condition and having subjected to the template process. As shown in FIG. 5, line segments in the Y-axis direction of the wafer 9 coincident with the holder rotation axis R cannot be extracted properly although line segments in the X-axis direction of the wafer 9 coincident with the tilt center axis S are precisely extracted.

Description will be made of the operation of the apparatus constituted as described above with reference to FIG. 1 and FIG. 2 to FIG. 5. The imaging optical system 10 projects a beam 7 in a direction generally parallel to the yaw axis (Z-axis) of the object 9 to form an image of the object 9. The first incident angle adjusting section 21 adjusts the attitude of the object 9 in the direction of a first neutral axis (X-axis) to adjust the incident angle of the beam 7 projected on the object 9 from the imaging optical system 10 relative to the object 9 so that a first stereoscopic image of the object can be formed. The first image detecting section 26 receives the first stereoscopic image of the object 9 formed by the imaging optical system 10 with the holder rotation axis R adjusted to coincide with the X-axis of the wafer 9 by the first incident angle adjusting section 21.

The second incident angle adjusting section 22 adjusts the attitude of the object 9 in the direction of a second neutral axis including an in-plane tilt axis (Y-axis) to adjust the incident angle of the beam 7 relative to the object 9 so that a second stereoscopic image of the object 9 can be formed. For example, in the example shown in FIG. 4, the direction of the second neutral axis coincides with that of the Y-axis. The second image detecting section 28 receives the second stereoscopic image of the object 9 formed by the imaging optical system 10 with the holder rotation axis R adjusted to coincide with the Y-axis of the wafer 9 by the second incident angle adjusting section 22. The matching process section 30 searches for corresponding points corresponding to measurement points in a first search direction generally perpendicular to the first neutral axis in the first stereoscopic image and searches for corresponding points corresponding to measurement points in a second direction generally perpendicular to the second neutral axis in the second stereoscopic image. The shape measuring section 34 obtains the three-dimensional coordinate data of the object 9 based on the relation between the measurement points and the corresponding points in the first and second stereoscopic images.

Preferably, in the three-dimensional shape measuring apparatus of this invention, the second incident angle adjusting section 22 is configured to adjust the attitude of the object 9 in a direction of a second neutral axis formed in a plane determined by the in-plane tilt axis and the first neutral axis and extending in a direction different from that of the first neutral axis. Then, when the incident angle of the beam 7 relative to the object 9 is adjusted to form a second stereoscopic image, the drawbacks of the anisotropic shape measurement can be avoided by appropriately setting the direction of the second neutral axis.

Preferably, in the three-dimensional shape measuring apparatus of this invention, the second incident angle adjusting section 22 is configured to adjust the attitude of the object 9 in the direction of a second neutral axis extending in the direction of the in-plane tilt axis. Then, when the incident angle of the beam 7 relative to the object 9 is adjusted to form a second stereoscopic image, the first neutral axis and the second neutral axis of the object 9 are generally perpendicular to each other. Thus, when the measurement sensitivity of the anisotropic shape measurement is sufficiently high in a direction tilted by about 45° from the sensitive axis, the drawbacks of the anisotropic shape measurement can be avoided when there are the first neutral axis direction and the second neutral axis direction as the in-plane rotational angles of the object 9.

Preferably, the three-dimensional shape measuring apparatus of this invention further comprises a tilt center axis direction setting section 38 for extracting linear image components included in an image formed by the electron beam device 10 or the first image detecting section 26 and calculating the directions to be the tilt center axis directions of the first and second stereoscopic images. Then, the directions of the first and second neutral axis of the object 9 suitable for the characteristics of the object can be set taking the sensitivity direction dependence of the anisotropic shape measurement into account.

Preferably, the three-dimensional shape measuring apparatus of this invention is incorporated in a scanning electron microscope, and the imaging optical system 10 comprises an electronic lens section and the first and second incident angle adjusting sections (21 and 22) comprise deflector control units for sending a control signal to a deflector for deflecting the electron beam emitted from an electron gun as shown in FIG. 1. The imaging optical system 10 may be a telecentric system.

A three-dimensional coordinate measuring method of this invention for accomplishing the above objects makes a computer perform the steps of, as shown in FIG. 6, causing a first incident angle adjusting section 21 to adjust the attitude of an object 9 in the direction of a first neutral axis (S103), adjusting the incident angle of a beam 7 projected from an imaging optical system 10 in a direction generally parallel to the yaw axis of the object 9 to form a first stereoscopic image of the object 9 (S104 and S106), searching for corresponding points corresponding to measurement points in a first search direction generally perpendicular to the first neutral axis in the formed first stereoscopic image (S108), causing a second incident angle adjusting section 22 to adjust the attitude of the object 9 in the direction of a second neutral axis including an in-plane tilt axis (S110), causing the second incident angle adjusting section 22 to adjust the incident angle of the beam 7 relative to the object 9 to form a second stereoscopic image of the object 9 (S112 and S114), searching for corresponding points corresponding to measurement points in a second search direction generally perpendicular to the second neutral axis in the formed second stereoscopic image (S116), and obtaining three-dimensional coordinate data of the object based on the relation between the measurement points and the corresponding points in the first and second stereoscopic images.

A three-dimensional coordinate measuring apparatus of this invention for accomplishing the above objects comprises, as shown in FIG. 24, an imaging optical system 10 for projecting a beam 7 in a direction generally parallel to the yaw axis of an object 9 to form an image of the object 9, a neutral axis direction setting section 83 for extracting linear image components included in an image of the object 9 formed by the imaging optical system 10 and calculating the directions of first and second neutral axes in first and second stereoscopic images of the object 9, a first neutral axis adjusting section 81 for adjusting the attitude of the object 9 in the direction of the first neutral axis to adjust the incident angle of the beam 7 relative to the object 9 so that a first stereoscopic image of the object 9 can be formed, a first image detecting section 86 for receiving the first stereoscopic image of the object 9 formed by the imaging optical system 10 with the incident angle adjusted by the first neutral axis adjusting section 81, a second neutral axis adjusting section 82 for adjusting the attitude of the object 9 in the direction of the second neutral axis to adjust the incident angle of the beam 7 relative to the object 9 so that a second stereoscopic image of the object 9 can be formed, a second image detecting section 88 for receiving the second stereoscopic image of the object 9 formed by the imaging optical system 10 with the incident angle adjusted by the second neutral axis adjusting section 82, a matching process section 90 for searching for corresponding points corresponding to measurement points in a first search direction generally perpendicular to the first neutral axis in the first stereoscopic image and searching for corresponding points corresponding to measurement points in a second search direction generally perpendicular to the second neutral axis in the second stereoscopic image, and a shape measuring section 93 for obtaining three-dimensional coordinate data of the object 9 based on the relation between the measurement points and the corresponding points in the first and second stereoscopic images.

A three-dimensional coordinate measuring method of this invention for accomplishing the above objects makes a computer perform the steps of, as shown in FIG. 25, extracting linear image components included in an image of an object 9 formed by an imaging optical system 10 and calculating the directions of first and second neutral axes in first and second stereoscopic images of the object 9 (S406), causing a first neutral axis adjusting section 81 to adjust the attitude of the object 9 in the first neutral axis direction (S410), adjusting the incident angle of a beam 7 projected from an imaging optical system 10 in a direction generally parallel to the yaw axis of the object 9 relative to the object 9 to form a first stereoscopic image of the object 9 (S412), searching for corresponding points corresponding to measurement points in a first search direction generally perpendicular to the first neutral axis in the first stereoscopic image (S414), causing a second neutral axis adjusting section 82 to adjust the attitude of the object 9 in the second neutral axis direction (S416), adjusting the incident angle of the beam 7 relative to the object 9 to form a second stereoscopic image of the object 9 (S418), searching for corresponding points corresponding to measurement points in a second search direction generally perpendicular to the second neutral axis in the second stereoscopic image (S420), and obtaining three-dimensional coordinate data of the object 9 based on the relation between the measurement points and the corresponding points in the first and second stereoscopic images (S426).

A three-dimensional coordinate measuring apparatus of this invention for accomplishing the above objects comprises, as shown in FIG. 27, an imaging optical system 10 for projecting a beam 7 in a direction generally parallel to the yaw axis of an object 9 to form an image of the object 100, a neutral axis direction setting section 83 for extracting linear image components included in an image of the object 100 formed by the imaging optical system 10 and calculating the directions of first and second neutral axes in first and second stereoscopic images of the object 100, a tilt angle multiple setting section 95 for setting a plurality of tilt angles in at least one of the first and second neutral axis directions depending upon the tilt directions of slopes on the object 100, a first neutral axis adjusting section 81 for adjusting the attitude of the object 100 in the direction of the first neutral axis to adjust the incident angle of the beam 7 relative to the object 100 so that first stereoscopic images of the object 100 can be formed from images of the object 100 photographed at one or the plurality of tilt angles, a first image detecting section 86 for receiving the first stereoscopic images of the object 100 formed by the imaging optical system 10 with the incident angle adjusted by the first neutral axis adjusting section 81, a second neutral axis adjusting section 82 for adjusting the attitude of the object 100 in the direction of the second neutral axis to adjust the incident angle of the beam 7 relative to the object 100 so that second stereoscopic images of the object 100 can be formed from images of the object 100 photographed at one or the plurality of tilt angles, a second image detecting section 88 for receiving the second stereoscopic images of the object 100 formed by the imaging optical system 10 with the incident angle adjusted by the second neutral axis adjusting section 82, a slope image extracting section 96 for extracting images including the images of the slopes on the object 100 suitable for three-dimensional shape measurement from the images of the object 100 photographed at the plurality of tilt angles and stored in the first image detecting section 86 or the second image detecting section 88, a matching process section 90 for searching for corresponding points corresponding to measurement points in a first search direction generally perpendicular to the first neutral axis in the first stereoscopic images and searching for corresponding points corresponding to measurement points in a second search direction generally perpendicular to the second neutral axis in the second stereoscopic images, and a shape measuring section 93 for obtaining three-dimensional coordinate data of the object 100 based on the relation between the measurement points and the corresponding points in the first and second stereoscopic images.

A three-dimensional coordinate measuring method of this invention for accomplishing the above objects makes a computer perform the steps of, as shown in FIG. 29, extracting linear image components included in an image of an object 100 formed by an imaging optical system 10 and calculating the directions of first and second neutral axes in first and second stereoscopic images of the object 100 (S506), setting a plurality of tilt angles of the object in at least one of the first and second neutral axis directions depending upon the tilt directions of slopes on the object 100 (S507), causing a first neutral axis adjusting section 81 to adjust the attitude of the object 100 in the first neutral axis direction (S510), adjusting the incident angle of a beam 7 projected from an imaging optical system 10 in a direction generally parallel to the yaw axis of the object 100 relative to the object 100 to form first stereoscopic images of the object 100 (S512), searching for corresponding points corresponding to measurement points in a first search direction generally perpendicular to the first neutral axis in the first stereoscopic images (S514), causing a second neutral axis adjusting section 82 to adjust the attitude of the object 100 in the second neutral axis direction (S516), adjusting the incident angle of the beam 7 relative to the object 100 to form second stereoscopic images of the object 100 (S518), searching for corresponding points corresponding to measurement points in a second search direction generally perpendicular to the second neutral axis in the second stereoscopic images (S520), extracting images including images of the slopes on the object 100 suitable for three-dimensional shape measurement from the first and second stereoscopic images of the object 100 photographed at the multiple tilt angles (S525), and obtaining the three-dimensional coordinate data of the object 100 based on the relation between the measurement points and the corresponding points in the extracted first and second stereoscopic images including the images of the slopes (S526).

A three-dimensional coordinate measuring apparatus of this invention for accomplishing the above object comprises, as shown in FIG. 31, an imaging optical system 10 for projecting a beam 7 in a direction generally parallel to the yaw axis of an object 9 to form an image of the object 9, a first neutral axis adjusting section 21 for adjusting the attitude of the object 9 in the direction of a first neutral axis to adjust the incident angle of the beam 7 projected on the object 9 from the imaging optical system 10 relative to the object 9 so that a first stereoscopic image of the object 9 can be formed, a first image detecting section 26 for receiving the first stereoscopic image of the object 9 formed by the imaging optical system 10 with the incident angle adjusted by the first neutral axis adjusting section 21, an image displaying section 27 for displaying the first stereoscopic image detected by the first image detecting section 26, an angle adjustment instructing section 23 for outputting an instruction signal for instructing the direction in which the incident angle is to be adjusted determined based on a stereoscopic image displayed on the image displaying section 27, a second incident angle adjusting section 22 for adjusting the attitude of the object 9 in the direction of a second neutral axis according to the instruction signal for instructing the direction in which the incident angle is to be adjusted to adjust the incident angle of the beam 7 relative to the object 9 so that a second stereoscopic image of the object 9 can be formed, a second image detecting section 28 for receiving the second stereoscopic image of the object 9 formed by the imaging optical system 10 with the incident angle adjusted by the second incident angle adjusting section 22, a matching process section 30 for searching for corresponding points corresponding to measurement points in a first search direction generally perpendicular to the first neutral axis in the first stereoscopic image and searching for corresponding points corresponding to measurement points in a second search direction generally perpendicular to the second neutral axis in the second stereoscopic image, and a shape measuring section 34 for obtaining three-dimensional coordinate data of the object 9 based on the relation between the measurement points and the corresponding points in the first and second stereoscopic images.

Description will be made of the operation of the apparatus constituted as described above with reference to FIG. 31 and FIG. 2 to FIG. 5. Description of the matters which have been described with reference to FIG. 1 and FIG. 2 to FIG. 5 will not be repeated here. The angle adjustment instructing section 23 outputs an instruction signal for instructing the direction in which the incident angle is to be adjusted to tilt the attitude of the object 9 in a vertical direction as the second neutral axis direction. The direction in which the incident angle is to be adjusted is determined based on the stereoscopic image displayed on the image displaying section 27 and inputted manually by an operator. The second incident angle adjusting section 22 adjusts the attitude of the object 9 according to the instruction signal for instructing the direction in which the incident angle is to be adjusted. The direction in which the incident angle is to be adjusted may coincide with a second neutral axis including an in-plane tilt axis (Y-axis). Further, the second incident angle adjusting section 22 adjusts the incident angle of the beam 7 relative to the object 9 so that a second stereoscopic image of the object 9 can be formed.

Preferably, as shown in FIG. 31, the three-dimensional coordinate measuring apparatus of this invention is incorporated in a scanning electron microscope, and the imaging optical system 10 comprises an electronic lens section and the first and second incident angle adjusting sections (21 and 22) comprise deflector control units for sending a control signal to a deflector for deflecting the electron beam emitted from an electron gun. The imaging optical system 10 may be a telecentric system. The first image detecting section 26 and the second image detecting section 28 may share the image forming section 24 for forming an image of the object 9 obtained by the electron beam device 10.

A three-dimensional coordinate measuring method of this invention for accomplishing the above objects makes a computer perform the steps of, as shown in FIG. 32, causing a first incident angle adjusting section 21 to adjust the attitude of an object 9 in a first neutral axis direction (S103), adjusting the incident angle of a beam 7 projected from an imaging optical system 10 in a direction generally parallel to the yaw axis of the object 9 relative to the object 9 to form a first stereoscopic image of the object 9 (S104 and S106), searching for corresponding points corresponding to measurement points in a first search direction perpendicular to the first neutral axis in the formed first stereoscopic image (S108), displaying the first stereoscopic image on an image displaying section 27 (S109A), inputting an instruction signal for instructing the determined direction in which the incident angle is to be adjusted based on the displayed stereoscopic image (S109B), from an angle adjustment instructing section 23 causing a second incident angle adjusting section 22 to adjust the attitude of the object 9 in the direction of a second neutral axis according to the instruction signal for instructing the direction in which the incident angle is to be adjusted (S109C), causing the second incident angle adjusting section 22 to adjust the incident angle of the beam 7 relative to the object 9 to form a second stereoscopic image of the object 9 (S112 and S114), searching for corresponding points corresponding to measurement points in a second search direction perpendicular to the second neutral axis in the second stereoscopic image (S116), and obtaining three-dimensional coordinate data of the object based on the relation between the measurement points and the corresponding points in the first and second stereoscopic images (S122).

A three-dimensional coordinate measuring apparatus of this invention for accomplishing the above objects comprises, as shown in FIG. 35, an imaging optical system 10 for projecting a beam 7 in a direction generally parallel to the yaw axis of an object 9 to form an image of the object 9, a first incident angle adjusting section 21 for adjusting the attitude of the object 9 in the direction of a first neutral axis so that a first stereoscopic image of the object 9 can be formed, a first image detecting section 26 for receiving the first stereoscopic image of the object 9 formed by the imaging optical system 10 with the incident angle adjusted by the first incident angle adjusting section 21, a shape measuring section 34 for obtaining three-dimensional coordinate data of the object 9 based on the relation between measurement points and corresponding points in first and second stereoscopic images, an immeasurable area detecting section 37 for judging whether there is an area in which the shape measuring section 34 cannot obtain three-dimensional coordinate data in the first stereoscopic image received by the first image detecting section 26, an incident angle instruction calculating section 39 for calculating the direction of a second neutral axis so that the shape measuring section 34 can measure three-dimensional coordinate data in an area determined as an immeasurable area by the immeasurable area detecting section 37, a second incident angle adjusting section 22 for adjusting the attitude of the object 9 in the direction of the second neutral axis calculated in the incident angle instruction calculating section 39 so that a second stereoscopic image of the object 9 can be formed, a second image detecting section 28 for receiving the second stereoscopic image of the object 9 formed by the imaging optical system 10 with the incident angle adjusted by the second incident angle adjusting section 22, and a matching process section 30 for searching for corresponding points corresponding to measurement points in a first search direction generally perpendicular to the first neutral axis in the first stereoscopic image and searching for corresponding points corresponding to measurement points in a second search direction generally perpendicular to the second neutral axis in the second stereoscopic image.

In the apparatus constituted as described above, the immeasurable area detecting section 37 judges whether there is an area in which the shape measuring section 34 cannot obtain three-dimensional coordinate data in the first stereoscopic image received by the first image detecting section 26. The incident angle instruction calculating section 39 calculates the direction of a second neutral axis so that the shape measuring section 34 can measure three-dimensional coordinate data in the area determined as an immeasurable area by the immeasurable area detection section 37. The second incident angle adjusting section 22 adjusts the attitude of the object 9 in the second neutral axis direction calculated in the incident angle instruction calculating section 39 so that a second stereoscopic image of the object 9 can be formed. As above, even when an operator does not instruct the second neutral axis direction to the second incident angle adjusting section 22, the immeasurable area detecting section 37 and the incident angle instruction calculating section 39 make an instruction on the second neutral axis direction to the second incident angle adjusting section 22.

A three-dimensional coordinate measuring method of this invention for accomplishing the above objects makes a computer perform the step of, as shown in FIG. 36, causing a first incident angle adjusting section 21 to adjust the attitude of an object 9 in a first neutral axis direction (S603), adjusting the incident angle of a beam 7 projected from an imaging optical system 10 in a direction generally parallel to the yaw axis of the object 9 relative to the object 9 to form a first stereoscopic image of the object 9 (S604 and S606), searching for corresponding points corresponding to measurement points in a first search direction perpendicular to the first neutral axis direction in the first stereoscopic image (S608), judging whether there is an area in which the shape measuring section 34 cannot obtain three-dimensional coordinate data in the first stereoscopic image (S609), adjusting the attitude of the object 9 in the direction of a second neutral axis so that the shape measuring section 34 can measure three-dimensional coordinate data in an area determined as an immeasurable area (S610), adjusting the incident angle of the beam 7 relative to the object 9 to form a second stereoscopic image of the object 9 (S612 and S614), searching for corresponding points corresponding to measurement point in a second search direction generally perpendicular to the second neutral axis in the second stereoscopic image (S616), and obtaining three-dimensional coordinate date of the object 9 based on the relation between the measurement points and the coordinates points in the first and second stereoscopic images (S622).

This application is based on Japanese patent applications, Nos. 2003-122714 filed in Japan on Apr. 25, 2003 and 2003-157216 filed in Japan on Jun. 2, 2003, which are entirely incorporated herein by reference.

The present invention will become more fully understood from the detailed description given hereinbelow. However, the detailed description and the specific embodiment are illustrated of desired embodiments of the present invention and are described only for the purpose of explanation. Various changes and modifications will be apparent to those ordinary skilled in the art on the basis of the detailed description.

The applicant has no intention to give to public any disclosed embodiment. Among the disclosed changes and modifications, those which may not literally fall within the scope of the patent claims constitute, therefore, a part of the present invention in the sense of doctrine of equivalents.

BRIEF DESCRIPTION OF THE DRAWINGS

FIG. 18 is a structural view illustrating an example of a Laplacian operator;

FIG. 19 is a structural view illustrating an example of a line detection operator;

DESCRIPTION OF THE PREFERRED EMBODIMENTS

First Embodiment

Figure 1:
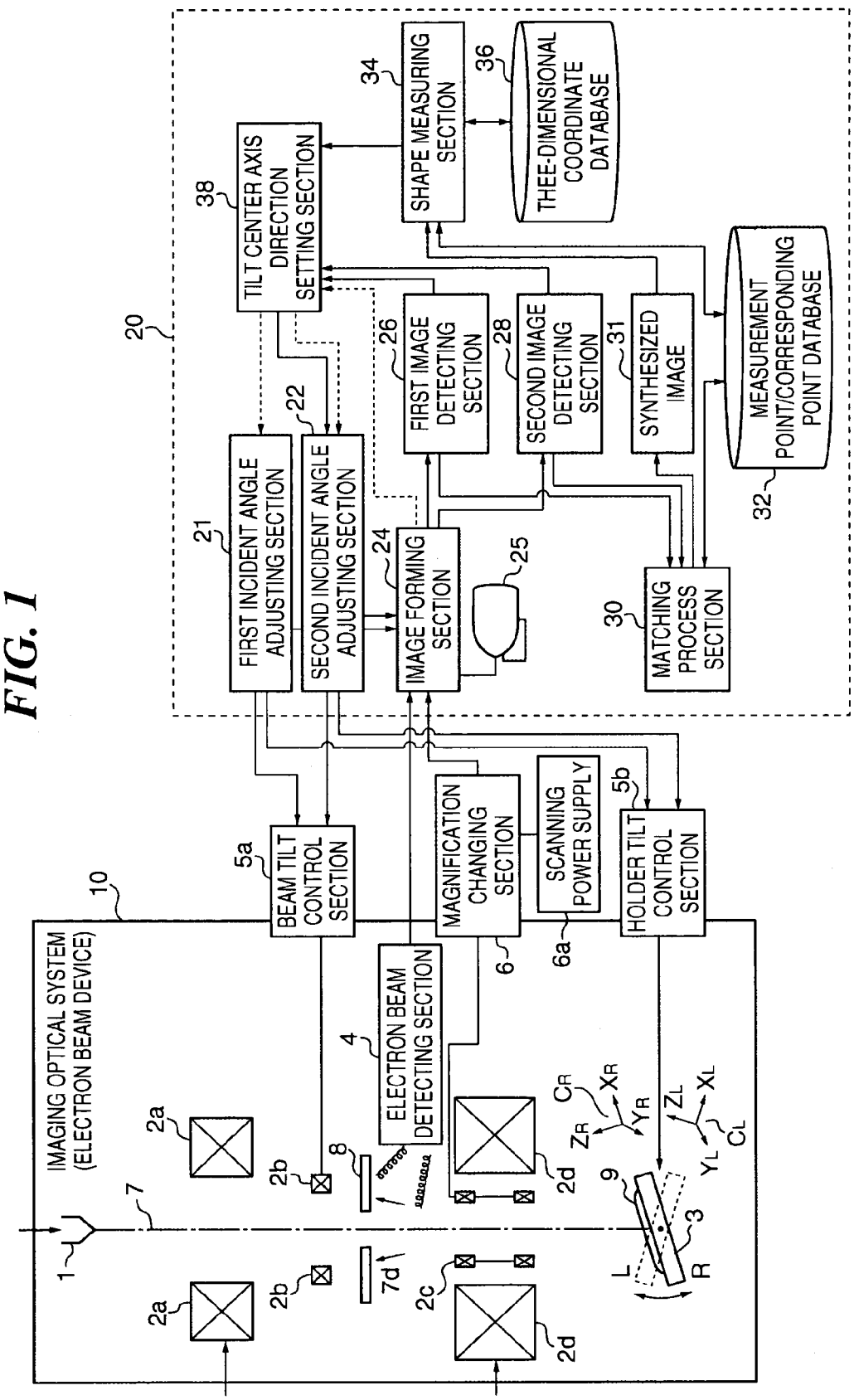
FIG. 1 is a block diagram illustrating the entire structure of a first embodiment of this invention.

Description will be hereinafter made of the embodiments of this invention with reference to the drawings. FIG. 1 is a block diagram illustrating the structure of the first embodiment of this invention. In the first embodiment, the rotational angle of a holder for holding an object is adjusted to adjust the tilt angle of the object so that a stereoscopic image can be obtained. As shown in the drawing, an electron beam device 10 (scanning microscope) as an imaging optical system has an electron beam source 1 for emitting an electron beam 7, an electron optical system 2 for emitting the electron beam 7 on an object 9, a sample holder 3 for tiltably holding the object 9, a magnification changing section 6 for changing the magnifying power of the electron optical system 2, a scanning power supply 6a for supplying electric power to the magnification changing section 6, a detector 4 for detecting the electron beam 7, a holder tilt control section 5b as a tilt control section 5 for controlling the tilt of the sample holder 3, and a secondary electron converting target 8 for attenuating the energy of secondary electrons emitted from the object 9 and reflecting it to the detector 4. A beam tilt control section 5a as the tilt control section 5 for controlling the tilt of the electron beam 7 is not used in the first embodiment but used in the second embodiment described later.

The electron optical system 2 has condenser lenses 2a for changing the electron flow density, diverging angle and emission area of the electron beam 7 emitted from the electron beam source 1, deflection lenses 2b for controlling the incident angle of the electron beam 7 on a sample surface, scanning lenses 2c for deflecting the electron beam 7 with reduced diameter to cause it to scan the sample surface two-dimensionally, and objective lenses 2d which focus the incident probe beam on the sample surface and serve as condensing lenses in the final stage. The area on the sample surface which the scanning lenses 2c cause the electron beam 7 to scan is determined according to a magnification changing command from the magnification changing section 6. The beam tilt control section 5b sends a tilt control signal to the sample holder 3 to switch it between a first attitude 3L in which it makes a first relative tilt angle with the electron beam 7 and a second attitude 3R in which it makes a second relative tilt angle with the electron beam 7.

Figure 2:
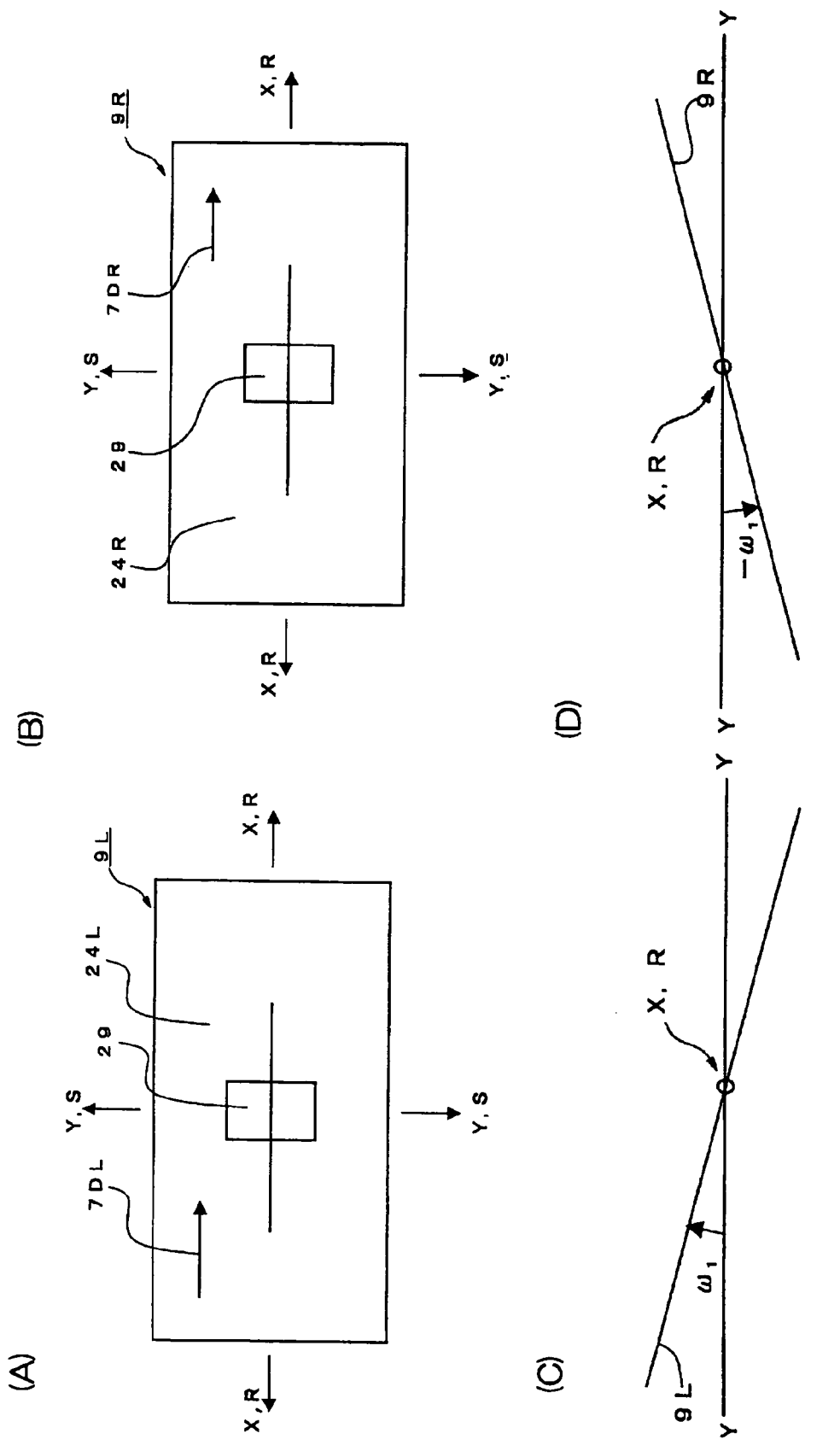
FIG. 2 is an explanatory view of right and left images of a first stereoscopic image of an object and tilt angles of the object at which the right and left images are obtained.

The three-dimensional coordinates $C_L$ of the object 9 placed on the sample holder 3 in the first attitude 3L are ($X_L$, $Y_L$, $Z_L$) when represented in a fixed coordinate system of the electron beam device 10. The three-dimensional coordinates $C_R$ of the object 9 placed on the sample holder 3 in the second attitude 3R are ($X_R$, $Y_R$, $Z_R$) when represented in a fixed coordinate system of the electron beam device 10. Although the relative tilt angle of the sample holder 3 to the emitted electron beam 7 can be switched between an angle R tilted upward to the right and an angle L tilted upward to the left, the sample holder 3 may be configured to be tilted at a multiplicity of angles. At least two angles are necessary to obtain data for stereo detection. When a yaw axis, a pitch axis and a roll axis are set as a coordinate system of the object 9, the yaw axis, the pitch axis and the roll axis correspond to Z-axis, X-axis and Y-axis, respectively. In the case of FIGS. 2(A) and (B), the pitch axis (X-axis) and the roll axis (Y-axis) correspond to a neutral axis and an in-plane tilt axis, respectively.

The object 9 is a chip of a semiconductor material such as a silicon semiconductor or a gallium arsenide semiconductor, or may be an electronic component such as a power transistor, a diode, or a thyristor, or display device components using glass such as a liquid crystal panel or an organic EL panel. Under typical observing conditions of a scanning microscope, the electron beam source 1 is set to a potential of −3 kV and the object 9 to −2.4 kV. Secondary electrons emitted from the object 9 are attenuated in energy as they collide with the secondary electron converting target 8 and detected with the detector 4. When the object 9 is set to the ground potential, the secondary electrons behave like mist with a low energy and can be detected directly with the detector 4. In this case, the secondary electron converting target 8 is not required.

A data processing device 20 has a first incident angle adjusting section 21, a second incident angle adjusting section 22, an image forming section 24, a display device 25, a first image detecting section 26, a second image detecting section 28, a matching process section 30, a measurement point/corresponding point database 32, a shape measuring section 34, a three-dimensional coordinate database 36, and a tilt center axis direction setting section 38. The data processing device 20 has a high-performance computer such as a workstation and an input/output interface for transmitting and receiving signals to and from the electron beam device 10.

The first incident angle adjusting section 21 adjusts the attitude of the object 9 in a first neutral axis direction to adjust the incident angle of the beam 7 emitted to the object 9 by the electron beam device 10 relative to the object 9 so that a first stereoscopic image of the object 9 can be formed. Namely, the first incident angle adjusting section 21 sends a control signal to the holder tilt control section 5b to adjust the attitude of the object 9 in the first neutral axis direction. Then, the first incident angle adjusting section 21 sends a control signal to the holder tilt control section 5b to adjust a reference surface to be scanned by the beam 7 emitted from the electro beam source 1 so that right and left images necessary to form the first stereoscopic image can be obtained. The first incident angle adjusting section 21 adjusts the beam incident angle to form at least a pair of stereo images (which may be one-dimensional images). For example, the first incident angle adjusting section 21 adjusts the beam incident angle or the tilt angle of the object so that the beam can be incident at least two angles; first and second incident angles for the left and right images, respectively, as shown in FIGS. 2(A) and (B) and FIGS. 4(A) and (B).

Figure 4:
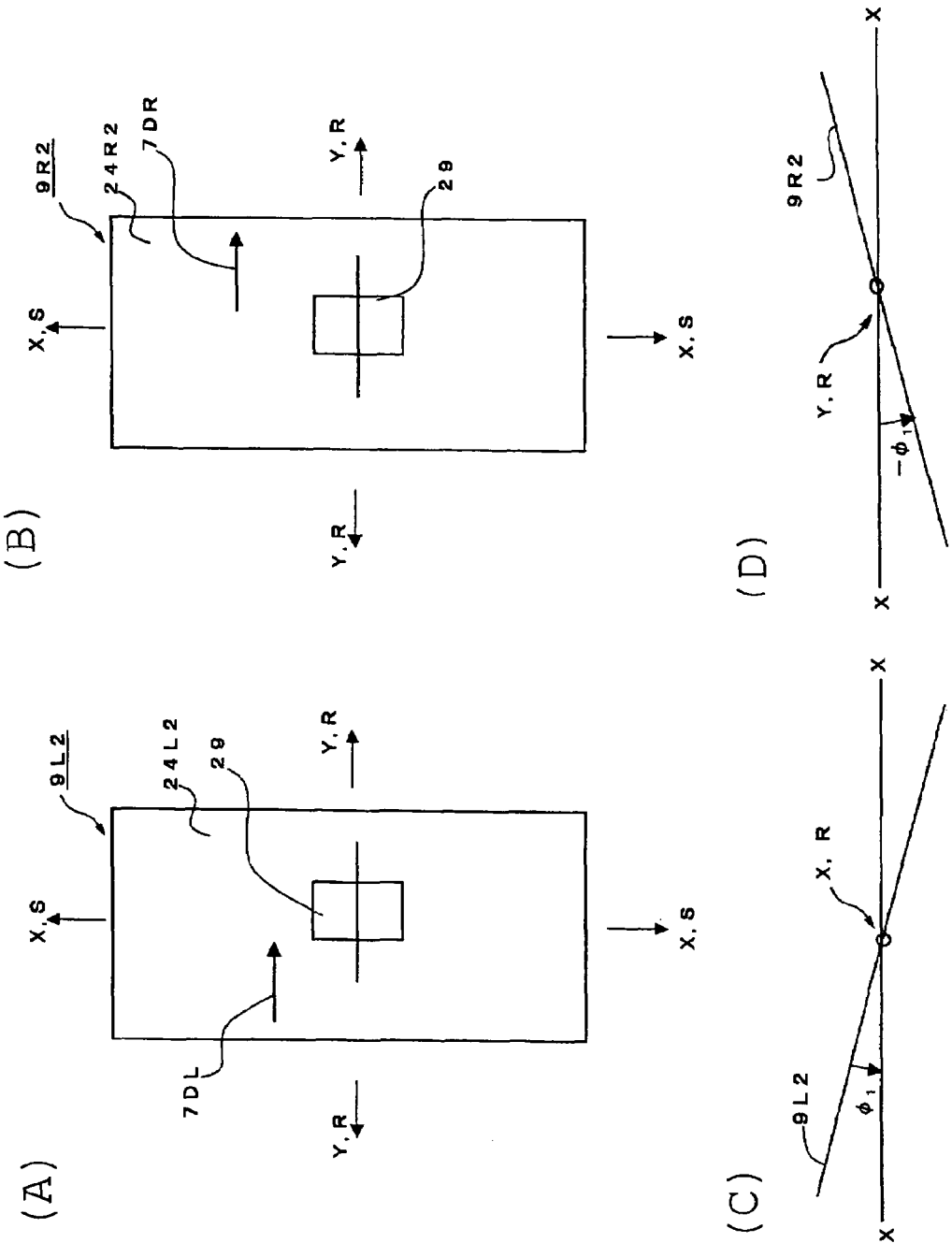
FIG. 4 is an explanatory view of right and left images of a second stereoscopic image of the object and tilt angles of the object at which the right and left images are obtained.

The second incident angle adjusting section 22 sends a control signal to the holder tilt control section 5b to adjust the attitude of the object 9 in the direction of a second neutral axis including the in-plane tilt axis. Then, the second incident angle adjusting section 22 sends a control signal to the holder tilt control section 5b to adjust the incident angle of the beam 7 relative to the object 9 so that a second stereoscopic image can be formed. The second neutral axis is preferably formed in a plane formed by the in-plane tilt axis of the object 9 and the first neutral axis. More preferably, the second neutral axis extends in the in-plane tilt axis direction of the object 9, namely, in the direction perpendicular to the holder rotation axis R of the object 9 in the first stereoscopic image, as shown in FIG. 4.

The image forming section 24 forms an image of the sample surface using a secondary electron beam detected with the detector 4 when the electron beam 7 is caused to scan an area on the sample surface by the scanning lenses 2c. The display device 25, which displays an image formed in the image forming section 24 so that an operator can observe it, is a CRT or a liquid crystal panel, for example. The display device 25 may be an ordinary single screen monitor or a monitor which can display in stereo, or have functions of both of them.

The first image detecting section 26 receives the first stereoscopic image of the object 9 formed by the electron beam device 10 in the image forming section 24 when the incident angle of the beam 7 relative to the object 9 is adjusted by the first incident angle adjusting section 21. The second image detecting section 28 receives the second stereoscopic image of the object 9 formed by the electron beam device 10 in the image forming section 24 when the incident angle of the beam 7 relative to the object 9 is adjusted by the second incident angle adjusting section 22.

The matching process section 30 searches for corresponding points corresponding to measurement points in a first search direction generally perpendicular to the first neutral axis in the first stereoscopic image, and searches for corresponding points corresponding to measurement points in a second search direction generally perpendicular to the second neutral axis in the second stereoscopic image. The process in the matching process section 30 has characteristics of anisotropic shape measurement as described later in detail. The measurement points are points defined on the object 9, and the corresponding points are points corresponding to the measurement points on a pair of stereo images. Alternatively, the measurement points may be reference points defined in one of a pair of stereo images as a reference image, and the corresponding points may be points corresponding to the measurement points defined on the other of the pair of stereo images. The matching process section 30 has a function of synthesizing the first and second stereoscopic images to produce a synthesized image 31. By producing a synthesized image 31, the matching process section 30 can have sensitivity to detect line segments in every direction including line segments in the direction which cannot be detected by anisotropic shape measurement.

The measurement point/corresponding point database 32 stores data used in the process in the matching process section 30. For example, when measurement points are set in the left image, corresponding points in the right image can be obtained by the process of the matching process section 30. The data to be stored in the measurement point/corresponding point database 32 preferably include the positional correspondence between measurement points and corresponding points in the first and second stereoscopic images. The shape measuring section 34 obtains three-dimensional coordinate data of the object 9 based on the relation between measurement points and corresponding points in the first and second stereoscopic images stored in the measurement point/corresponding point database 32. The three-dimensional coordinate data of the measurement points and corresponding points are stored in the three-dimensional coordinate database 36. The measurement point/corresponding point database 32 and the three-dimensional coordinate database 36 are constituted using a relational database system available from Oracle Corporation or IBM, for example.

The tilt center axis direction setting section 38 extracts linear image components included in an image formed by the electron beam device 10 or the first image detecting section 26, and calculates the directions to be the tilt center axis directions of the first and second stereoscopic images. When the shape measuring section 34 determines that there is an area in which correspondence between measurement points and corresponding points cannot be obtained even if both of the first and second stereoscopic images are used, the tilt center axis direction setting section 38 calculates the direction of a new second neutral axis to change the incident angle of the beam 7 relative to the object 9 so that correspondence between measurement points and corresponding points can be obtained in the remaining area.

Figure 6A:
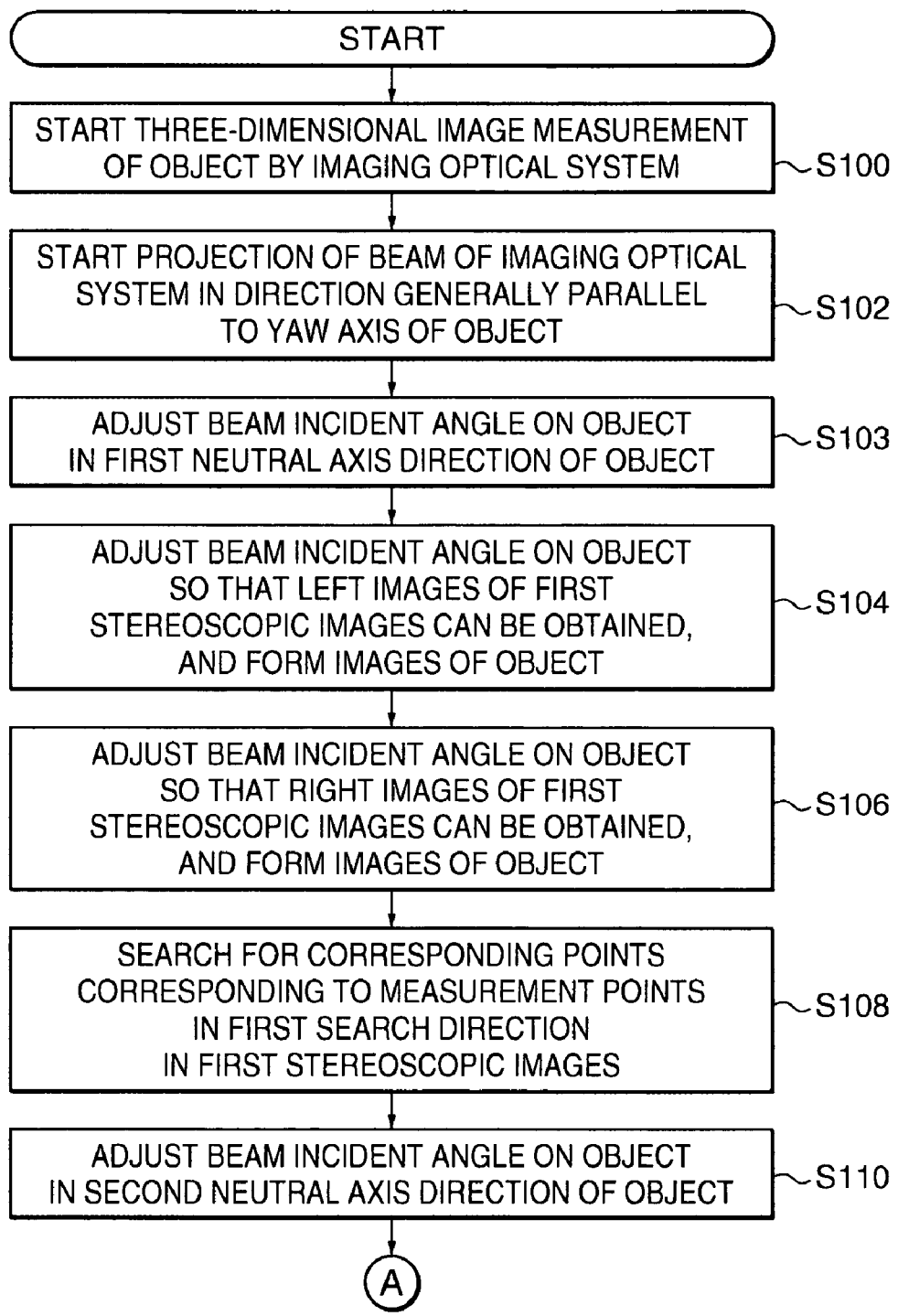
FIGS. 6A and 6B are flowcharts for explaining the operation of the apparatus shown in FIG. 1.
Figure 6B:
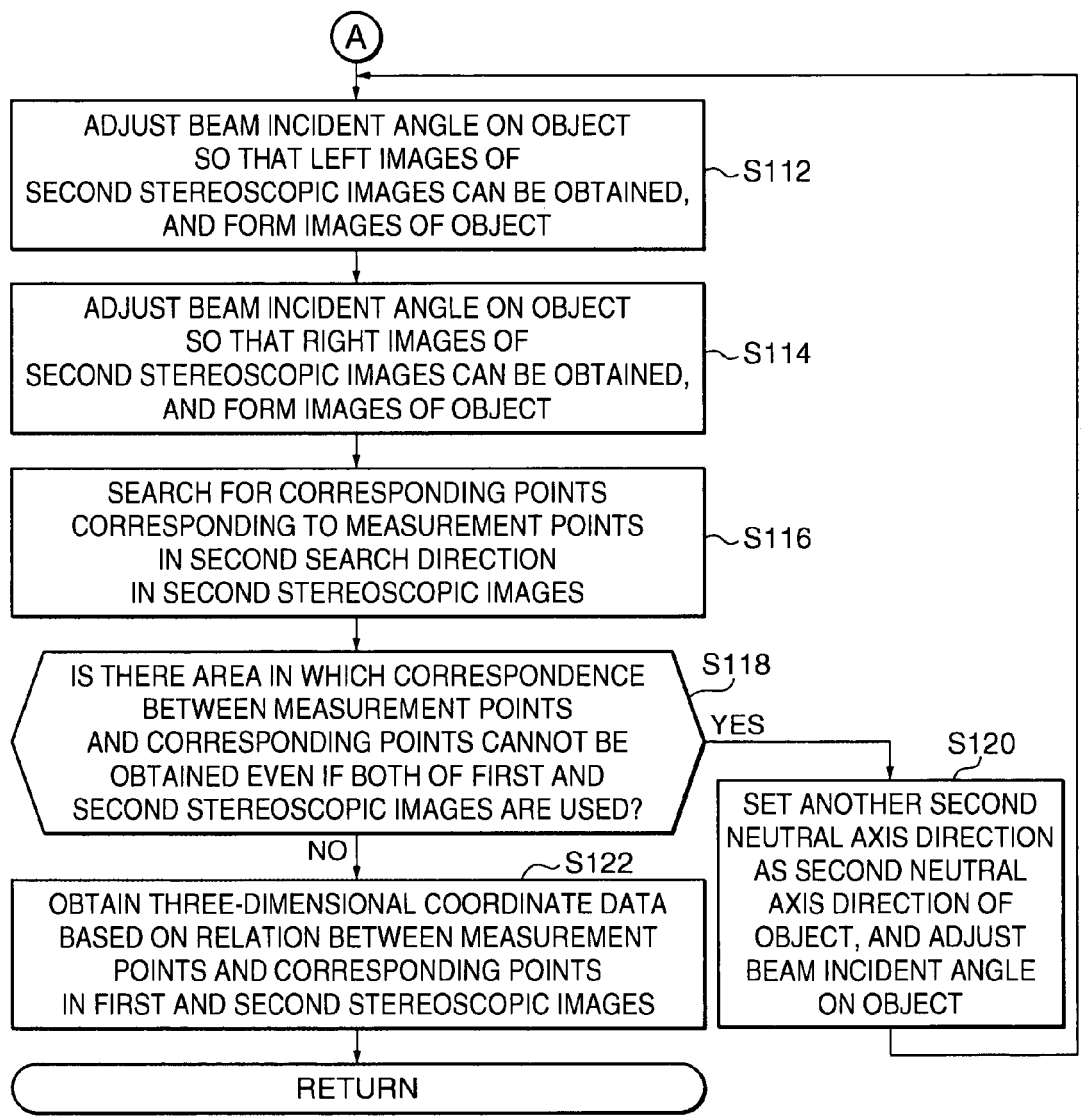

Description will be made of the operation of the apparatus constituted as described above. FIG. 6 is a flowchart for explaining the operation of the apparatus shown in FIG. 1. Three-dimensional image measurement of the object 9 by the electron beam device 10 as an imaging optical system is started (S100). Then, projection of the beam 7 of the electron beam device 10 in a direction generally parallel to the yaw axis of the object 9 is started (S102). The first incident angle adjusting section 21 sends an attitude control signal to the holder tilt control section 5*b* to adjust the attitude of the object 9 in the direction of a first neutral axis (S103). The first incident angle adjusting section 21 causes the holder tilt control section 5*b* to adjust the incident angle of the beam 7 relative to the object 9 so that a left image of a first stereoscopic image can be obtained, and the image forming section 24 forms an image of the object 9 (S104). The first incident angle adjusting section 21 causes the holder tilt control section 5*b* to adjust the incident angle of the beam 7 relative to the object 9 so that a right image of the first stereoscopic image can be obtained, and the image forming section 24 forms an image of the object 9 (S106). The matching process section 30 searches for corresponding points corresponding to measurement points in a first search direction generally perpendicular to a first neutral axis in the first stereoscopic image (S108), and the search result is stored in the measurement point/corresponding point database 32, for example.

Then, the second incident angle adjusting section 22 sends an attitude control signal to the holder tilt control section 5*b* to adjust the attitude of the object 9 in the direction of a second neutral axis including an in-plane tilt axis (S110). For example, the axis of rotation of the holder 3 on which the object 9 is mounted is changed from the first neutral axis direction to the second neutral axis direction of the object 9. The second incident angle adjusting section 22 causes the holder tilt control section 5*b* to adjust the incident angle of the beam 7 relative to the object 9 so that a left image of a second stereoscopic image can be obtained, and the image forming section 24 forms an image of the object 9 (S112). The second incident angle adjusting section 22 causes the holder tilt control section 5*b* to adjust the incident angle of the beam 7 relative to the object 9 so that a right image of the second stereoscopic image can be obtained, and the image forming section 24 forms an image of the object 9 (S114). The matching process section 30 searches for corresponding points corresponding to measurement points in a second search direction generally perpendicular to the second neutral axis in the second stereoscopic image (S116), and the search result is stored in the measurement point/corresponding point database 32, for example.

Then, the shape measuring section 34 judges whether there is an area in which correspondence between measurement points and corresponding points cannot be obtained even if both of the first and second stereoscopic images are used (S118). When it is determined in S118 that there remains an area in which correspondence between measurement points and corresponding points cannot be obtained, the tilt center axis direction setting section 38 sets the second neutral axis in another direction to change the incident angle of the beam 7 relative to the object 9 so that correspondence between measurement points and corresponding points can be obtained in the remaining area (S120). Then, the process returns to S112. When it is determined in S118 that correspondence between measurement points and corresponding points is obtained in every area, the shape measuring section 34 obtains three-dimensional coordinate data of the object 9 for a synthesized image 31 based on the relation between measurement points and corresponding points in the first and second stereoscopic images (S122). The thus obtained three-dimensional coordinate data are stored in the three-dimensional coordinate database 36. The three-dimensional image measurement of the object 9 is thereby completed and the process is returned.

Figure 7:
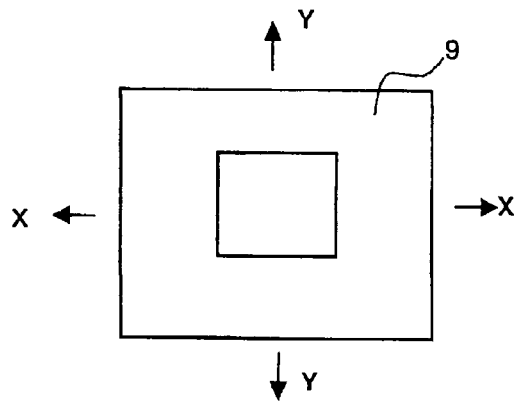
FIG. 7 is a view illustrating the relation between the first and second stereoscopic images processed by the apparatus shown in FIG. 1.
Figure 7:
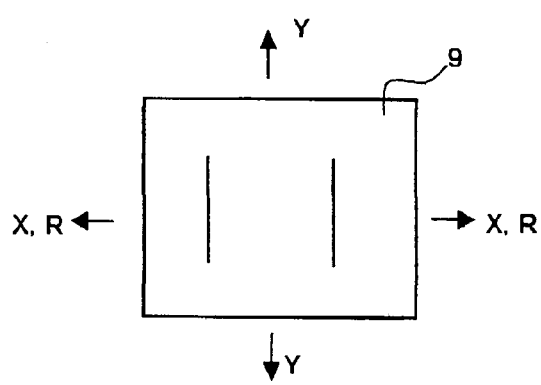
Figure 7:
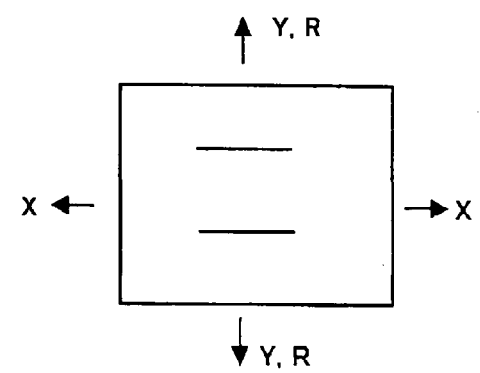
Figure 7:
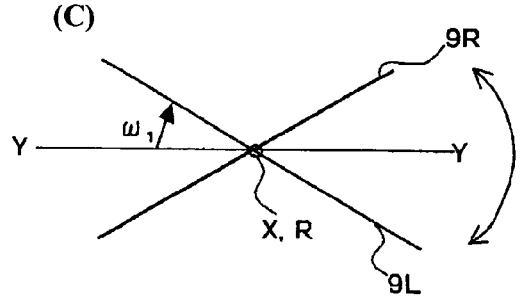
Figure 7:
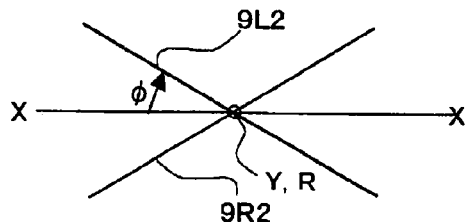
Figure 7:
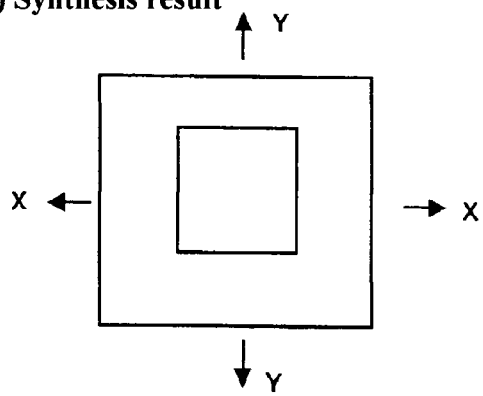

FIG. 7 is a view for explaining the relation between first and second stereoscopic images processed in the apparatus shown in FIG. 1, wherein (A) is an original image, (B) is a processed image extracted from the first stereoscopic image formed using the first neutral axis, (C) is a side view of the object taken along line Y-Y in (B), (D) is a processed image extracted from the second stereoscopic image formed using the second neutral axis, (E) is a side view of the object taken along line Y-Y in (D), and (G) is an image formed by synthesizing the processed images (B) and (D). In description of FIG. 7, matters which have been described in the description of FIG. 2 to FIG. 5 will not be repeated.

For simplicity, assume that a rectangular pattern is drawn in the original image. The rectangle is formed of straight lines extending along the X-axis and Y-axis of the object 9. Then, in the processed image extracted from the first stereoscopic image, line segments in the Y-axis direction have been able to be detected as shown in FIG. 7(B). However, line segments in the X-axis directions cannot be detected by the process of the matching process section 30 since they extend in the same direction as the holder rotation axis R which coincides with the insensitive axis of the anisotropic shape measurement. In the processed image extracted from the second stereoscopic image, line segments in the X-axis direction have been able to be detected as shown in FIG. 7(D). However, line segments in the Y-axis directions cannot be detected by the process of the matching process section 30 since they extend in the same direction as the holder rotation axis R which coincides with the insensitive axis of the anisotropic shape measurement.

The matching process section 30 synthesizes the processed image extracted from the first stereoscopic image and the processed image extracted from the second stereoscopic image in a logical OR fashion to compensate for the drawback of the anisotropic shape measurement's inability to detect line segments in the same direction as the insensitive axis so that the rectangular pattern drawn on the object 9 can be completely reproduced. When the processed images extracted from the first and second stereoscopic images have overlapping areas, the matching process section 30 uses an average of the image areas to form a synthesized image 31. A processed image for three-dimensional image measurement with less noise component and high reliability can be thereby formed.

Figure 3:
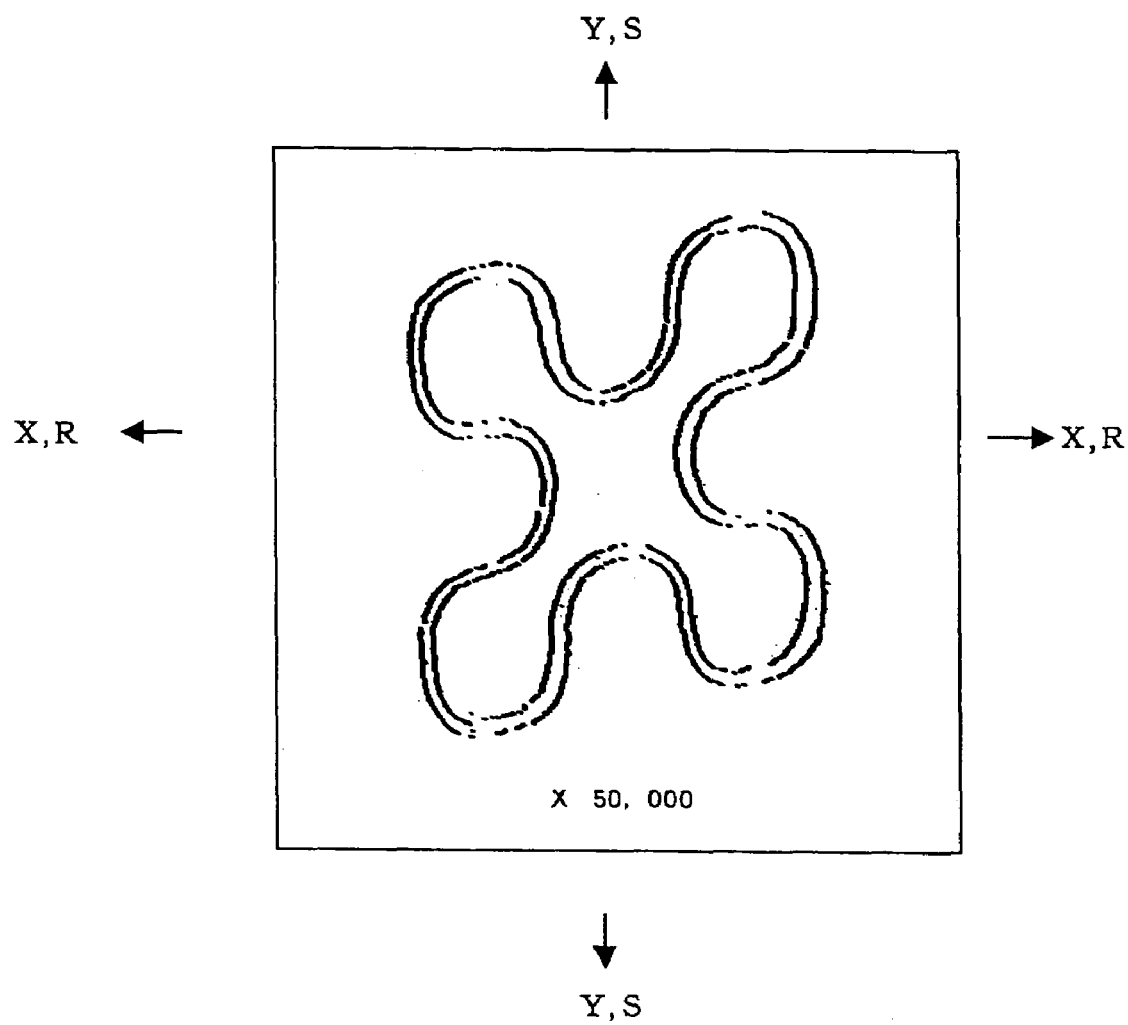
FIG. 3 is an explanatory view of the first stereoscopic image obtained under the horizontal tilt condition and having been subjected to the template process.
Figure 5:
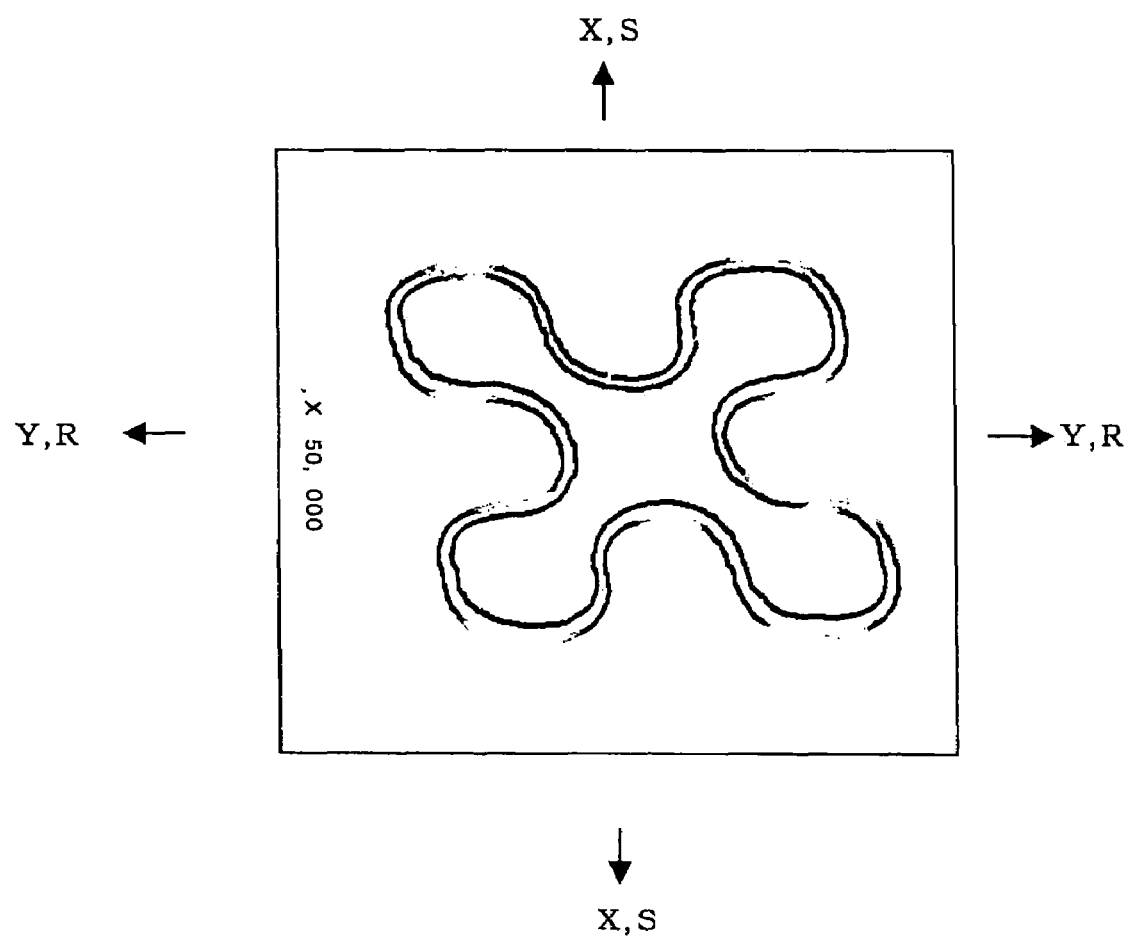
FIG. 5 is an explanatory view of the second stereoscopic image obtained under the vertical tilt condition and having been subjected to the template process.
Figure 8:
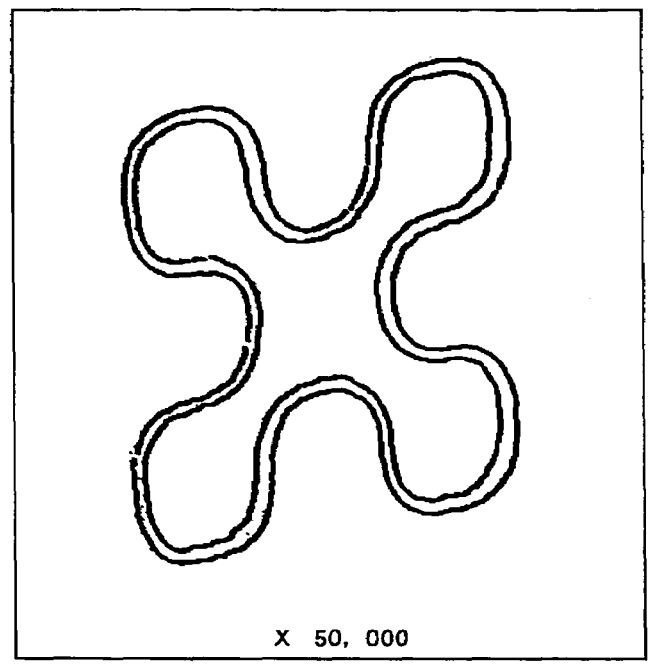
FIG. 8 is a view illustrating an example of an image formed by synthesizing the processed images extracted from first and second stereoscopic images shown in FIG. 7.

FIG. 8 is a view illustrating an example of an image formed by synthesizing processed images extracted from the first and second stereoscopic images described with FIG. 7. The synthesized image shown in FIG. 8 is formed by synthesizing a processed image extracted from the first stereoscopic image obtained using the first neutral axis shown in FIG. 3 and a processed image extracted from the second stereoscopic image obtained using the second neutral axis shown in FIG. 5. As shown in FIG. 3 and FIG. 5, the line segments in the same direction as the holder rotation axis R cannot be detected by the process of the matching process section 30 since they extend in the same direction as the insensitive axis of the anisotropic shape measurement. However, in the synthesized image 31 formed by the image synthesizing function of the matching process section 30, there is no direction which cannot be detected because of the sensitivity direction dependence of the anisotropic shape measurement, and line segments in every direction can be detected.

Figure 9:
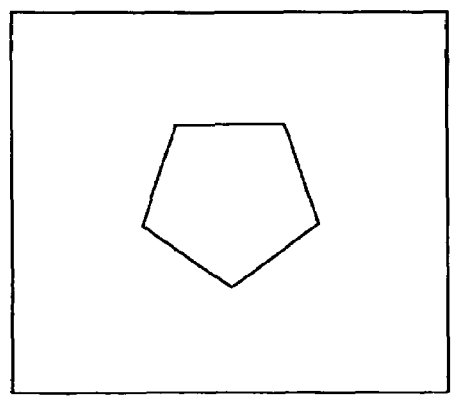
FIG. 9 is a view illustrating an example of a pattern formed on a surface of an object.
Figure 9:
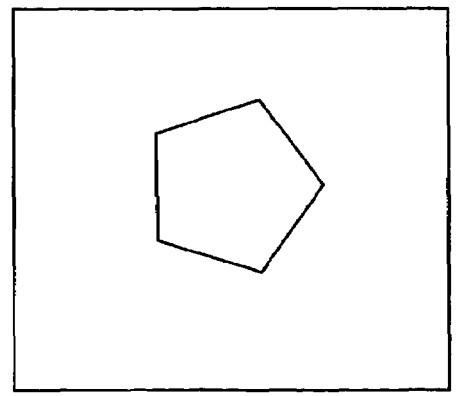

FIG. 9 is a view illustrating an example of a pattern formed on a surface of an object. The pattern is not limited to the rectangle as shown in FIG. 7 and may have line segments extending in directions different from the holder rotation axis R as well as line segments in the direction of the holder rotation axis R as a pentagon shown in FIG. 9(A). In this case, even when the attitude of the object 9 is rotated by 90° as shown in FIG. 9(B), there remain line segments in the direction which cannot be detected because of the sensitivity direction dependence of the anisotropic shape measurement, namely, line segments in the same direction as the holder rotation axis R.

Figure 10:
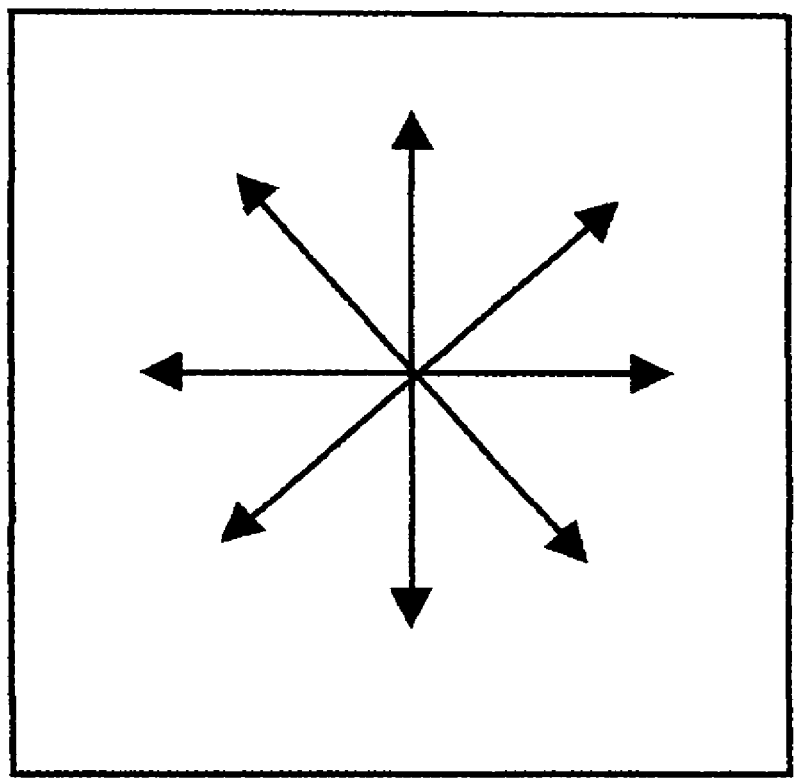
FIG. 10 is an explanatory view of a modification of a tilt center axis direction setting section 38.

FIG. 10 is an explanatory view of a modification of the tilt center axis direction setting section 38. In the above example, the second incident angle adjusting section 22 adjusts the object 9 in the second neutral axis direction so that the first incident angle adjusting section 21 can form a second stereoscopic image. However, in the case of a pattern having line segments tilted in various directions within the plane of the drawing as shown in FIG. 9, there is a possibility that sufficient three-dimensional image measurement accuracy cannot be obtained because of the sensitivity direction dependence of the anisotropic shape measurement when a synthesized image 31 is formed solely from first and second stereoscopic images. Thus, the tilt center axis direction setting section 38 sets third and fourth neutral axis. Then, when the second incident angle adjusting section 22 adjusts the object 9 in the directions of the third and fourth neutral axis and the first incident angle adjusting section 21 forms third and fourth stereoscopic images, a noise reduction effect derived from a process of combining many images can be obtained and highly reliable three-dimensional image measurement can be made.

[Supplementary Description about Parallel Projection]

In three-dimensional image measurement using a stereoscopic image, images photographed with the electron beam of an electron microscope are parallel projection images. Thus, the situation is different from central projection images corresponding to stereo photography with the use of aerial photogrammetry or a digital camera. In the case of central projection images, when the vertical parallax between the right and left images is removed so that a stereoscopic view can be obtained to search for corresponding points in the right image as a search image using the left image as a reference image, an angle derived from the central projection is formed between parallel straight lines in the right and left images even if the patterns in the right and left images coincide with the holder rotation axis direction. Thus, in three-dimensional shape measuring apparatus using anisotropic shape measurement, corresponding points in the right and left images can be searched for by the image processing device when the incident angle of the electron beam is changed according to the photographing angles of the right and left images, and three-dimensional coordinates of the subject in the right and left images can be measured.

In the case of parallel projection images, however, when the vertical parallax between the right and left images is removed so that a stereoscopic view can be obtained to search for corresponding points in the right image as a search image using the left image as a reference image, parallel straight lines in the right and left images are kept parallel if the patterns in the right and left images coincide with the holder rotation axis direction. Thus, in three-dimensional shape measuring apparatus using anisotropic shape measurement, corresponding points in the right and left images cannot be searched for by the image processing device even if the incident angle of the electron beam is changed according to the photographing directions of the right and left images, and three-dimensional coordinates of the subject in the right and left images cannot be measured. Namely, when the patterns in the right and left images coincide with the holder rotation axis direction, three-dimensional coordinates cannot be measured by the anisotropic shape measurement. This is the reason why the anisotropic shape measurement has anisotropy.

[Description of Anisotropic Shape Measurement]

Figure 11:
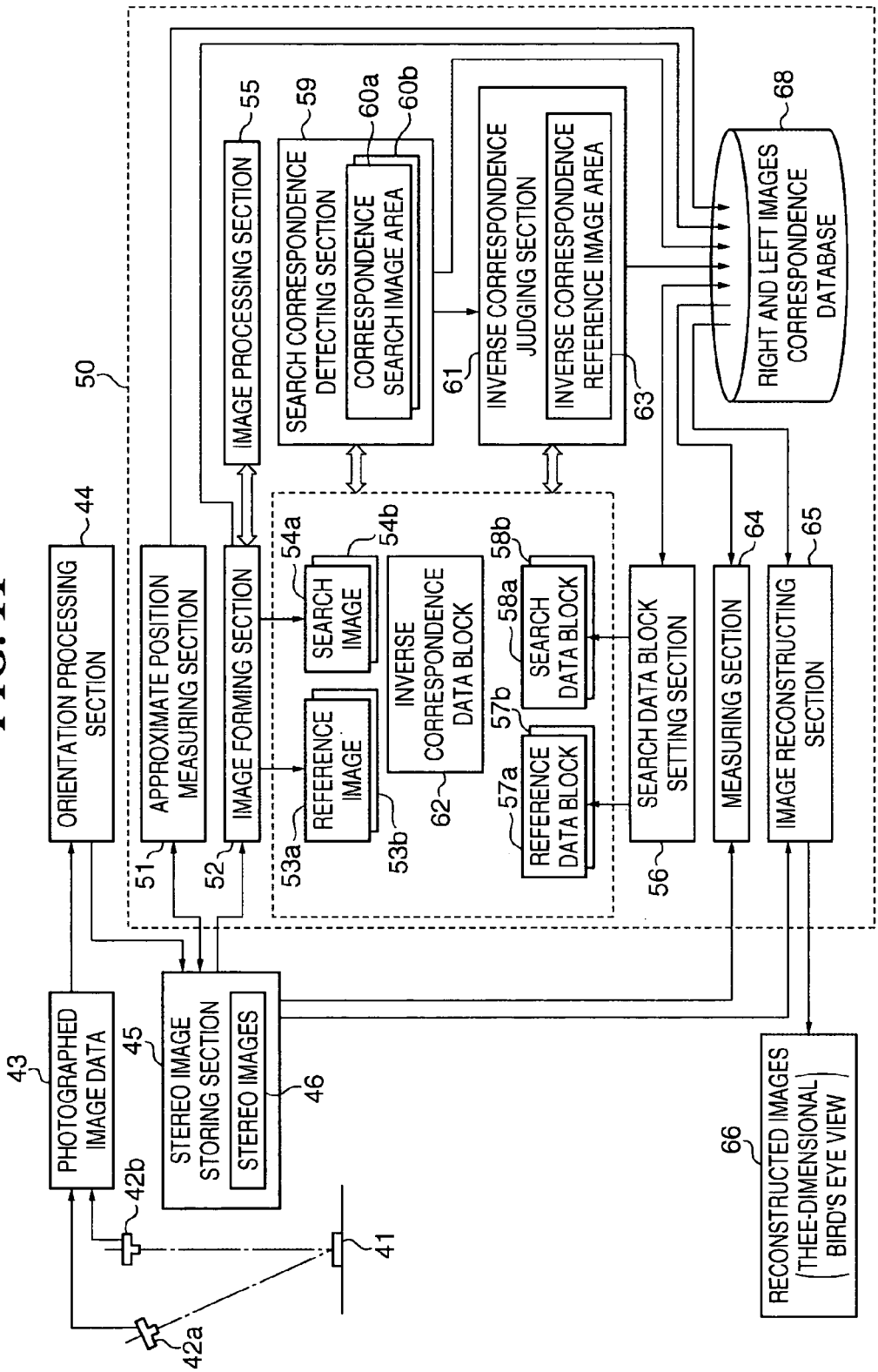
FIG. 11 is a block diagram illustrating the entire structure of an image measuring apparatus adopting a coarse to fine method combined with a back matching method.

FIG. 11 is a block diagram illustrating the entire structure of an image measuring apparatus adopting a coarse to fine method combined with a back matching method, for an example of anisotoropic shape measurement. As shown in the drawing, an object 41 such as a semiconductor, a body tissue or a cell is placed on a table (not shown) and photographed with cameras 42a and 42b having the same optical characteristics. The focal length of the cameras 42a and 42b as imaging optical systems is known and their lens aberration has been corrected. The right and left stereo cameras 42a and 42b are placed such that the object 41 can be photographed with the same resolution by them. The right and left stereo cameras 42a and 42b produce a pair of stereo-photographed image data 43 having a high overlapping rate of at least about 80%, for example. The cameras may be optical cameras for ordinary developing papers or electronic cameras such as CCDs (charged coupled devices). For smooth image processing, the stereo-photographed image data 43 are preferably stored in a flexible disc, CD-ROM, DVD or the like as electromagnetic recording information.

An orientation processing section 44 performs internal orientation and external orientation on the stereo-photographed image data 43 photographed by the right and left stereo cameras 42a and 42b so that stereo matching process can be performed. To perform internal orientation is to perform correction or calibration of the internal geometric structure of the cameras used or the imaging surfaces (films). For example, the distortion of the lenses, the positional relation, such as eccentricity, between the lenses and films and the flatness of the films are corrected. To perform external orientation is to determine the positions and attitudes of the cameras at the time of photographing. The external orientation is formulated with, for example, a collinear conditional expression. The collinear conditional expression is a relational expression which is true when the projection center, a position on the film and the object are on a straight line. A pair of right and left stereo images 46 oriented in the orientation processing section 44 are stored in a stereo image storing section 45. The stereo image storing section 45 is a medium for storing image information as electromagnetic information, such as a flexible disc, CD-ROM or DVD. The orientation process may be obtained in advance as parameters of the apparatus or may be obtained by measuring the images. The lenses herein include electronic lenses of an electron microscope.

An image measuring device 50 has an approximate position measuring section 51, an image forming section 52, an image processing section 55, a search data block setting section 56, a search correspondence detecting section 59, an inverse correspondence judging section 61, a measuring section 64, an image reconstructing section 65, and a right and left images correspondence database 68. Data dealt with by the image measuring device 50 include reference images 53, search images 54, reference data blocks 57, search data blocks 58, correspondence search image areas 60, and inverse correspondence data blocks 62. As the image measuring device 50, a computer such as a high-performance personal computer or a workstation is used. Each of the component elements of the image measuring device 50 is constituted of application software or a highly integrated electronic circuit such as an ASIC.

The approximate position measuring section 51 has a function of extracting marks or characteristic points in a pair of stereo images 46 and obtaining the approximate positions of the marks or the characteristic points in the stereo images by a projection conversion process.

The image forming section 52 produces reference images 53 and search images 54 from a pair of the paired stereo images 46. A reference image 53a with a high resolution, a reference image 53b with a low resolution, a search image 54a with a high resolution and a search image 54b with a low resolution are formed. Typically, when a reference image 53 is formed from the left image of the paired stereo images 46, a search image 54 is formed from the other image, namely the right image. The resolution of an image is a parameter which determines the fineness of the image. When the resolution is low, the image is grainy, and when the resolution is high, the image is fine. The amount of data included in an image is huge. To reduce the computation amount in stereo matching, approximate positions of corresponding points are extracted from images with a low resolution and precise positions of the corresponding points are extracted from images with a high resolution. Typically, images are formed at two resolution levels; low resolution as a first resolution and high resolution as a second resolution. The hierarchical structure of the image resolution relates to the coarse to fine method, and the detail will be described later. The image forming section 52 may form reference images 53 and search images 54 with three or more resolution levels.

The image processing section 55 sharpens the paired stereo images 46, the reference images 53 and the search images 54 to be dealt with by the image forming section 52, emphasizes the contrast and edges of the images, performs interpolation and compression of image data necessary to form images with different resolutions, and extracts characteristics from image data.

The search data block setting section 56 sets reference data blocks 57 in the reference images 53 and search data blocks 58 in the search images 54. When the image forming section 52 forms the reference images 53 and the search images 54 at two levels of, namely low and high resolution, the search data block setting section 56 forms the reference data blocks 57 and the search data blocks 58 at two levels of, namely low and high resolution. When the image forming section 52 forms the reference images 53 and the search images 54 at three levels of resolution, the search data block setting section 56 forms the reference data blocks 57 and the search data blocks 58 at three levels of resolution. The search data blocks 58 limit the area in which the reference data blocks 57 are searched for, and are preferably larger than the entire search images 54 and smaller than the reference data blocks 57 in size.

The search correspondence detecting section 59 searches for search data blocks 58 corresponding to the reference data blocks 57 provided in the reference images 53 in the search images 54. Since image data are dealt with, the search correspondence detecting section 59 searches for search data blocks 58 identical with or similar to reference data blocks 57 between reference images 53 and search images 54 with the same resolution. Thus, the search correspondence detecting section 59 does not perform search correspondence detection between reference images 53 and search images 54 with different resolutions. More specifically, the search correspondence detecting section 59 obtains a first correspondence search image area 60a corresponding to a first reference data block 57a in a first search data block 58a in the first search image 54a, and obtains a second correspondence search image area 60b corresponding to a second reference data block 57b in a second search data block 58b in the second search image 54b. The first correspondence search image area 60a has the highest correlation coefficient with the first reference data block 57a in the first search data block 58a. Thus, when the positions of corresponding image areas are represented by image coordinate information, image processing by arithmetic operation can be performed with ease. Also, positional relations can be represented in pixels and the positions of corresponding points can be expressed in detail. As for the second correspondence search image area 60b, the situation is the same as the first correspondence search image area 60a.

The inverse correspondence judging section 61 judges whether the corresponding points as a result of stereo matching process between the reference images 53 and the search images 54 are true or false. More specifically, the inverse correspondence judging section 61 sets an inverse correspondence data block 62 corresponding to the second reference data block 57b in the second search image 54b using the second correspondence search image area 60b, obtains an inverse correspondence reference image area 63 corresponding to the inverse correspondence data block 62 in the second reference image 53b, and judges whether the inverse correspondence image area 63 coincides with the second reference data block 57b in the second reference image 53b. This will be described later in detail.

The measuring section 64 obtains the positional relation between the second reference image 53b and the second search image 54b using the second correspondence search image area 60b when the inverse correspondence judging section 61 determines that the inverse correspondence reference image area 63 and the second reference data block 57b coincide with each other. Also, the measuring section 64 measures the object photographed in the paired stereo images using the thus obtained positional relation.

The image reconstructing section 65 reconstructs two- or three-dimensional images of the object based on the result of measurement of the object photographed in the paired stereo images 46 obtained by the image measuring device 50. The reconstructed images 66 include images of various types such as a three-dimensional bird's eye view and an orthophoto image. The right and left images correspondence database 68 stores information on corresponding points in the right and left images photographed in the paired stereo images 46, and is used as a common database for the approximate position measuring section 51, the image forming section 52, the image processing section 55, the search data block setting section 56, the search correspondence detecting section 59, the inverse correspondence judging section 61, the measuring section 64 and the image reconstructing section 65.

Figure 12:
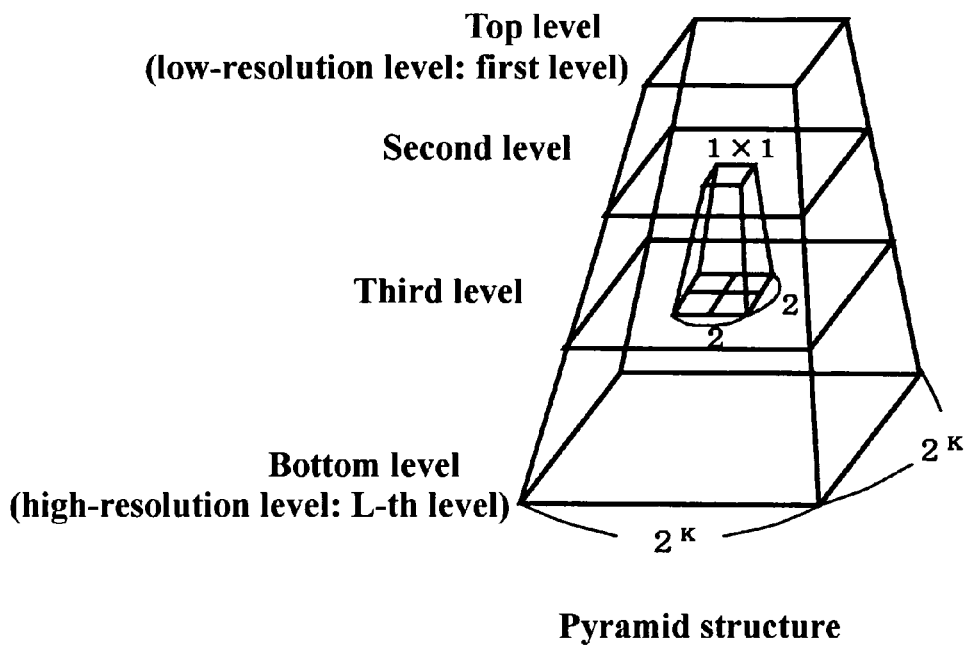
FIG. 12 is a view illustrating the hierarchical structure of the coarse to fine method.

Description will be made of the operation of each component element in more detail with reference to the drawings. FIG. 12 is a view for explaining the hierarchical structure of the coarse to fine method. To optimize the image correlation operation time in the search correspondence detecting section 59, images are arranged hierarchically at different resolution levels. In this case, to detect corresponding points reliably by the image correlation operation, pyramid-type multi-level searching is performed. In the pyramid structure, since approximate matching is performed at the top level with a low resolution and exact matching is performed at the level with a high resolution, there is no need for backtracking to perform matching in the image correlation operation. Thus, the image correlation operation can be shortened. Also, since judgment can be made comprehensively based on the image matching results at various resolutions levels, erroneous correspondences can be reduced. In the pyramid-type multi-level structure, images with different resolutions are formed as shown in FIG. 12, namely as follows: low-resolution level (first reference image), second level (second reference image), . . . , high-resolution level (L-th reference image), low-resolution level (first search image), second level (second search image), . . . , high-resolution level (L-th search image). It is advisable that the high-resolution level have the same pixel density as the reference images 53 and the search images 54, and each of the other levels have half the pixel density (twice the reduction resolution) of the level below it.

Namely, the pyramid structure of the reference images and the search images with first to L-th levels (the lowermost level is the L'-th level) are constructed by applying the equation 1 in the image processing section 55 or the image forming section 52. Here, the L-th level is;

$$f_{L-1}(x, y) = \sum_{i=0}^{1} \sum_{j=0}^{1} f_L(2x+i, 2y+j) \quad (1)$$

wherein x, y=0, 1, . . . , $2^{k-(L'-L)-1}$.

When L=3, the number of levels is three in total. In adding a third level to a two-level structure, a level with a third resolution which is higher than the second resolution may be provided or a level with a fourth resolution which is between the first and second resolutions may be provided.

Figure 13:
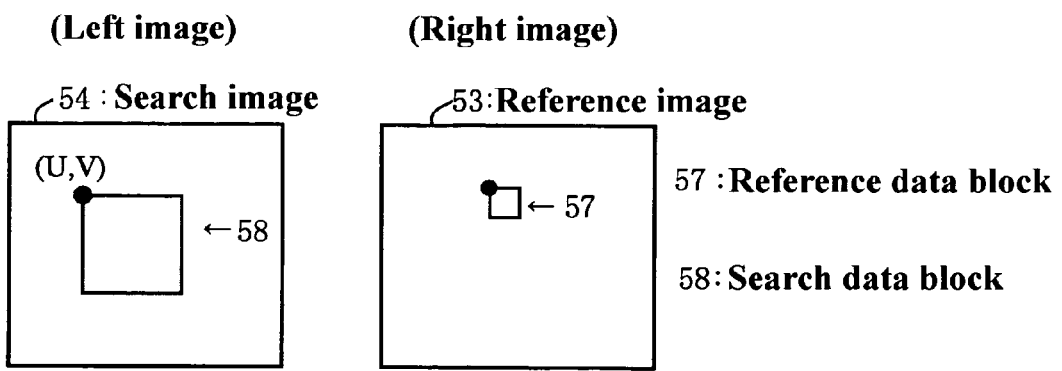
FIG. 13 is an explanatory view of a reference data block 57 set in a reference image 53 and a search data block 58 set in a search image 54.

FIG. 13 is an explanatory view of the reference data block 57 set in the reference image 53 and the search data block 58 set in the search image 54. The search data block setting section 56 sets the area of the search data block 58 in the search image 54 wider than that of the reference data block 57 set in the reference image 53. The possibility that there is an area with a high correlation coefficient with the reference data block 57 in the search data block 58 is thereby increased. The reference data block 57 and the search data block 58 may be defined for all the pixels in the images. When they are defined for all the pixels, there appear points whose positions can be determined based on the patterns in whole color tone or lightness even when a clear pattern does not appear in the image information as in the case of a semiconductor wafer before patterning. However, the reference data block 57 and the search data block 58 may be set in an area with image information including a contrast, shape or contour so distinguishable to determine the positional correspondence such as patterns at regular intervals, corresponding points or characteristic points.

Description will be made of the matching method with a normalized correlation coefficient with reference to FIG. 13. In FIG. 13, the right and left images are the reference image 53 and the search image 54, respectively. The reference data block 57 is constituted of N-number of data, and the search data block 58 has a starting point at the image coordinates (U, V) In the matching method with a normalized correlation coefficient, the arithmetic operation represented by the equation (2) is performed at each point while performing raster scanning in such a manner that the reference data block 57 is moved in the search data block 58 from left to right, and when reaching the right end of the search data block 58, the reference data block 57 is moved to the left end of the row below it and moved from left to right again.

$$M=M(Xi, Yi)(1 \leq i \leq N) \quad (2)$$

$$I=I(U+Xi, V+Yi)$$

wherein M is the normalized value of the reference data block 57, and I is the normalized value of the search data block 58.

Then, the resemblance between the reference data block 57 and the search data block 58 is given by the following normalized correlation coefficient R(U, V).

$$R(U,V)=(N\Sigma IiMi-\Sigma Ii\Sigma Mi)/SQRT[\{N\Sigma Ii^2-(\Sigma Ii)^2\}\{N\Sigma Mi^2-(\Sigma Mi)^2\}] \quad (3)$$

The normalized correlation coefficient R always takes a value from −1 to 1. When the normalized correlation coefficient R is 1, the corresponding images in the reference data block 57 as a template and the search data block 58 completely coincide with each other. Then, when the search correspondence detecting section 59 searches for a position with the highest correlation coefficient, it is possible to find a correspondence search image area 60 which indicates the position of the image most similar to the reference data block 57 in the search-data block 58.

When there is no point similar to the reference data block 57 in the search data block 58, the maximum value of the normalized correlation coefficient R is small (for example, 0.1), and the search for the correspondence search image area 60 is regarded as a failure. However, since the search correspondence detecting section 59 regards the coordinate values with the highest normalized correlation coefficient R as the coordinate values of the correspondence search image area 60 in searching, coordinate values with a low normalized correlation coefficient R as small as 0.1, which is close to a noise level, may be regarded as the coordinate values of the correspondence search image area 60. Thus, when the maximum value of the normalized correlation coefficient R is not greater than a threshold value (0.2 to 0.3, for example), the search for the correspondence search image area 60 is regarded as a failure.

Figure 14:
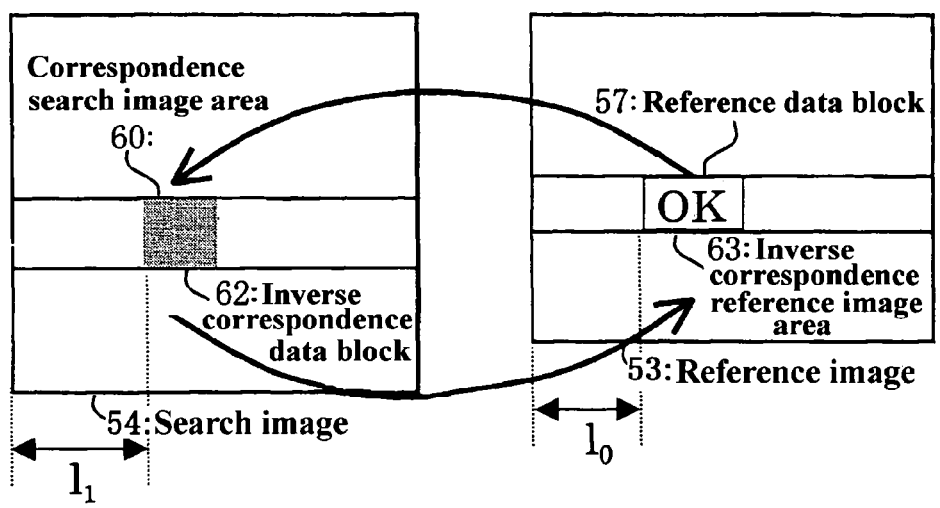
FIG. 14 is an explanatory view of a back matching method performed by an inverse correspondence judging section 61.
Figure 14:
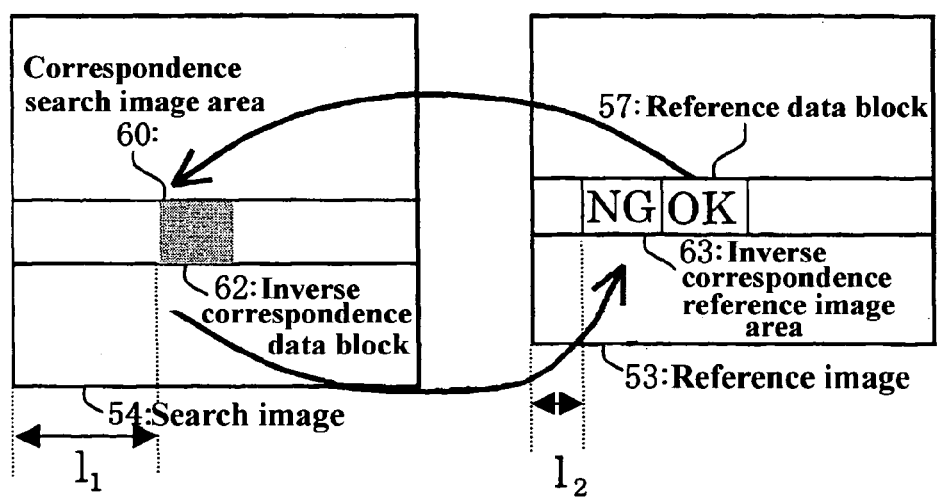

FIG. 14 is an explanatory view of the back matching method performed by the inverse correspondence judging section 61, wherein (A) and (B) show the case in which the searched corresponding point is true (OK) and the case in which the searched corresponding point is false (NG), respectively. The inverse correspondence judging section 61 searches for a correspondence search image area 60 corresponding to the search data block 58 in the search image 54 based on the reference data block 57 in the reference image 53. Then, the inverse correspondence judging section 61 sets the searched correspondence search image area 60 in the search data block 58 as an inverse correspondence data block 62. The inverse correspondence judging section 61 obtains an inverse correspondence reference image area 63 corresponding to the inverse correspondence data block 62 in the reference image 53, and judges whether the inverse correspondence reference image area 63 and the reference data block 57 coincide with each other in the reference image 53. When the inverse correspondence reference image area 63 and the reference data block 57 coincide with each other, the searched correspondence search image area 60 is regarded as true. Otherwise, the searched correspondence search image area 60 is regarded as false (the matching was failed). Since the inverse correspondence judging section 61 removes correspondence search image areas 60 regarded as false, erroneous corresponding points can be removed.

Figure 15:
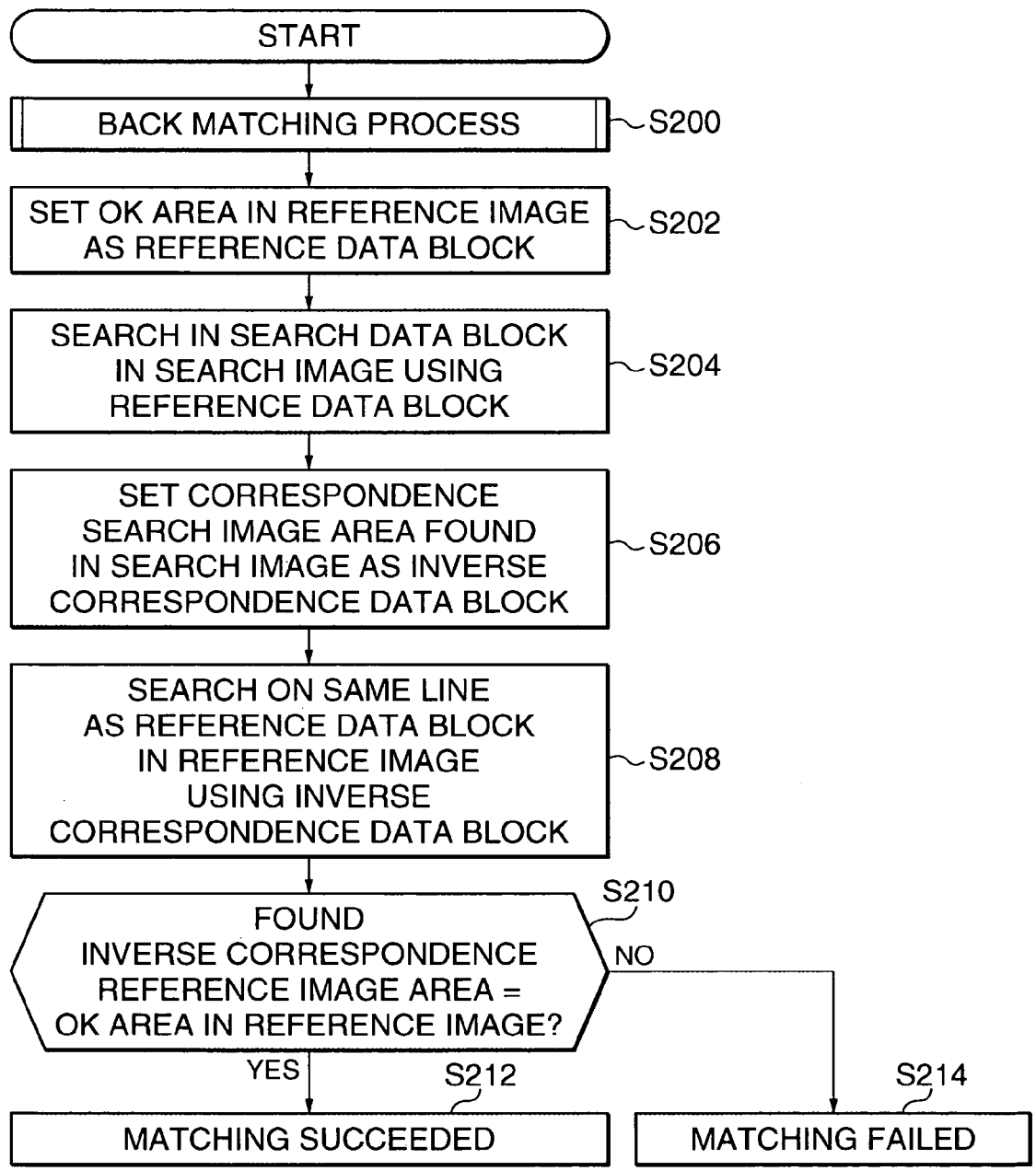
FIG. 15 is a flowchart for explaining back matching in an inverse correspondence judging section 61.

FIG. 15 is a flowchart for explaining the back matching in the inverse correspondence judging section 61. Description will be made of the procedure of the back matching in the inverse correspondence judging section 61 with reference to FIG. 14 and FIG. 15. For simplicity, the reference data block 57 and the search data block 58 are in areas on the same line in the reference image 53 and the search image 54 as shown in FIG. 14. When the back matching is started (S200), the inverse correspondence judging section 61 sets an OK area in the reference image 53 as a reference data block 57 (S202). The inverse correspondence judging section 61 makes a search on the search data block 58 in the search image 54 using the reference data block 57 (S204). When a correspondence search image area 60 with a high correlation coefficient is found in the search data block 58 in the search image 54, the correspondence search image area 60 is set as an inverse correspondence data block 62 (S206).

The inverse correspondence data block 62 is processed in the same manner as the reference data block 57, and an inverse correspondence reference image area 63 corresponds to the correspondence search image area 60. The inverse correspondence judging section 61 makes a search on the same line as the reference data block 57 in the reference image 53 using the inverse correspondence data block 62 (S208). When an inverse correspondence reference image area 63 with the largest correlation coefficient is found, the inverse correspondence judging section 61 judges whether the inverse correspondence reference image area 63 coincides with the OK area as the initial reference data block 57 (S210). When the inverse correspondence reference image area 63 can reach the OK area, the inverse correspondence judging section 61 determines that the matching is successful (S212). When the corresponding reference image area 63 reaches not the OK area but another area (NG area), the inverse correspondence judging section 61 determines that the matching is failed (S214).

Figure 16:
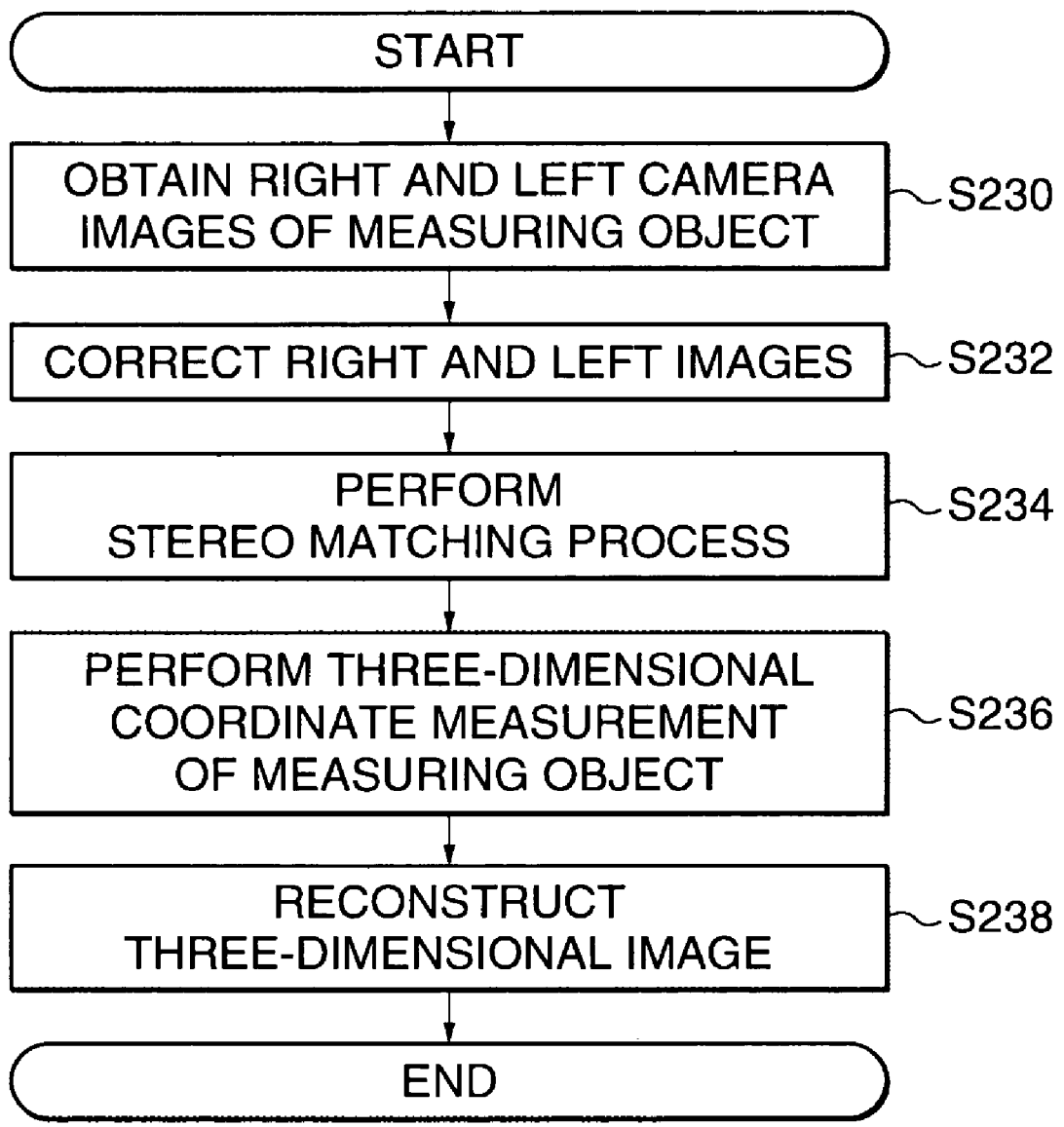
FIG. 16 is a flowchart for explaining the entire three-dimensional shape measurement process performed on a pair of stereo images.

Description will be made of the operation of the apparatus constituted as described above. FIG. 16 is a flowchart for explaining the entire three-dimensional image measurement process performed on a pair of stereo images. With the right and left stereo cameras 42a and 42b, right and left camera images of the object 41 are obtained (S230). The right and left camera images are corrected in the orientation processing section 44 as stereo-photographed image data 43 (vertical parallax are removed at the same time). The produced stereo images are stored in the stereo image storing section 45 as a pair of stereo images 46. Stereo matching is performed on the paired stereo images 46 (S234). Using the stereo images having subjected to the stereo matching, three-dimensional coordinate measurement of the object 41 photographed in the stereo images 46 is performed (S236). When necessary, a three-dimensional image of the object 41 is reconstructed (S238).

Figure 17A:
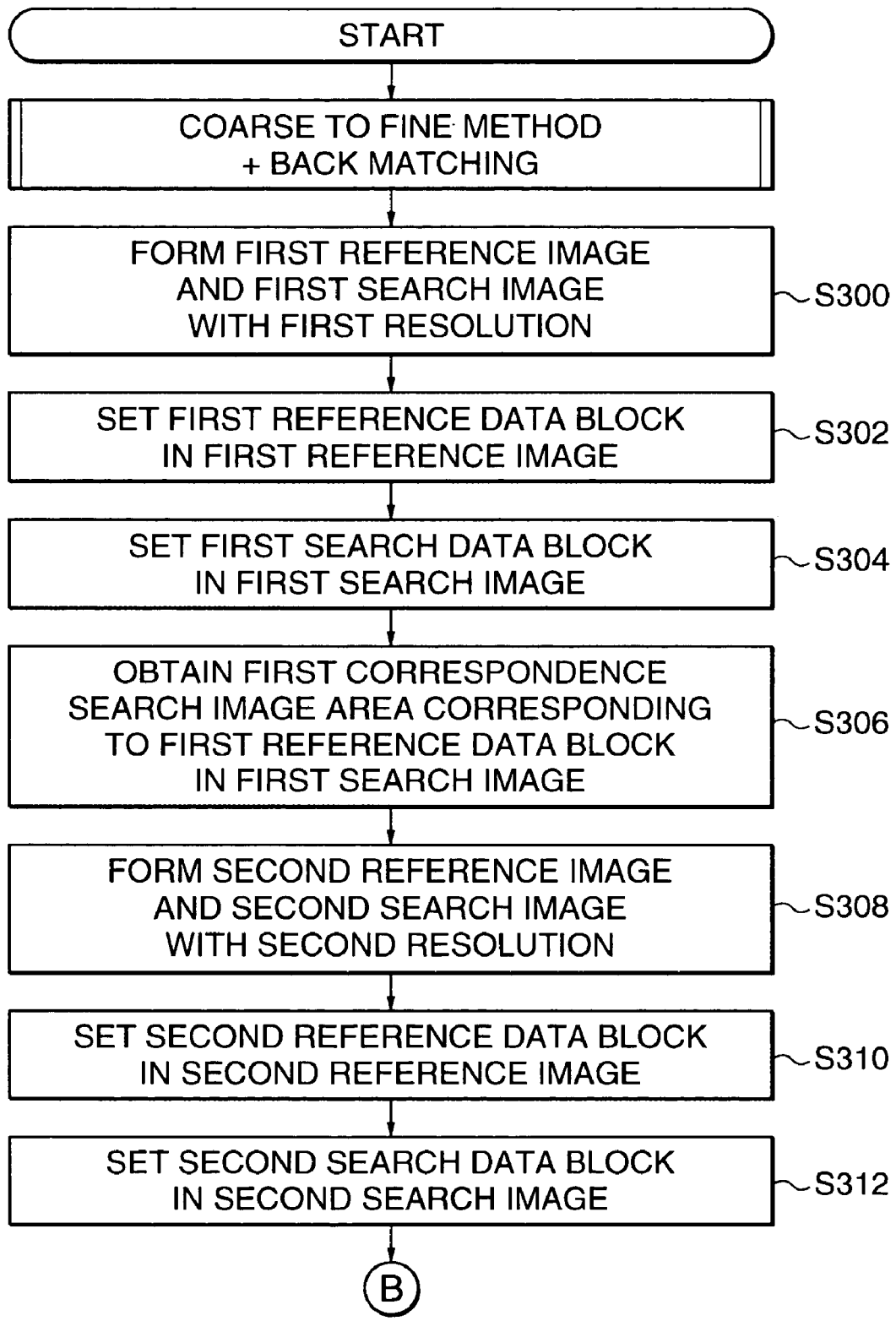
FIGS. 17A and 17B are flowcharts for explaining the first embodiment of this invention.
Figure 17B:
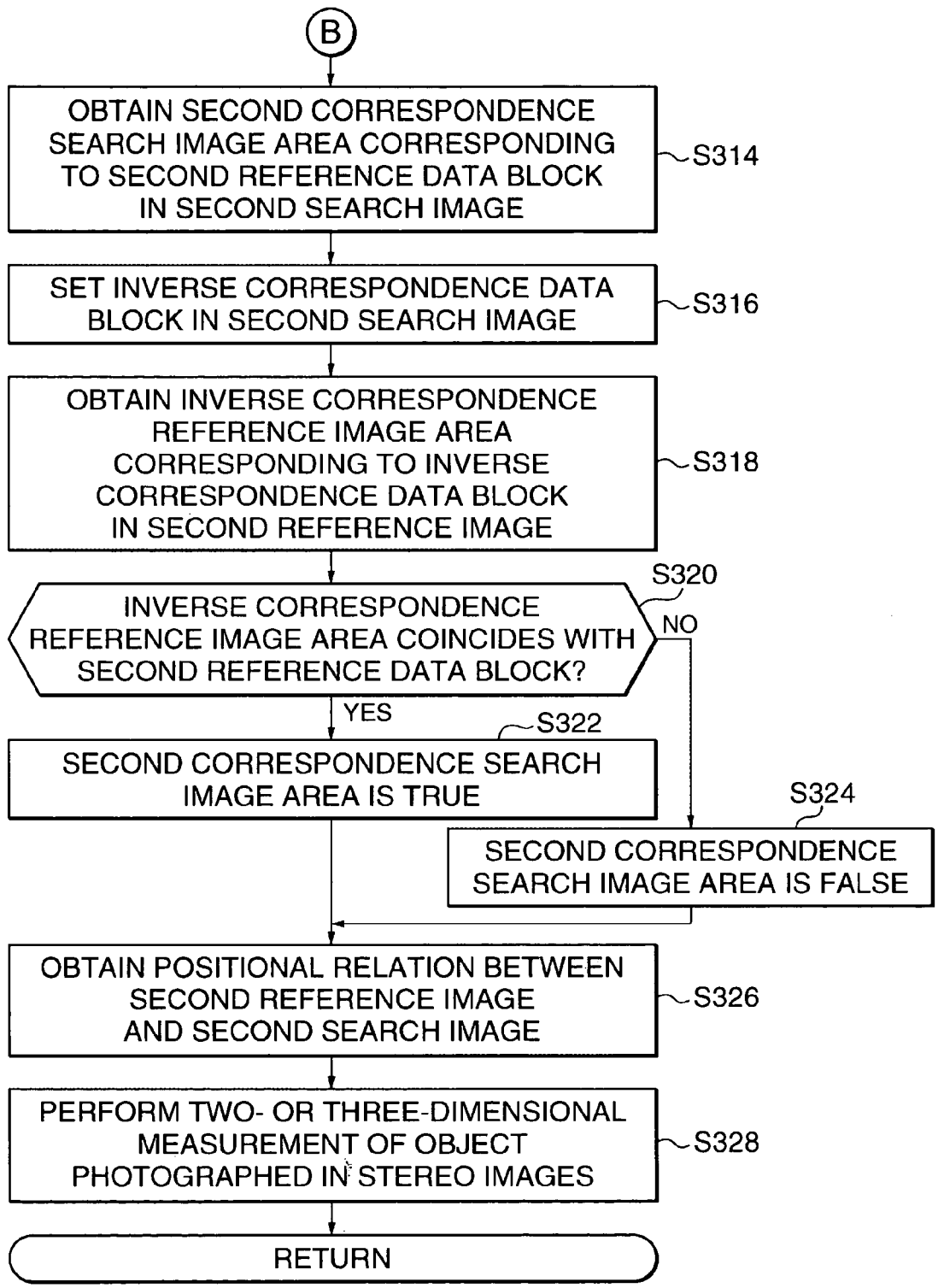

Description will be made of the operation of the image measuring apparatus shown in FIG. 11 with reference to FIG. 17. With the flowchart in FIG. 17, an operation in which a coarse to fine method and a back matching are combined will be described. The image forming section 52 forms a first reference image 53a and a first search image 54a with a first resolution from the paired stereo images 46 (S300). The search data block setting section 56 sets a first reference data block 57a having pixel data corresponding to the first resolution in the first reference image 53a (S302). The search data block setting section 56 also sets a first search data block 58a having pixel data corresponding to the first resolution in the first search image 54a (S304). The search correspondence detecting section 59 obtains a first correspondence search image area 60a corresponding to the first reference data block 57a in the first search data block 58a in the first search image 54a (S306).

Then, the image forming section 52 forms a second reference image 53b and a second search image 54b with a second resolution which is higher than the first resolution from the paired stereo images 46 (S308). The search data block setting section 56 sets a second reference data block 57b having pixel data corresponding to the second resolution in the second reference image 53b (S310). The search data block setting section 56 also sets a second search data block 58b having pixel data corresponding to the second resolution in the second search image 54b (S312). In setting the second search data block 58b, the information on the first correspondence search image area 60a is used. This is because, since the hierarchical structure of the coarse to fine method is used in the first search image 54a and the second search image 54b, the positional information on the first correspondence search image area 60a is useful. The search correspondence detecting section 59 obtains a second correspondence search image area 60b corresponding to the second reference data block 57b in the second search data block 58b in the second search image 54b (S314).

Then, verification by back matching is performed. The inverse correspondence judging section 61 sets an inverse correspondence data block 62 corresponding to the second reference data block 57b in the second search image 54b using the second correspondence search image area 60b (S316). The inverse correspondence judging section 61 obtains an inverse correspondence reference image area 63 corresponding to the inverse correspondence data block 62 in the second reference image 53b (S318). The inverse correspondence judging section 61 judges whether the inverse correspondence reference image area 63 and the second reference data block 57b coincide with each other in the second reference image 53b (S320). When the inverse correspondence reference image area 63 and the second reference data block 57b coincide with each other, the second correspondence search image area 60b found by the search correspondence detecting section 59 is true (S322). When the inverse correspondence reference image area 63 and the second reference data block 57b do not coincide with each other in S320, the second correspondence search image area 60b found by the search correspondence detecting section 59 is false (S324).

When it is determined that the inverse correspondence reference image area 63 and the second reference data block 57b coincide with each other in S322, the positional relation between the second reference image 53b and the second search image 54b are obtained (S326) using the second correspondence search image area 60b. Then, the measuring section 64 performs measurement of the object photographed in the paired stereo images 46 (S328)

Description will be made of the sharpening process performed in the image processing section. When the image processing section 55 performs image sharpening, contrast emphasizing and edge emphasizing on the paired stereo images 46 as image pre-processing, the correlation coefficient applied to the reference image 53 and the search image 54 becomes greater and corresponding point coordinates can be reliably detected. Although various types of image pre-processing are known, an image sharpening process using a Laplacian filter will be described as a typical example.

FIG. 18 is a structural view illustrating an example of a Laplacian operator. The Laplacian operator is used to perform an arithmetic operation on a 3×3 pixel grid. The coefficient of the center pixel (2, 2) is "5", the coefficient of the pixels (2, 1), (2, 3), (1, 2) and (3, 2) above, below and to the right and left of the center pixel is "−1", and the coefficient of the pixels (1, 1), (1, 3), (3, 1), and (3, 3) in the diagonal direction from the center pixel is "0". By using the Laplacian operator, sharpened images can be obtained.

The general equation for the Laplacian operator is shown in the equation (4).

$$g(i,j)=f(i,j)-\nabla^2 f(i,j) \quad (4)$$

wherein g(i, j) represents a sharpened image and f(i, j) represents an inputted image. $\nabla^2 f$ is the Laplacian of the inputted image and may be an operator with coefficients shown in FIG. 18 or various types of operators for weighting and pixel differentiation. A Gaussian operator may be applied to the images.

An arithmetic operation represented by the equation (5) may be also used. The equation (5) is used to apply an arithmetic operation to Gaussian-smoothed images as a sharpening process.

$$\nabla^2 G(x,y) = \frac{x^2+y^2+2\sigma^2}{2\pi\sigma^6}\exp\left(-\frac{x^2+y^2}{2\sigma^2}\right) \quad (5)$$

wherein σ is a parameter of a Gaussian function. Then, the difference is expressed by the equation (6):

$$g(x,y)=f(x,y)-\nabla^2 G(x,y) \quad (6)$$

wherein g(x, y) represents an sharpened image, f(x, y) represents an inputted image and $\nabla^2 G(x, y)$ represents Laplacian of Gaussian of the inputted image. The sharpening may be made by taking images in focus (corresponding to f(x, y) in equation (6)) and out of focus (corresponding to $\nabla^2 G(x, y)$ in equation (6)) in photographing the right and left images of the same subject and obtaining the difference image of the two images.

Edge extracting is another sharpening process. FIG. 19 is a structural view illustrating an example of a line detection operator. By the line detection operator, a coefficient of "1" is applied to the pixels in the vertical direction and a coefficient "−½" is applied to the pixels on both sides of the above pixels to detect line segments in the vertical direction. The edges can be extracted by convolution of the image with a line detection operator for the direction to be detected.

The edges extraction may be performed on images sharpened in the image processing section. Namely, the edges can be extracted by setting the zero-cross points of density in a sharpened image as edges. Then, by imaging only the points with a density of 0 or making the plus area and the minus area on both sides of the points with a density of 0 white and black, respectively, an image can be formed.

Figure 20:
FIG. 20 is a view illustrating an example of a sharpening process, wherein (A) is an original image and (B) is a sharpened image.
Figure 20:
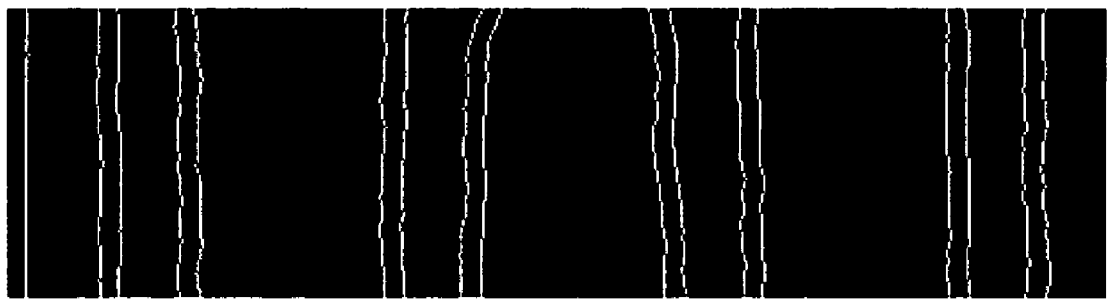

FIG. 20 is a view illustrating an example of a sharpening process and an edge extracting process, wherein (A) is an original image and (B) is a sharpened image. The original image is, for example, a SEM image of a semiconductor. In the original image, the line segments of the pattern are blurred. In the sharpened image, however, the line segments of the pattern are clearly extracted by the sharpening process and the edge extracting process. When line segments of the pattern are clarified, positional correspondence between a reference image and a search image can be easily obtained.

Figure 21:
FIG. 21 is an explanatory view of reference images and search images and back matching in the case where the hierarchical structure of the coarse to fine method has three levels.
Figure 21:
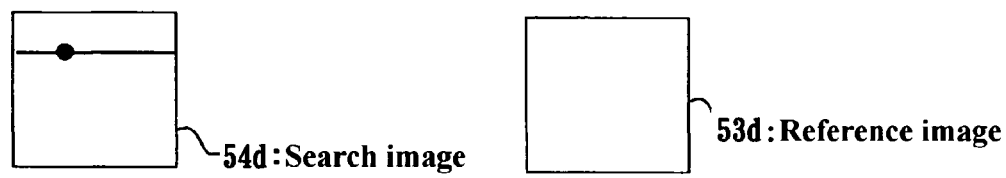
Figure 21:
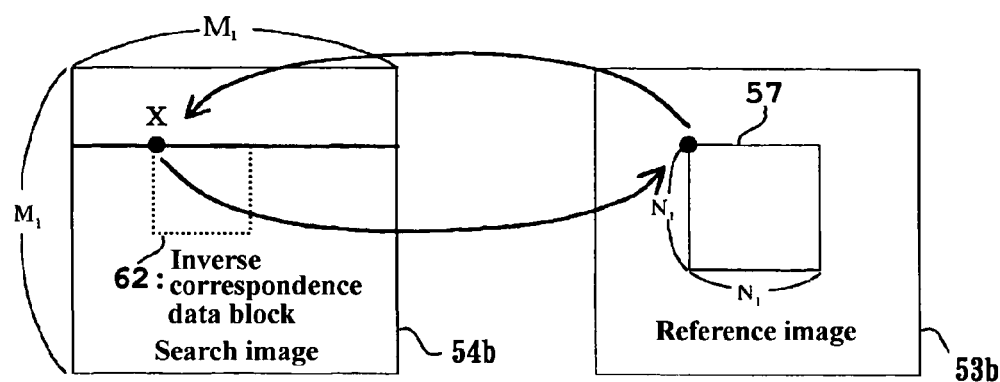
Figure 22:
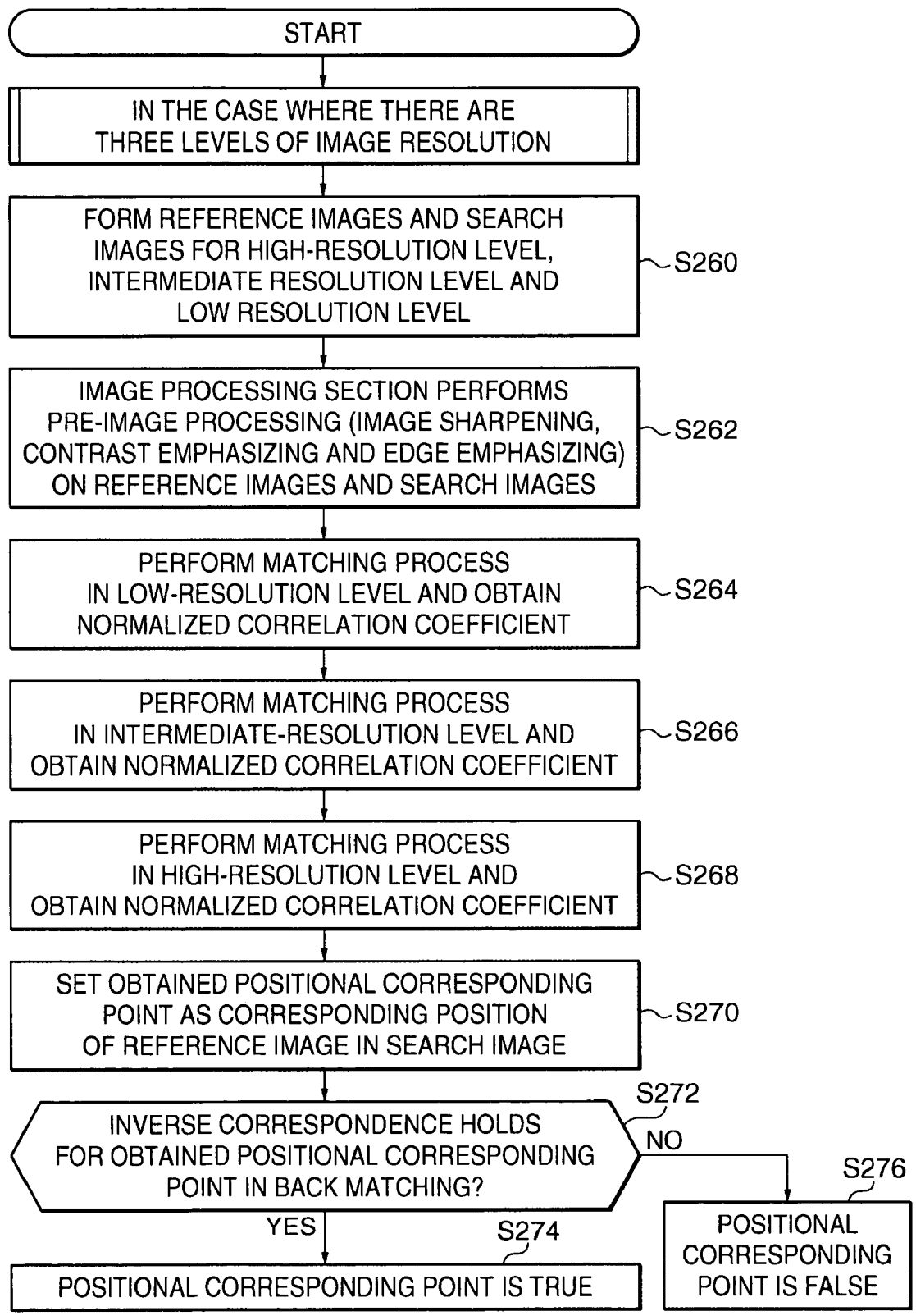
FIG. 22 is a flowchart for explaining the image measuring method in the case where the hierarchical structure of the coarse to fine method has three levels.

The image measuring method will be described taking the case where the hierarchical structure of the coarse to fine method has three levels as an example. FIG. 21 is an explanatory view of reference images and search images and back matching in the case where the hierarchical structure of the coarse to fine method has three levels, wherein (A), (B) and (c) show the low-resolution level, the intermediate resolution level and the high resolution level, respectively. FIG. 22 is a flowchart for explaining the image measuring method in the case where the hierarchical structure of the coarse to fine method has three levels.

The image forming section 52 forms a three-level pyramid structure of reference images 53 and search images 54 (S260) using the equation (1), for example. Namely, images are formed at the three levels of reduced resolution: low-resolution level (the top level of the pyramid structure), intermediate-resolution level, and high-resolution level (the bottom level of the pyramid structure). The low-resolution images will be referred to as reference image 53a and search image 54a, respectively. The high-resolution images will be referred to as reference image 53b and search image 54b, respectively. A reference data block 57 in the reference image 53b of the bottom level has a size of N1×N1 pixels (N1=2N). In the bottom level, a search data block 58b is the same as the search image 54b and has a size of M1×M1 pixels (M1=$2^M$). The search data block 58b may be smaller in size than the search image 54b. The intermediate-resolution images will be referred to as reference image 53d and search image 54d, respectively.

Then, the image processing section 55 performs image pre-processing (S262) including image sharpening, contrast emphasizing and edge emphasizing on the reference images 53a, 53b and 53c and search images 54a, 54b and 54c. The image pre-processing makes the matching processing for searching corresponding points in the reference images 53 and the search images 54 reliable.

Then, a matching process is performed on the low-resolution images and a normalized correlation coefficient is stored (S264). The matching process comprises, as described previously with FIG. 18, the steps of setting a reference data block 57a in the reference image 53a and setting a search data block 58a in the search image 54a by the search data block setting section 56, and obtaining a correspondence search image area 60a corresponding to the reference data block 57b in the search data block 58a by the search correspondence detection section 59. The correspondence search image area 60a corresponds to a corresponding point in the matching process. Here, letting the position of the upper left corner of the reference data block 57 in the L-th level with the minimum residual difference within the search area $\{[M1/2^{(L'-L)}]-[N1/2^{(L'-L)}+1]^2\}$ in the L-th level be (i, j), the position of the corresponding point is represented as (i, j). The correlation coefficient for the correspondence search image area 60a obtained in the search correspondence detection section 59 is temporarily stored in the right and left images correspondence database 68.

Then, the process goes to the level adjacent to the low-resolution level, and it is judged whether it is the bottom level. Here, since the level is the intermediate level, matching of images is performed within a search area with a size of 5×5 pixels around corresponding point coordinates (2i, 2j) in the upper level using the corresponding point coordinates in the low-resolution level as reference (S266). Here, The upper left corner of a template image with the minimum residual difference within the search area, namely the corresponding point position (i, j) with the maximum value of the normalized correlation coefficient is stored.

Then, the process goes to the level adjacent to the intermediate-resolution level and it is judged whether it is the bottom level. Here, since the level is the bottom level, matching of images is performed within a search area with a size of 3×3 pixels around the corresponding point coordinates (2i, 2j) in the upper level using the corresponding point coordinates in the intermediate-resolution level as reference (S268). Here, the upper left corner of a template image with the minimum residual difference within the search area, namely the corresponding point position (2i, 2j) with the maximum value of the normalized correlation coefficient is stored.

Then, by obtaining the position with the maximum value of the normalized correlation coefficient in the bottom level, a corresponding point with high similarity can be obtained. The positional corresponding point of the reference image 53b in the search image 54b can be obtained with high accuracy (S270).

The inverse correspondence judging section 61 forms an inverse correspondence data block 62 in the search image 54b using a positional corresponding point obtained by the matching process. The positional corresponding point is used as X coordinate of the inverse correspondence data block 62. The inverse correspondence judging section 61 performs back matching of the inverse correspondence data block 62, and it is judged whether the inverse correspondence reference image area mapped in the reference image 53b coincides with the original reference image 53b (S272). When the inverse correspondence reference image area coincide with the original reference image 53b in the back matching, the positional corresponding point is true (S274) and the matching process is regarded as being successful. When the inverse correspondence reference image area does not coincide with the original reference image 53b in step S272, the positional corresponding point is false (S276) and the matching process is regarded as being failed.

In the above example of the anisotropic shape measurement, matching process is performed on the images in the first and second resolution levels sequentially and back matching is performed on the images in the final stage. However, back matching may be performed after the matching process in each level. Also, although the reference data blocks 57 have sizes of 3×3 and 5×5 pixels, the number of pixels of the reference data blocks 57 can be arbitrarily selected. For example, the number of pixels may be the same as the number of pixels on one scanning line of the reference images 53. Further, although the normalized correlation coefficient is used to judge the result of the matching process, the sequential similarity detection algorithm (SSDA) method or another area correlation method may be used. The back matching may be combined with a characteristic extracting method.

Second Embodiment

Figure 23:
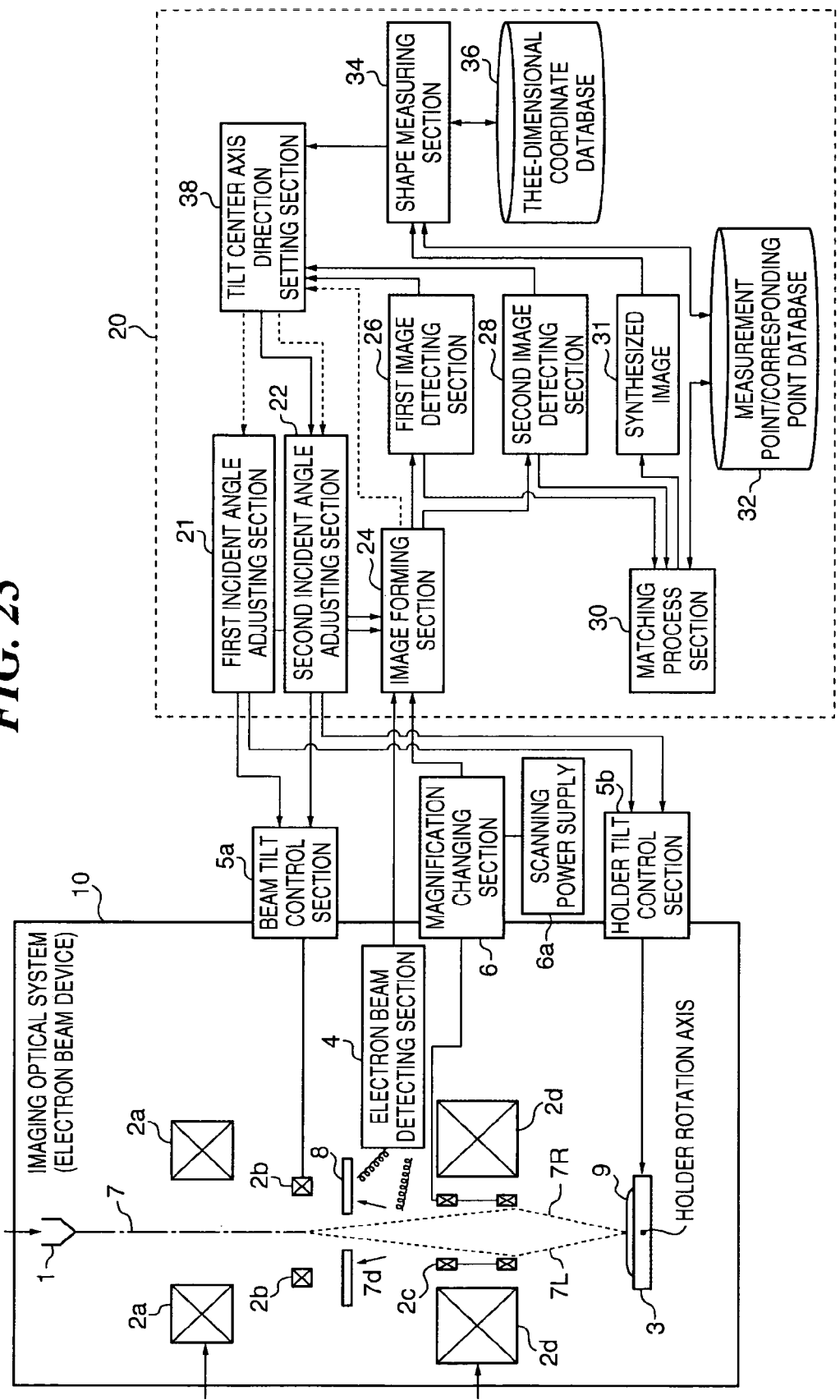
FIG. 23 is a block diagram illustrating the entire structure of a second embodiment of this invention.

FIG. 23 is a block diagram illustrating the structure of the second embodiment of this invention. In the second embodiment, a stereoscopic image is obtained not by tilting the holder but by deflecting the electron beam of the scanning microscope. Component elements which are the same as those in FIG. 1 are denoted by the same reference numerals in FIG. 23, and their description will not be repeated here. Here, a beam tilt control section 5a for controlling the tilt of the electron beam 7 is provided as the tilt control section 5. The beam tilt control section 5a sends a tilt control signal to the deflection lenses 2b so that the incident electron beam 7 is deflected to be an electron beam 7R which makes a first incident angle relative to the sample holder 3 or an electron beam 7L which makes a second incident angle 7L relative to the sample holder 3. The beam tilt control section 5a may be able to adjust the relative tilt between the incident electron beam 7 and the sample holder 3 to a multiplicity of angles. At least two angles are necessary to obtain data for stereo detection.

When the beam is tilted, there is a beam intersecting axis where the electron beams 7R and 7L intersect as a neutral axis corresponding to the holder rotation axis R as described with the first embodiment. Thus, in setting the first neutral axis necessary to form the first stereoscopic image and the second neutral axis necessary to form the second stereoscopic image, the holder rotation axis R in the description of the first embodiment has to be changed to the beam intersecting axis.

Third Embodiment

In the first and second embodiments, the first neutral axis direction of the object 9 is determined by the first incident angle adjusting section 21, and then the second neutral axis direction of the object 9 is determined by the second incident angle adjusting section 22. Also, in the first and second embodiments, the second neutral axis direction is corrected by the tilt center axis direction setting section 38 to set a new second neutral axis direction, or third and fourth neutral axis directions are set by the tilt center axis direction setting section 38 when necessary. However, when the compatibility between the anisotropic shape measurement and the processing of the pattern shape of the object is known, it is possible to optimize the frequency of formation of stereoscopic images with a large operation load when the tilt center axis direction setting section 38 sets the first and second neutral axis directions based on the images formed in the image processing section. The third embodiment is suitable when the compatibility between the anisotropic shape measurement and the processing of the pattern shape of the object is known.

Figure 24:
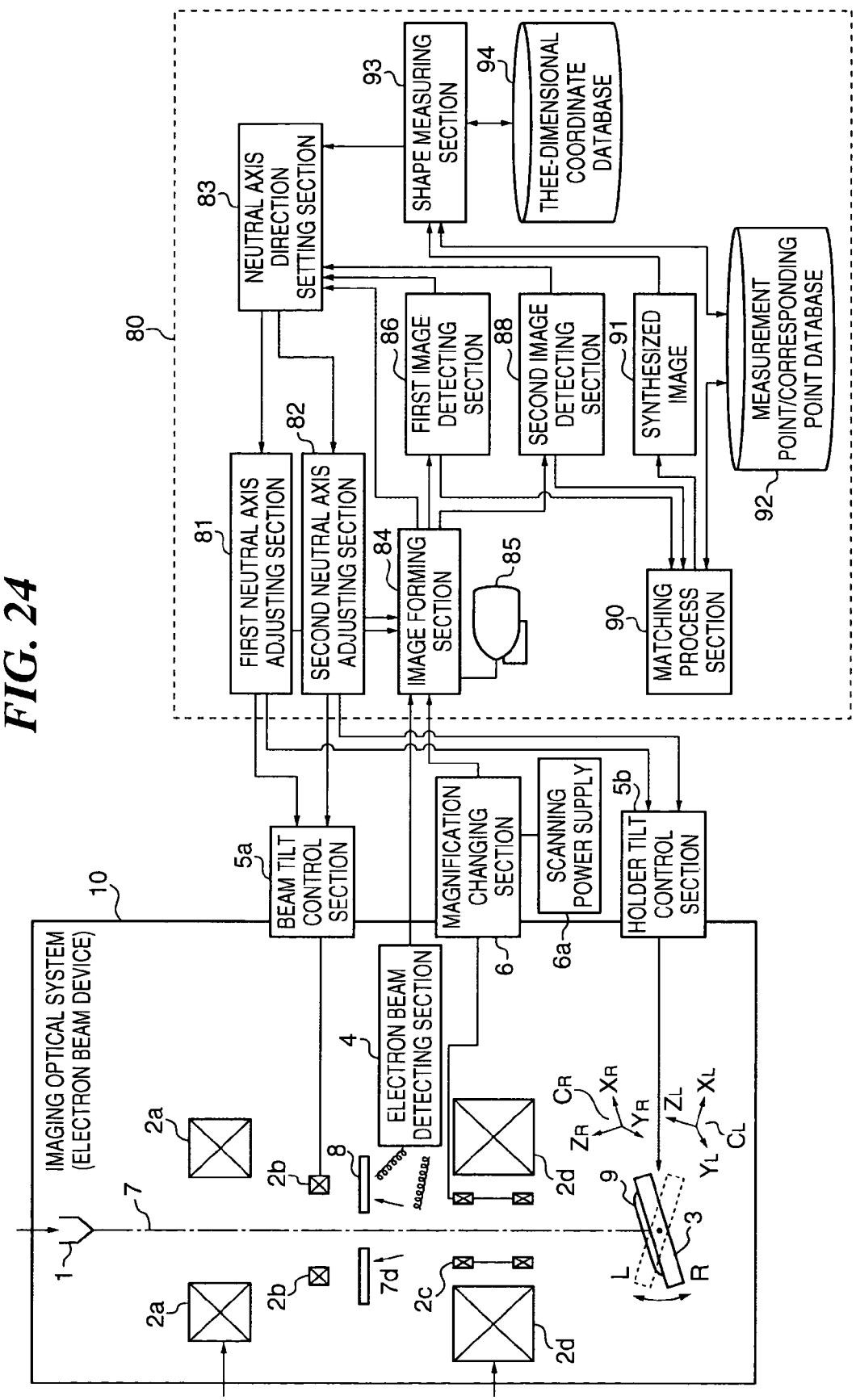
FIG. 24 is a block diagram illustrating the entire structure of a third embodiment of this invention.

FIG. 24 is a block diagram illustrating the entire structure of the third embodiment of this invention. Component elements having the same function as those in FIG. 1 are denoted by the same reference numerals in FIG. 24, and their description will not be repeated here. A data processing device 80 has a first neutral axis adjusting section 81, a second neutral axis adjusting section 82, a neutral axis direction setting section 83, an image forming section 84, a first image detecting section 86, a second image detecting section 88, a matching process section 90, a measurement point/corresponding point database 92, a shape measuring section 93 and a three-dimensional coordinate database 94. The data processing device 80, the image forming section 84, the first image detecting section 86, the second image detecting section 88, the matching process section 90, the measurement point/corresponding point database 92, the shape measuring section 93 and the three-dimensional coordinate database 94 have the same function as the data processing device 20, the image forming section 24, the first image detecting section 26, the second image detecting section 28, the matching process section 30, the measurement point/corresponding point database 32, the shape measuring section 34 and the three-dimensional coordinate database 36 in the first embodiment, respectively, unless otherwise stated.

The image forming section 84 forms an image of the sample surface using a secondary electron beam detected with the detector 4 when the electron beams 7 is caused to scan an area on the sample surface by the scanning lenses 2c. The neutral axis direction setting section 83 calculates the directions to be the neutral axis direction of the first and second stereoscopic images using the information on line segments which cannot be detected by the anisotropic shape measurement and a monaural image of the object 9 obtained by the image forming section 84, and sets them in the first neutral axis adjusting section 81 and the second neutral axis adjusting section 82.

The first neutral axis adjusting section 81 causes the holder tilt control section 5b to adjust the attitude of the object 9 in the first neutral axis direction to adjust the incident angle of the beam 7 projected on the object 9 from the electron beam device 10 relative to the object 9 so that a first stereoscopic image of the object 9 can be formed. Namely, the first neutral axis adjusting section 81 sends a control signal to the electronic optical system 2 to adjust a reference surface to be scanned by the beam 7 emitted from the electron beam source 1. The second neutral axis adjusting section 82 causes the holder tilt control section 5b to adjust the attitude of the object 9 in the direction of the second neutral axis including the in-plane tilt axis to adjust the incident angle of the beam 7 relative to the object 9 so that a second stereoscopic image of the object 9 can be formed.

The first image detecting section 86 receives the first stereoscopic image of the object 9 formed by the electron beam device 10 using the image forming section 84 when the incident angle is adjusted by the first neutral axis adjusting section 81. The second image detecting section 88 receives the second stereoscopic image of the object 9 formed by the electron beam device 10 using the image forming section 84 when the incident angle is adjusted by the second neutral axis adjusting section 82.

Figure 25A:
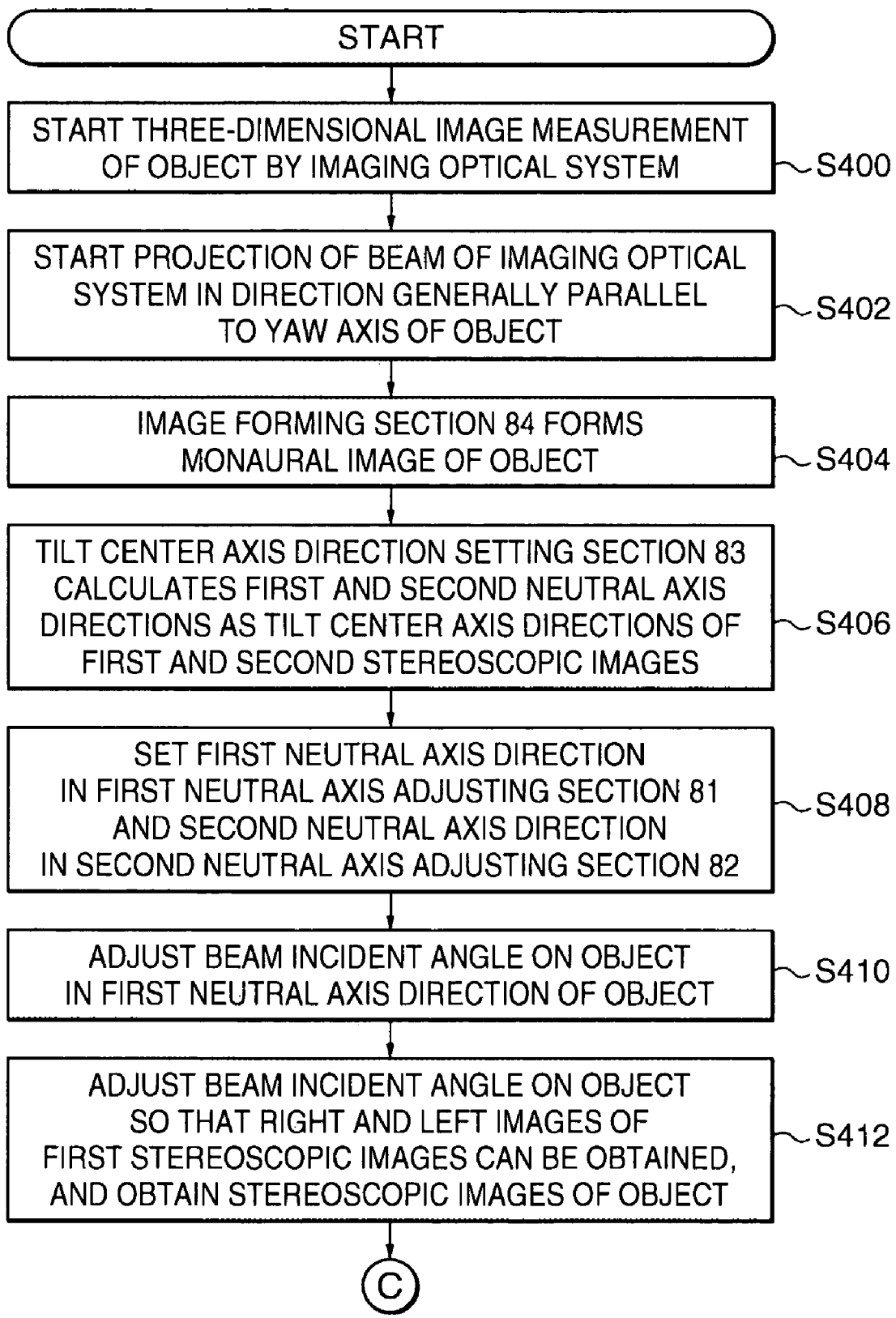
FIGS. 25A and 25B are flowcharts for explaining the operation of the apparatus of the third embodiment.
Figure 25B:
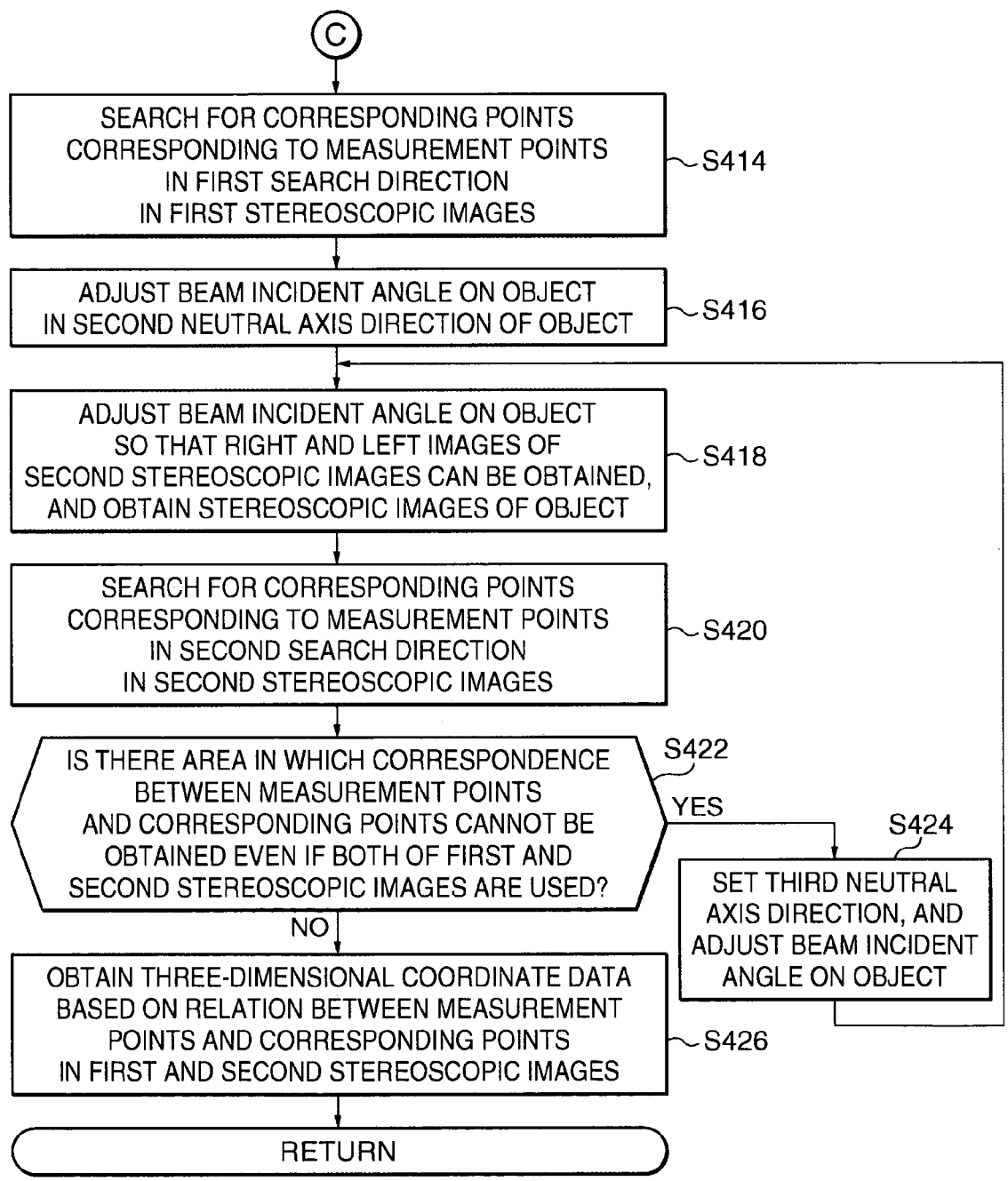

Description will be made of the operation of the apparatus constituted as described above. FIG. 25 is a flowchart for explaining the operation of the apparatus of the third embodiment. Three dimensional image measurement of the object 9 by the electron beam device 10 as an imaging optical system is started (S400). Then, projection of the beam 7 of the electron beam device 10 in a direction generally parallel to the yaw axis of the object 9 is started (S402). The image forming section 84 forms a monaural image of the object 9 (S404). Using the formed monaural image of the object 9, the neutral axis direction setting section 83 calculates the directions to be the neutral axis directions necessary to form the first and second stereoscopic images, taking the information on the line segments in directions which cannot be detected by the anisotropic shape measurement into account (S406). The neutral axis direction setting section 83 sets the first neutral axis direction in the first neutral axis adjusting section 81 and the second neutral axis direction in the second neutral axis adjusting section 82 (S408).

The first neutral axis adjusting section 81 sends an attitude control signal to the holder tilt control section 5b to adjust the attitude of the object 9 in the first neutral axis direction (S410). The first neutral axis adjusting section 81 adjusts the incident angle of the beam 7 relative to the object 9 so that a left image of a first stereoscopic image can be obtained, and the image forming section 84 forms an image of the object (S412). The first neutral axis adjusting section 81 adjusts the incident angle of the beam 7 relative to the object 9 so that a right image of the first stereoscopic image can be obtained, and the image forming section 84 forms an image of the object. The matching process section 90 searches for corresponding points corresponding to measurement points in a first search direction generally perpendicular to the first neutral axis in the first stereoscopic image (S414), and the search result is stored in the measurement point/corresponding point database 92, for example.

Then, the second neutral axis adjusting section 82 sends an attitude control signal to the holder tilt control section 5b to adjust the attitude of the object 9 in the second neutral axis direction (S416). The second neutral axis adjusting section 82 adjusts the incident angle of the beam 7 relative to the object 9 so that a left image of a second stereoscopic image can be obtained, and the image forming section 84 forms an image of the object (S418). The second neutral axis adjusting section 82 then adjusts the incident angle of the beam 7 relative to the object 9 so that a right image of the second stereoscopic image can be obtained, and the image forming section 84 forms an image of the object. The matching process section 90 searches for corresponding points corresponding to measurement points in a second search direction generally perpendicular to the second neutral axis (S420), and the search result is stored in the measurement point/corresponding point database 92, for example.

Then, it is judged whether there is an area in which correspondence between measurement points and corresponding points cannot be obtained even when the first and second stereoscopic images are used (S422). When it is determined in S422 that there remains an area in which correspondence between measurement points and corresponding points cannot be obtained, the neutral axis direction setting section 83 sets a third neutral axis direction to adjust the incident angle of the beam 7 relative to the object 9 so that correspondence between measurement points and corresponding points can be obtained in the remaining area (S424). Then, the process is returned to S418. The object is adjusted in the third neutral axis direction instead of the second neutral axis direction, and matching process is performed on the stereoscopic images. When it is determined in S422 that correspondence between measurement points and corresponding points is obtained in every area, the shape measuring section 93 obtains three-dimensional coordinate data of the object from a synthesized image 91 based on the measurement points and corresponding points in the first and second stereoscopic images (S426). The thus obtained three-dimensional coordinate data are stored in the three-dimensional coordinate database 94. The three-dimensional image measurement of the object 9 using the synthesized image 91 is thereby completed, and the process is returned.

Fourth Embodiment

Figure 26:
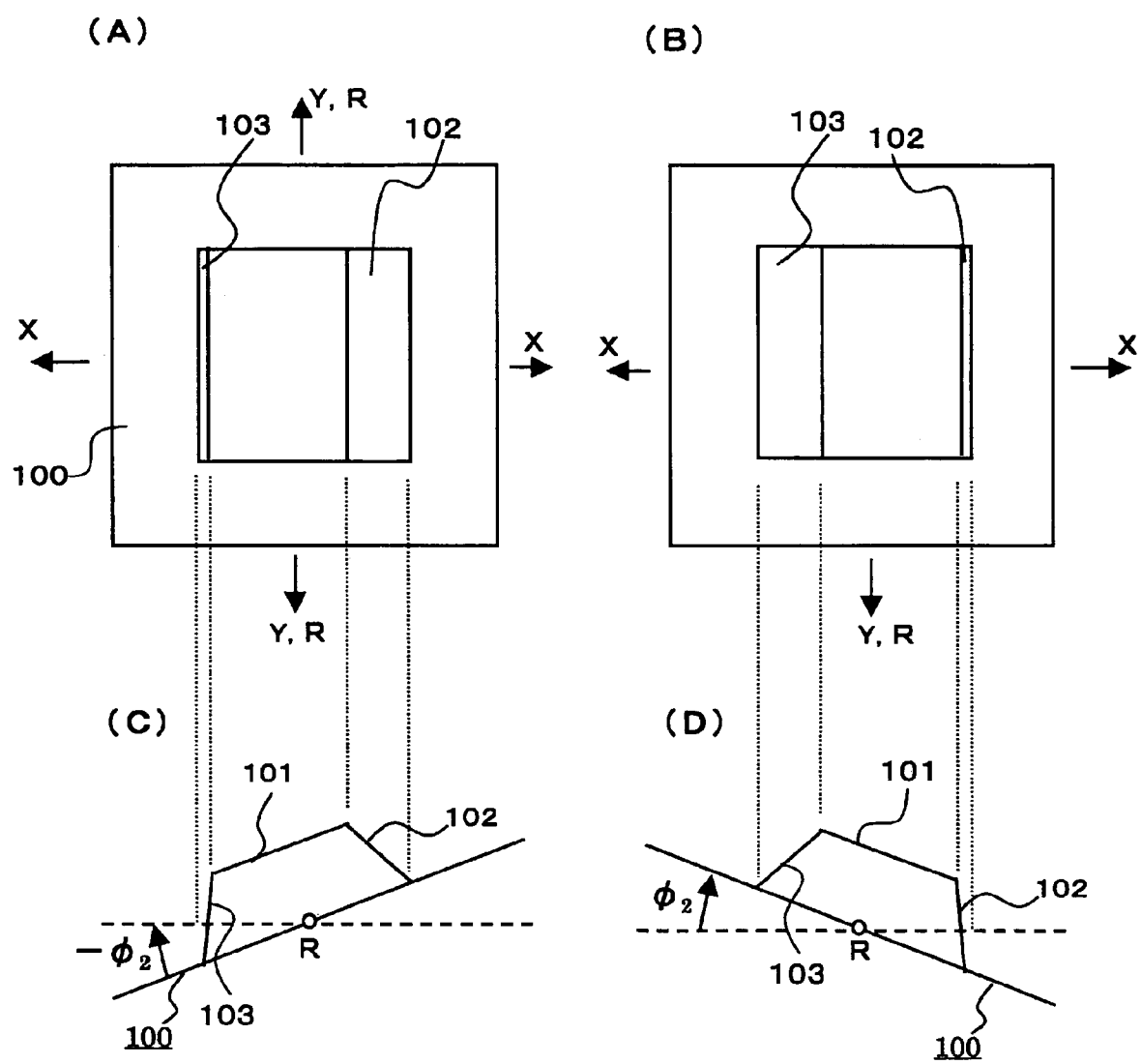
FIG. 26 is an explanatory view of three-dimensional image measurement of an object having an uneven surface with steep slopes.

Even when the object has an uneven surface with steep slopes, three-dimensional image measurement can be performed accurately by applying a modified third embodiment. FIG. 26 is an explanatory view of three-dimensional image measurement of an object having an uneven surface with steep slopes, wherein (A) is a plan view of the object tilted by an angle of −Φ about the holder rotation axis R, (B) is a plan view of the object tilted by an angle of Φ about the holder rotation axis R, (C) is a side view of the object, taken along the line X-X, tilted by an angle of −Φ about the holder rotation axis R, and (D) is a side view of the object, taken along the line X-X, tilted by an angle of Φ about the holder rotation axis R.

An object 100 has a top surface 101 raised along the line X-X, and slopes 102 and 103 extending in the Y-axis direction. To form a stereoscopic image, a holder rotation axis R is provided in the Y-axis direction and right and left images are photographed with the object 100 tilted by angles of ±Φ about the holder rotation axis R. Since the slopes 102 and 103 are so steep the slopes 102 and 103 are included in one of the right and left images of the stereoscopic image. Thus, when an object has a projection or depression with a steep slope due to unevenness on the surface, it is difficult to make three-dimensional image measurement of the shapes of the slopes 102 and 103 accurately.

Figure 27:
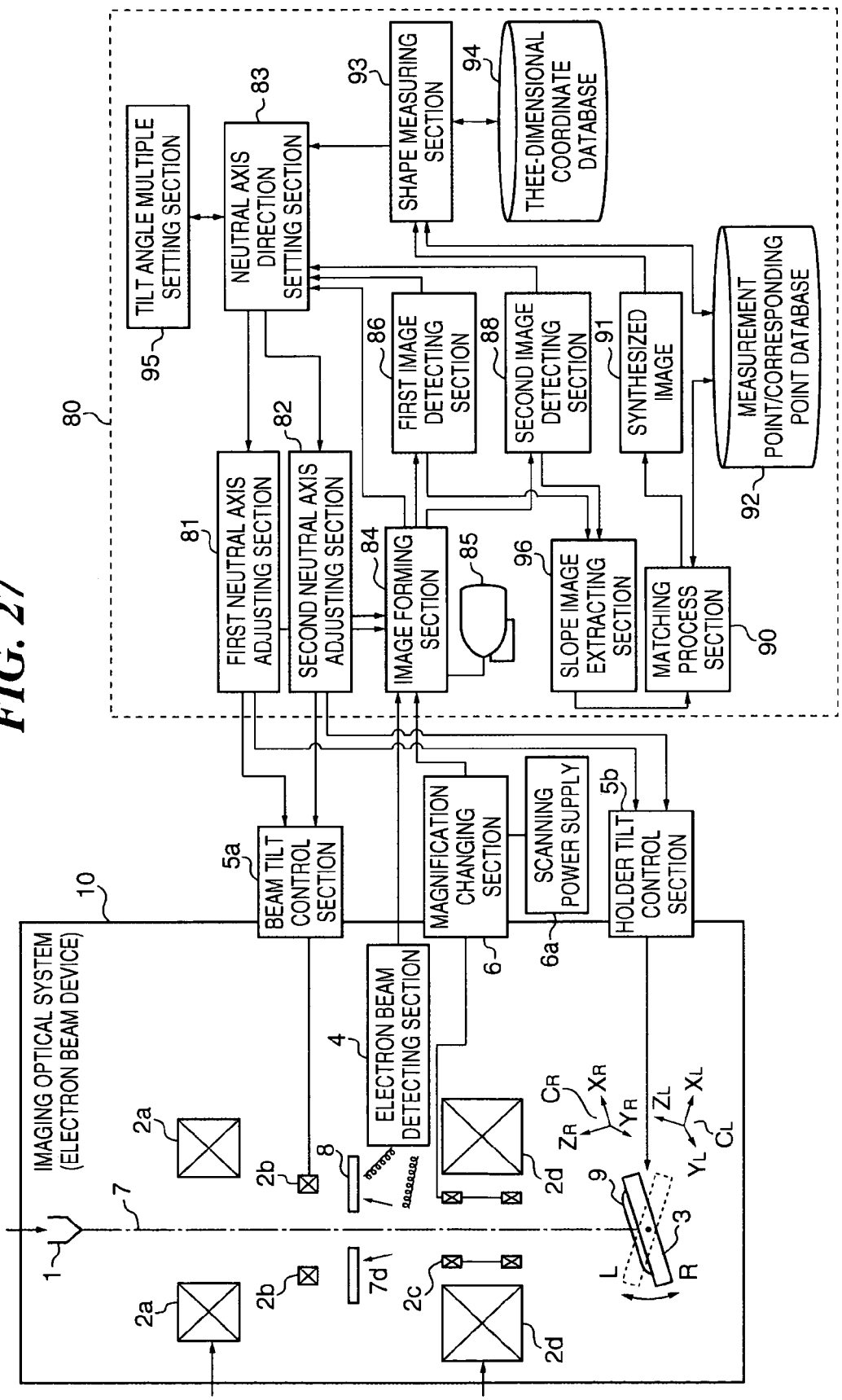
FIG. 27 is a block diagram illustrating the entire structure of the fourth embodiment of this invention.

FIG. 27 is a block diagram illustrating the entire structure of the fourth embodiment of this invention. Component elements having the same function as those in FIG. 25 are denoted by the same reference numerals in FIG. 27, and their description will not be repeated here. As shown in the drawing, the data processing device 80 has a tilt angle multiple setting section 95 and a slope image extracting section 96 in addition to the component elements in the third embodiment. To measure the shapes of slopes on the object 100, the tilt angle multiple setting section 95 sets a multiplicity of tilt angles Φ in the directions to be the neutral axis directions necessary to form first and second stereoscopic images calculated in the neutral axis direction setting section 83 about the holder rotation axis R, depending upon the tilt directions of the slopes 102 and 103. The angles Φ are determined based on the shapes of the slopes on the object 100. The slope image extracting section 96 extracts images including the images of the slopes suitable for three-dimensional shape measurement from images photographed at tilt angles Φ about the holder rotation axis R set in the tilt angle multiple setting section 95 and stored in the first image detecting section 86 or the second image detecting section 88. The images extracted by the slope image extracting section 96 are processed and converted into a synthesized image 91 in the matching process section 90.

Figure 28:
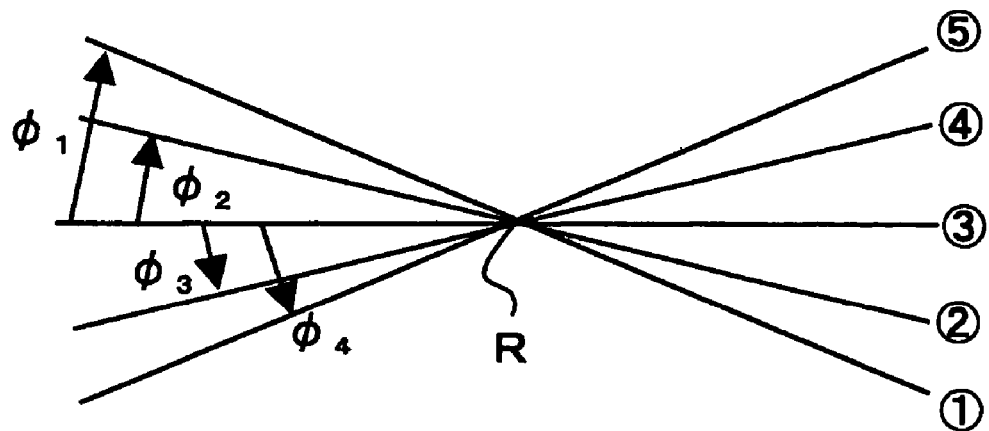
FIG. 28 is a view illustrating the procedure for measuring the shapes of slopes on a surface of an object accurately.

FIG. 28 is a view for explaining the procedure for measuring the shapes of the slopes on a surface of the object accurately. In forming a stereoscopic image, the tilt angle multiple setting section 95 sets a multiplicity of tilt angles Φ1, Φ2, Φ3, and Φ4 of the object 100 about the holder rotation axis R. Then, the first and second neutral axis adjusting sections 81 and 82 tilt the object 100, and the electron beam device 10 photographs a plurality of pairs of right and left images of the object 100. Since images are photographed at a plurality of tilt angles Φ about the holder rotation axis R, there are pairs of stereo images both of which include the images of slopes 102 and 103. The slope image extracting section 96 can extract images including the images of the slopes suitable for three-dimensional shape measurement from images stored in the first image detecting section 86 or the second image detecting section 88, and can determine pairs of right and left images to form stereoscopic images.

Figure 29A:
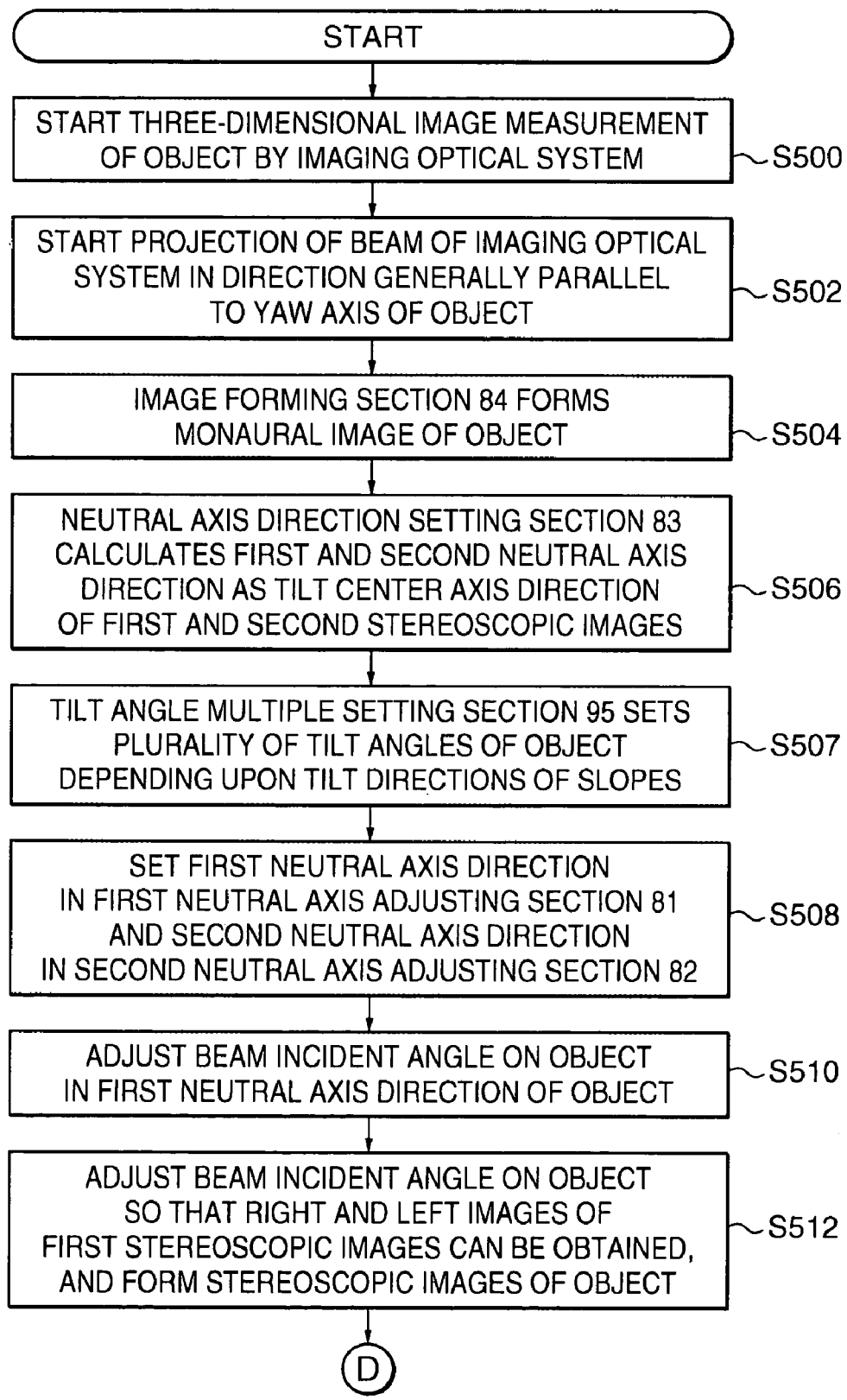
FIGS. 29A and 29B are flowcharts for explaining the operation of the apparatus of a fourth embodiment.
Figure 29B:
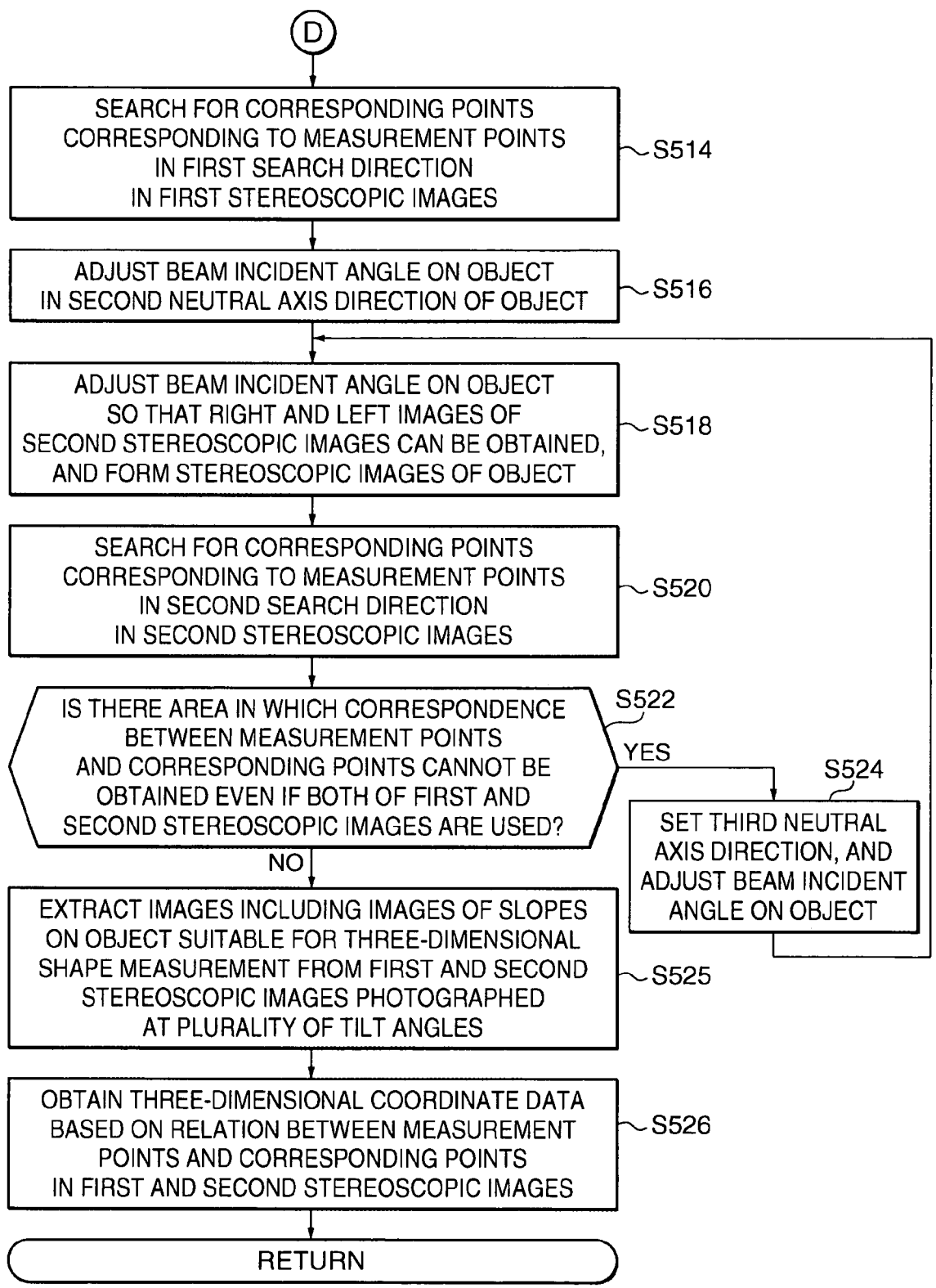

Description will be made of the operation of the apparatus constituted as described above. FIG. 29 is a flowchart for explaining the operation of the apparatus of the fourth embodiment. Three-dimensional image measurement of the object 100 by the electron beam device 10 as an imaging optical system is started (S500). Then, projection of the beam 7 of the electron beam device 10 in a direction generally parallel to the yaw axis of the object 100 is started (S502). The image forming section 84 forms a monaural image of the object 100 (S504). Using the formed monaural image of the object 100, the neutral axis direction setting section 83 calculates the directions to be the neutral axis directions necessary to form the first and second stereoscopic images, taking the information on the line segments in directions which cannot be detected by the anisotropic shape measurement into account (S506). The tilt angle multiple setting section 95 sets a multiplicity of tilt angles of the object 100 in at least one of the first and second neutral axis directions, depending upon the tilt directions of the slopes on the object 100 (S507). The neutral axis direction setting section 83 sets the first neutral axis direction in the first neutral axis adjusting section 81 and the second neutral axis direction in the second neutral axis adjusting section 82 (S508). At this time, when a multiplicity of tilt angles of the object 100 have been set by the tilt angle multiple setting section 95, the information on the multiple tilt angles is also set in the first neutral axis adjusting section 81 or the second neutral axis adjusting section 82.

The first neutral axis adjusting section 81 adjusts the attitude of the object 100 in the first neutral axis direction of the object 100 (S510). The incident angle of the beam 7 relative to the object 100 is adjusted so that left images of first stereoscopic images can be obtained, and the image forming section 84 forms images of the object (S512). The incident angle of the beam 7 relative to the object 100 is adjusted so that right images of the first stereoscopic images can be obtained, and the image forming section 84 forms images of the object. The matching process section 90 searches for corresponding points corresponding to measurement points in a first search direction generally perpendicular to the first neutral axis in the first stereoscopic images (S514), and the search result is stored in the measurement point/corresponding point database 92, for example.

The second neutral axis adjusting section 82 adjusts the attitude of the object 100 in the second neutral axis direction of the object 100 (S516). The incident angle of the beam 7 relative to the object 100 is adjusted so that left images of second stereoscopic images can be obtained, and the image forming section 84 forms images of the object (S518). The incident angle of the beam 7 relative to the object 100 is adjusted so that right images of the second stereoscopic images can be obtained, and the image forming section 84 forms images of the object. The matching process section 90 searches for corresponding points corresponding to measurement points in a second search direction generally perpendicular to the second neutral axis in the second stereoscopic images (S520), and the search result is stored in the measurement point/corresponding point database 92, for example.

Then, it is judged whether there is an area in which correspondence between measurement points and corresponding points cannot be obtained even when the first and second stereoscopic images are used (S522). When it is determined in S522 that there remains an area in which correspondence between measurement points and corresponding points cannot be obtained, the neutral axis direction setting section 83 sets a third neutral axis direction to adjust the incident angle of the beam 7 relative to the object 100 so that correspondence between measurement points and corresponding points can be obtained in the remaining area (S524). Then, the process is returned to S518. The object is adjusted in the third neutral axis direction instead of the second neutral axis direction, and matching process is performed on the stereoscopic images. When it is determined in S522 that correspondence between measurement points and corresponding points is obtained in every area, the slope image extracting section 96 extracts images including the images of the slopes on the object 100 suitable for three-dimensional shape measurement from the first and second stereoscopic images photographed at the multiplicity of tilt angles (S525). Based on the measurement points and corresponding points in the first and second stereoscopic images including the images of the slopes extracted in S525, the shape measuring section 93 obtains three-dimensional coordinate data of the object from a synthesized image 91 (S526). The thus obtained three-dimensional coordinate data are stored in the three-dimensional coordinate database 94. The three-dimensional image measurement of the object 100 using the synthesized image 91 is thereby completed, and the process is returned.

Figure 30:
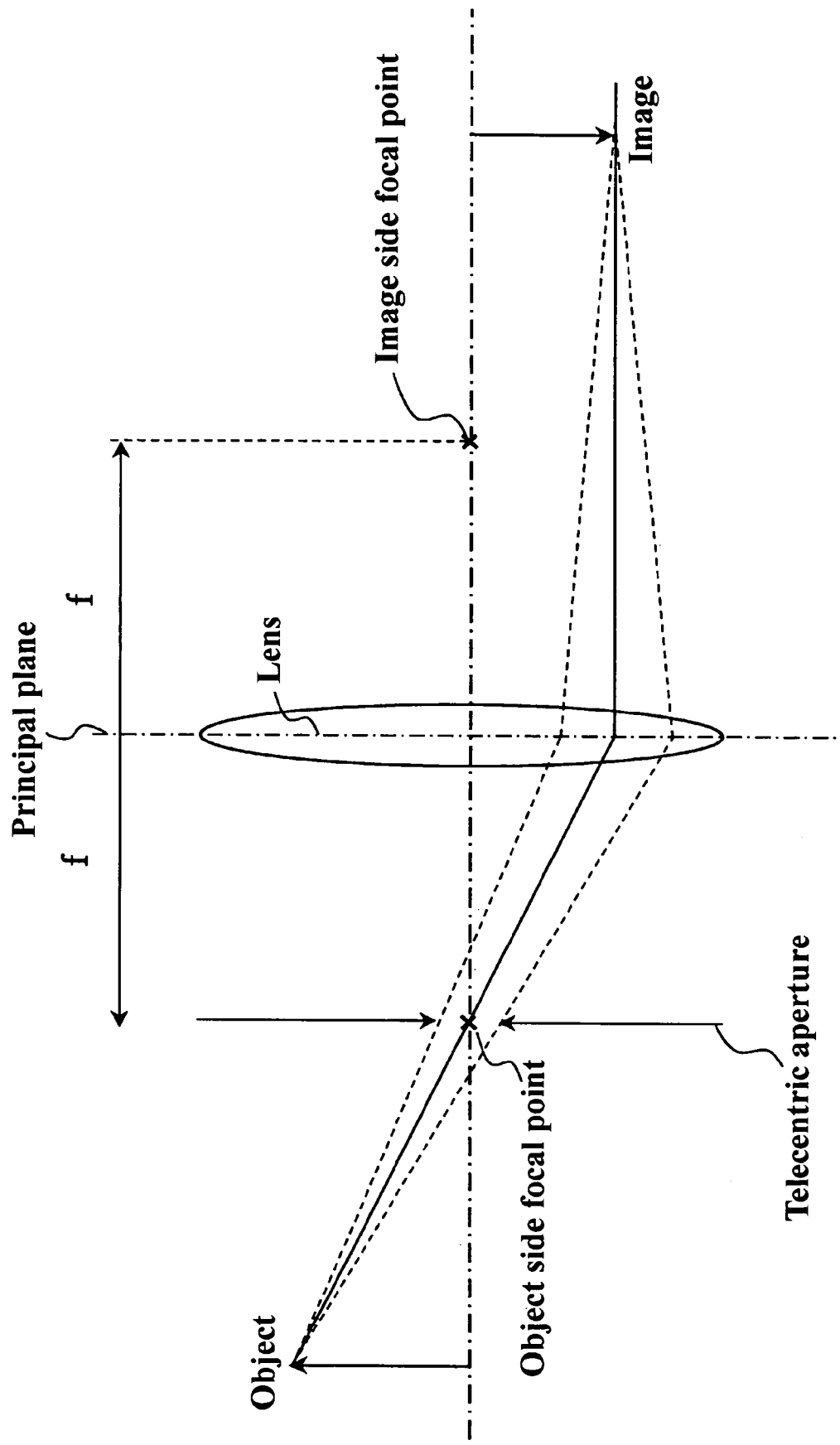
FIG. 30 is a view illustrating the structure of a telecentric system.

Although an electron beam is used as the beam in the first to fourth embodiments, this invention is not limited thereto. The beam may be a luminous flux. In this case, a projection optical system or a reflection optical system is preferably used in place of the electron beam device as an imaging optical system, and the apparatus is applicable, for example, to a chip inspection apparatus using a telecentric system. FIG. 30 is a view illustrating the structure of a telecentric system having telecentricity on the image side. A telecentric system is an optical system in which either an incident pupil or an injection pupil is at infinite distance, and can be realized when an aperture diaphragm (telecentric aperture) is located at the image space focal plane or the object space focal plane, or a position conjugate with them. In a telecentric system, when the telecentric aperture or the incident pupil is located in the vicinity of the object side focal position of a projection lens, the main light beam of the luminous flux which contributes to image formation becomes generally parallel to the optical axis on the image side (so-called image-side telecentricity), and the correct size of the image can be obtained even if the imaging position is deviated from the light receiving surface. Also in a telecentric system, when the telecentric aperture is located in the vicinity of the image side focal position of the projection lens (not shown), the main light beam of the luminous flux which contributes to image formation becomes generally parallel to the optical axis on the object side (so-called object-side telecentricity), it is possible to obtain the same effect as when the object is located in the correct position even if it is not.

Fifth Embodiment

Figure 31:
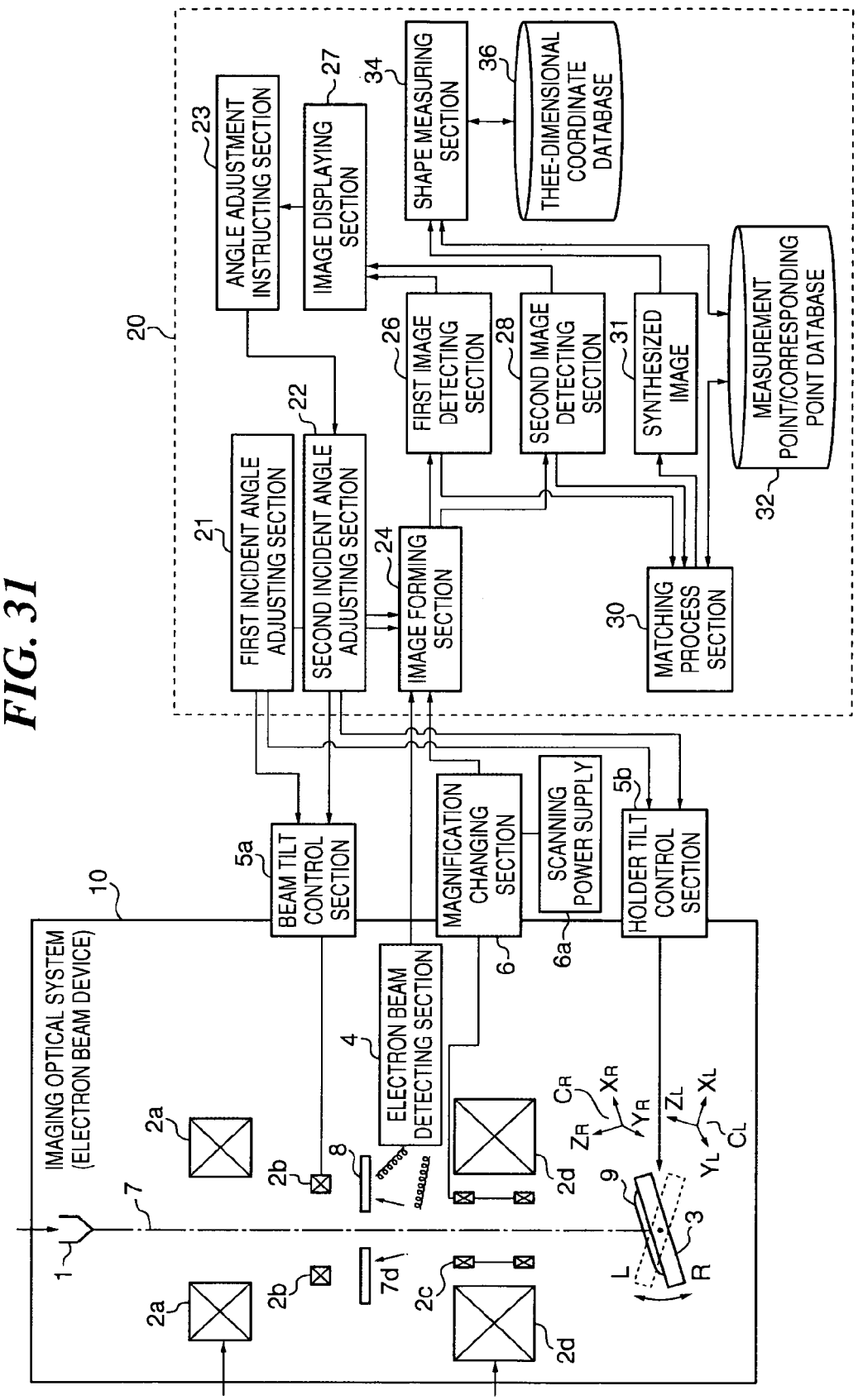
FIG. 31 is a block diagram illustrating the structure of a fifth embodiment of this invention.

FIG. 31 is a block diagram illustrating the structure of the fifth embodiment of this invention. Component elements having the same function as those in FIG. 1 are denoted by the same reference numerals in FIG. 31, and their description will not be repeated here. As show in FIG. 31, a data processing device 20 is similar to the device shown in FIG. 1 in that it has a first incident angle adjusting section 21, a second incident angle adjusting section 22, an image forming section 24, a first image detecting section 26, a second image detecting section 28, a matching process section 30, a measurement point/corresponding point database 32, a shape measuring section 34 and a three-dimensional coordinate database 36, but is different from the device shown in FIG. 1 in that it has an angle adjustment instructing section 23 and an image displaying section 27 in place of the tilt center axis direction setting section 38 and the display device 25.

The image displaying section 27, which displays a first stereoscopic image detected by the first image detecting section 26 and a second stereoscopic image detected by the second image detecting section 28, is a CRT or a liquid crystal panel, for example. The image displaying section 27 may be an ordinary single screen monitor or a monitor which can display in stereo, or have functions of both of them. Namely, the displaying section 27 may be anything as long as it can display the first and second stereoscopic images so that an operator can observe them. The angle adjustment instructing section 23 outputs an instruction signal for instructing the direction in which the incident angle is to be adjusted determined based on a stereoscopic image displayed on the image displaying section 27. The instruction signal is inputted by the operator, for example. The instruction signal for instructing the direction in which the incident angle is to be adjusted is typically determined based on the direction of the second neutral axis necessary to form the second stereoscopic image designated by the operator as a result of observation of the first stereoscopic image. The instruction signal for instructing the direction in which the incident angle is to be adjusted may be determined based on the direction of a second neutral axis necessary to form another second stereoscopic image designated by the operator as a result of observation of the second stereoscopic image of this time.

Figure 32A:
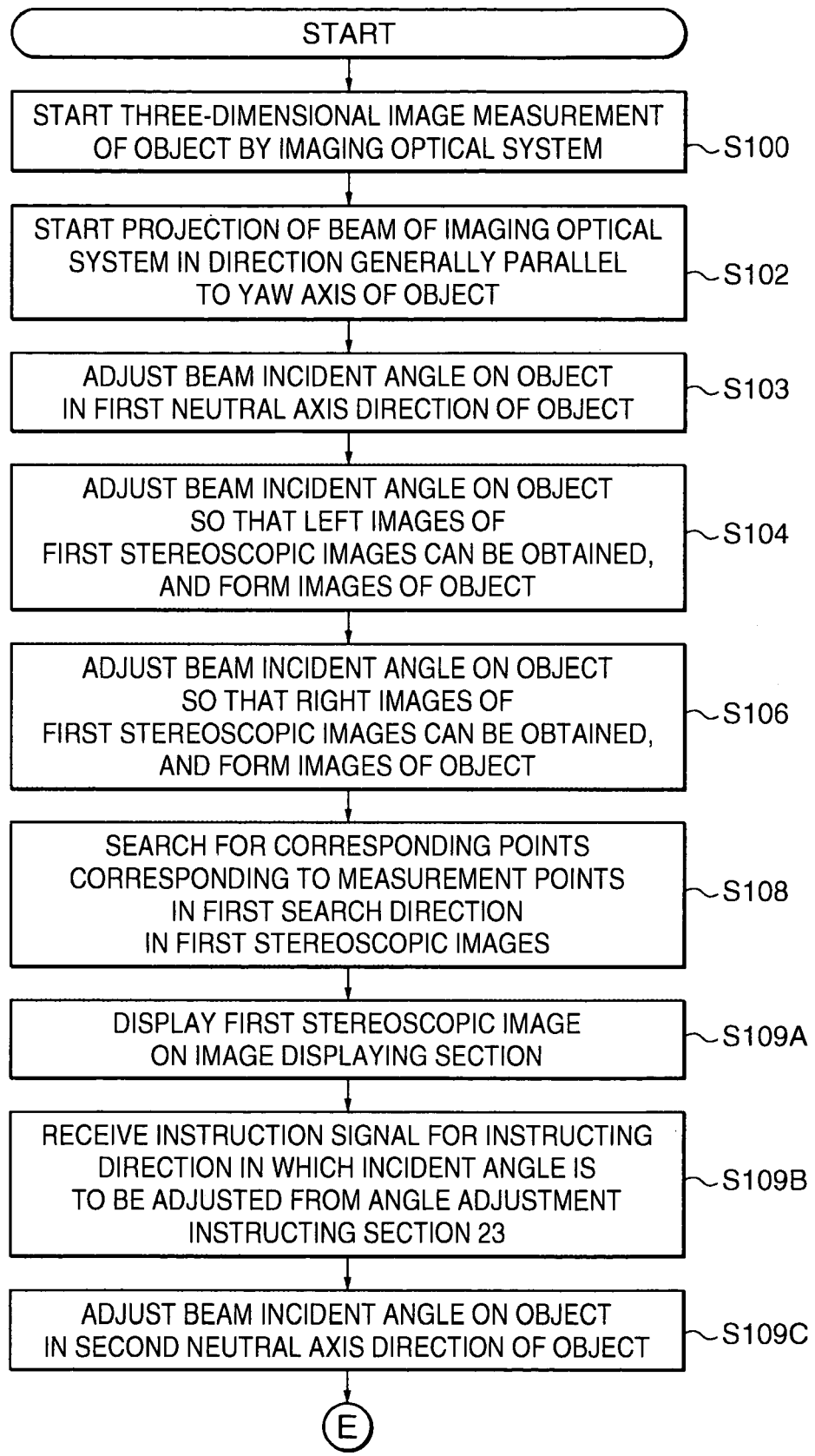
FIGS. 32A and 32B are flowcharts for explaining the operation of the apparatus shown in FIG. 31.
Figure 32B:
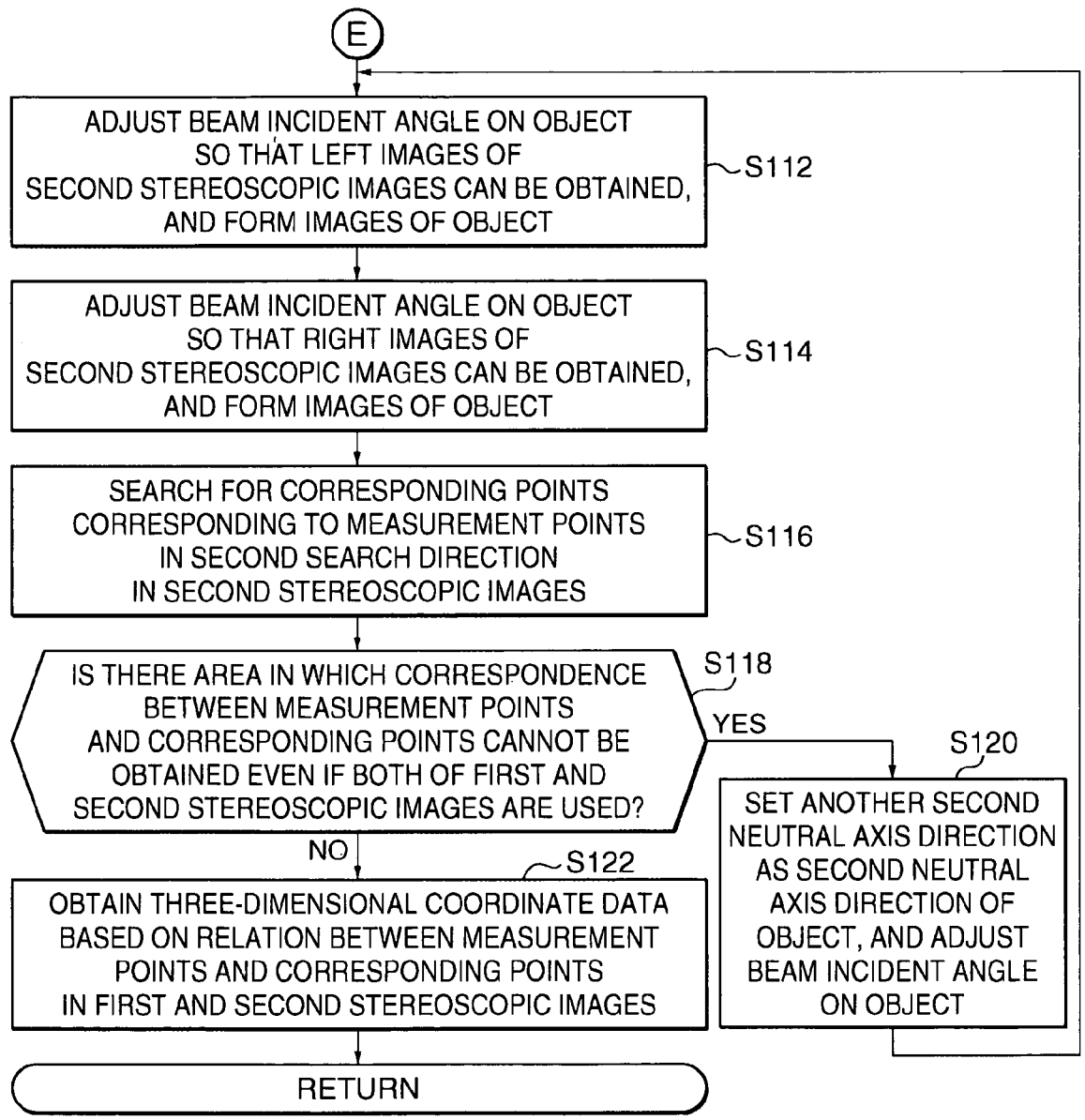

The operation of the apparatus constituted as described above will be described. FIG. 32 is a flowchart for explaining the operation of the apparatus shown in FIG. 31. The steps S100 to S108 in FIG. 31 are the same as the steps S100 to S108 in FIG. 6.

The first image detecting section 26 obtains a first stereoscopic image from the images of the object obtained in S106. The first stereoscopic image is displayed on the image displaying section 27 (S109A). The operator observes the first stereoscopic image and checks the insensitive axis direction of the anisotropic shape measurement. Then, the operator determines a second neutral axis necessary to change the attitude of the object 9 so that the insensitive axis direction can be oriented in a sensitive axis direction. The operator inputs the second neutral axis direction necessary to change the attitude of the object 9 into the angle adjustment instructing section 23. Then, the angle adjustment instructing section 23 outputs an instruction signal for instructing the direction in which the incident angle is to be adjusted corresponding to the inputted second neutral axis direction to the second incident angle adjusting section 22.

The second incident angle adjusting section 22 receives the instruction signal for instructing the direction in which the incident angle is to be adjusted determined based on the displayed stereoscopic image from the angle adjustment instructing section 23 (S109B). The second incident angle adjusting section 22 sends an attitude control signal to the holder tilt control section 5*b* to adjust the attitude of the object 9 in the direction of the second neutral axis according to the instruction signal for instructing the direction in which the incident angle is to be adjusted (S109C). For example, the axis of rotation of the holder 3 on which the object 9 is mounted is adjusted from the first neutral axis direction to the second neutral axis direction.

The steps S112 to S118 in FIG. 31 are the same as S112 to S118 in FIG. 6. When it is determined in S118 that there remains an area in which correspondence between measurement points and corresponding points cannot be obtained, the operator sets the second neutral axis to another direction with the second incident angle adjusting section 22 to change the incident angle of the beam 7 relative to the object 9 so that correspondence between measurement points and corresponding points can be obtained in the remaining area (S120). Then, the process is returned to S112. The operator uses the incident angle adjusting section 22 according to the following procedure, for example. The second image detecting section 28 obtains a second stereoscopic image from the image of the object obtained in S116. The second stereoscopic image is displayed on the image displaying section 27. The operator observes the second stereoscopic images and checks the insensitive axis direction of the anisotropic shape measurement. Then, the operator determines a new second neutral axis necessary to change the attitude of the object 9 so that the insensitive axis direction can be oriented in a sensitive axis direction. The operator inputs the new second neutral axis direction necessary to change the attitude of the object 9 into the angle adjustment instructing section 23. Then, the angle adjustment instructing section 23 outputs an instruction signal for instructing the direction in which the incident angle is to be adjusted corresponding to the inputted second neutral axis direction to the second incident angle adjusting section 22. The second incident angle adjusting section 22 receives the instruction signal for instructing the direction in which the incident angle is to be adjusted determined based on the displayed stereoscopic image from the angle adjustment instructing section 23. The second incident angle adjusting section 22 sends an attitude control signal to the holder tilt control section 5b to adjust the attitude of the object 9 in the direction of the new second neutral axis according to the instruction signal for instructing the direction in which the incident angle is to be adjusted.

When it is determined in S118 that correspondence between measurement points and corresponding points is obtained in every area, the shape measuring section 34 obtains three-dimensional coordinate data of the object from a synthesized image 31 based on the relation between measurement points and corresponding points in the first and second stereoscopic images (S122). The thus obtained three-dimensional coordinate data are stored in the three-dimensional coordinate database 36. The three-dimensional image measurement of the object 9 is thereby completed, and the process is returned.

Figure 33:
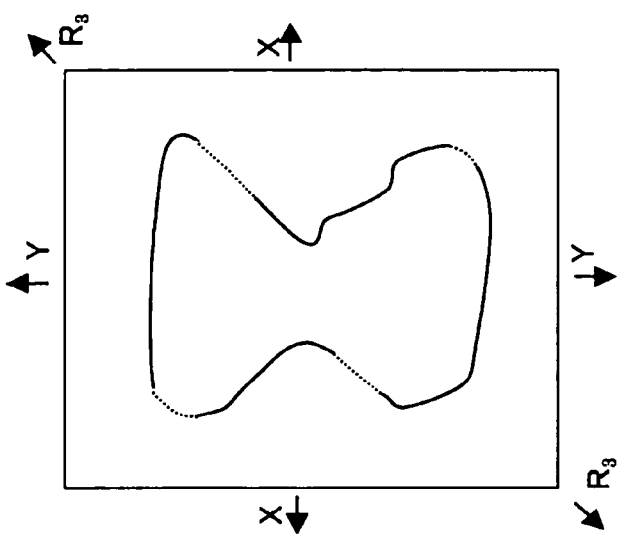
FIG. 33 is a view illustrating the relation between images displayed on an image displaying section and the neutral axis direction in which the attitude of the object is adjusted.
Figure 33:
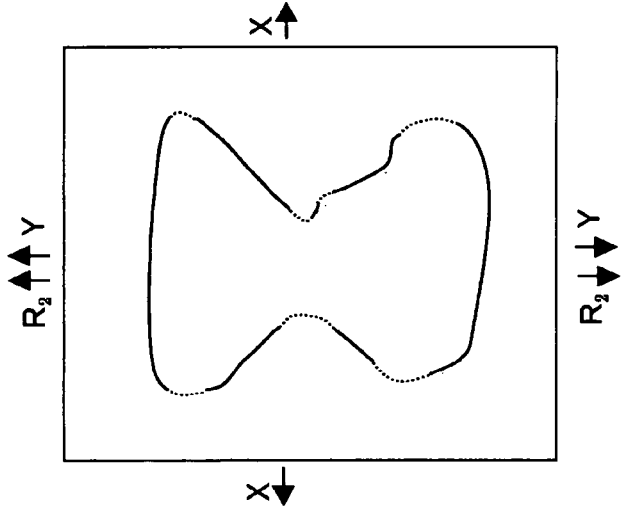
Figure 33:
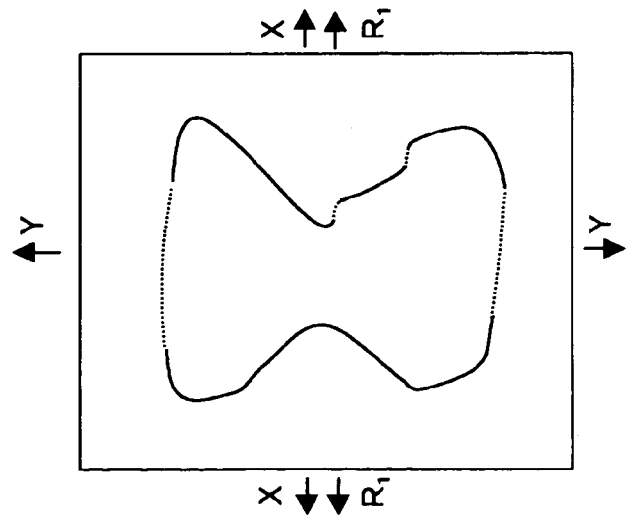

FIG. 33 is a view illustrating the relation between images displayed on the image displaying section and the neutral axis direction in which the attitude of the object is adjusted, wherein (A) is a processed image extracted from a first stereoscopic image obtained using the first neutral axis, (B) is a processed image extracted from a second stereoscopic image obtained using the second neutral axis, and (C) is a processed image extracted from a second stereoscopic image obtained using another second neutral axis. In the case of FIG. 33(A), the object 9 is defined by an XY coordinate system and the first neutral axis is set on the R1-R1 axis which coincides with the X-X axis. Thus, line segments in the first neutral axis direction are not clear in the processed image obtained from the first stereoscopic image.

When the operator designates the R2-R2 axis which coincides with the Y-Y axis as the second neutral axis as shown in FIG. 33(B), the attitude of the object 9 is adjusted in the second neutral axis direction by the angle adjustment instructing section 23 and the second incident angle adjusting section 22. Then, in the processed image obtained from the second stereoscopic image, line segments in the first neutral axis direction are clear but line segments in the second neutral axis direction are not clear.

When the operator designates the R3-R3 axis which is diagonal to the X and Y axis as another second neutral axis as shown in FIG. 33(C), the attitude of the object 9 is adjusted in the direction of the second neutral axis designated this time by the angle adjustment instructing section 23 and the second incident angle adjusting section 22. Then, in the processed image obtained from the second stereoscopic image, line segments in the first and second neutral axis directions are clear but line segments in the direction of the second neutral axis of this time are not clear. However, by synthesizing the three processed images obtained from stereoscopic images, an image in which line segments in every direction are clear can be obtained.

Sixth Embodiment

Figure 34:
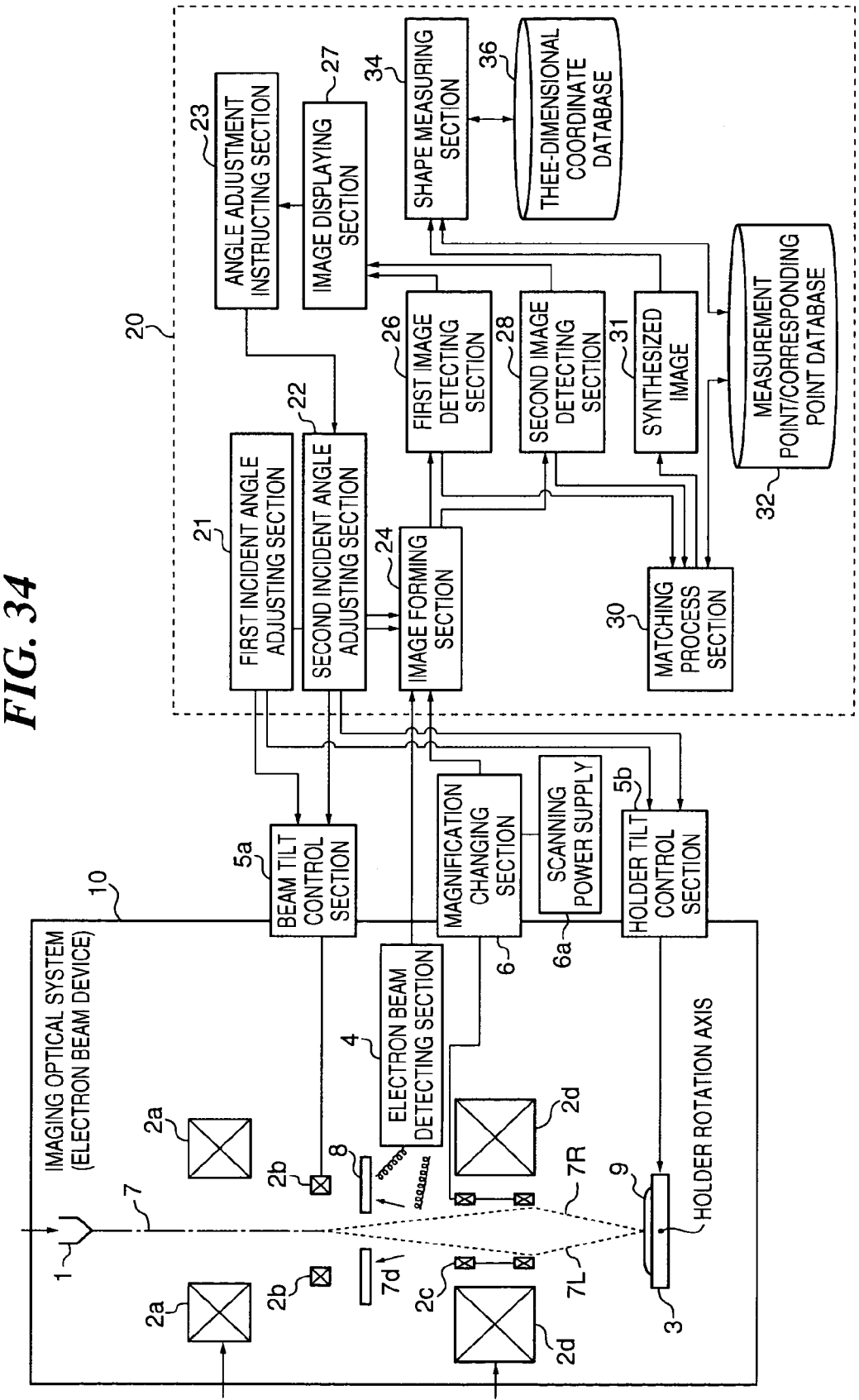
FIG. 34 is a block diagram illustrating the structure of a sixth embodiment of this invention.

FIG. 34 is a block diagram illustrating the structure of the sixth embodiment of this invention. In this embodiment, a stereoscopic image is obtained by not tilting the holder but by deflecting the electron beam of the scanning electron microscope. Component elements which are the same as those in FIG. 1 are denoted by the same reference numerals in FIG. 34, and their description will not be repeated here. Here, a beam tilt control section 5a for controlling the tilt of the electron beam 7 is provided as a tilt control section 5. The beam tilt control section 5a sends a tilt control signal to the deflection lenses 2b so that the incident electron beam 7 is deflected to be an electron beam 7R which makes a first incident angle relative to the sample holder 3 or an electron beam 7L which makes a second incident angle relative to the sample holder 3. The beam tilt control section 5a may be able to adjust the relative tilt between the electron beam 7 and the sample holder 3 to a multiplicity of angles. At least two angles are necessary to obtain data for stereo detection.

When the beam is tilted, there is a beam intersecting axis where the electron beams 7R and 7L intersect as a neutral axis corresponding to the holder rotation axis R as described with the first embodiment. Thus, in setting the first neutral axis necessary to form the first stereoscopic image and the second neutral axis necessary to form the second stereoscopic image, the holder rotation axis R in the description of the first embodiment has to be changed to the beam intersecting axis.

Seventh Embodiment

Description will be made of the seventh embodiment of this invention. In the fifth and sixth embodiments, in setting the second neutral axis from the first neutral axis of the object, an operator observes a first stereoscopic image displayed on the image displaying section 27 to determine the direction of a second neutral axis, and outputs an instruction signal for instructing the direction in which the incident angle is to be adjusted to the second incident angle adjusting section using the angle adjustment instructing section 23. In the seventh embodiment, however, the operation performed by the operator is performed by the three-dimensional coordinate measuring apparatus.

Figure 35:
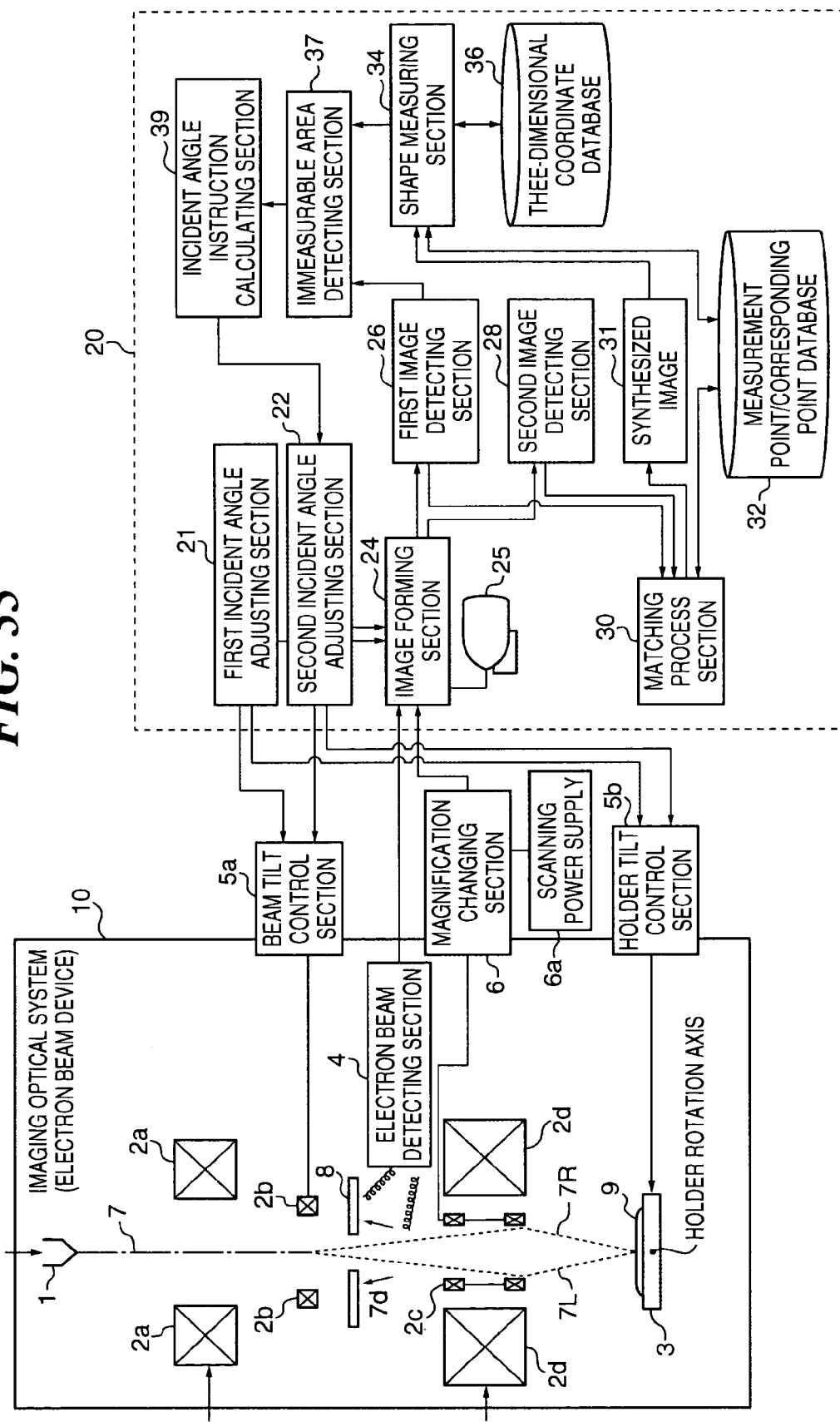
FIG. 35 is a block diagram illustrating the structure of a seventh embodiment of this invention.

FIG. 35 is a block diagram illustrating the structure of the seventh embodiment of this invention. In the seventh embodiment, a stereoscopic image is obtained by adjusting the rotational angle of the holder for holding an object to adjust the tilt angle of the object. In the drawing, the electron beam device 10 (scanning microscope) as an imaging optical system and a data processing device 20 are shown. The data processing device 20 has a first incident angle adjusting section 21, a second incident angle adjusting section 22, an image forming section 24, an image displaying section 25, a first image detecting section 26, a second image detecting section 28, a matching process section 30, a measurement point/corresponding point database 32, a shape measuring section 34, a three-dimensional coordinate database 36, an immeasurable area detecting section 37 and an incident angle instruction calculating section 39. Here, the component elements which have been described in the description of the first embodiment are denoted by the same reference numerals, and their description will not be repeated here. The image displaying section 25 is same as the image displaying section 27 described previously.

The immeasurable area detecting section 37 judges whether there is an area in which the shape measuring section 34 cannot obtain three-dimensional coordinate data in the first stereoscopic image received by the first image detecting section 26. The incident angle instruction calculating section 39 calculates the direction of a second neutral axis so that the shape measuring section 34 can measure three-dimensional coordinate data in the area determined as an immeasurable area by the immeasurable area detecting section 37. The second incident angle adjusting section 22 adjusts the attitude of the object 9 in the direction of the second neutral axis calculated in the incident angle instruction calculating section 39 so that a second stereoscopic image of the object 9 can be formed.

Figure 36A:
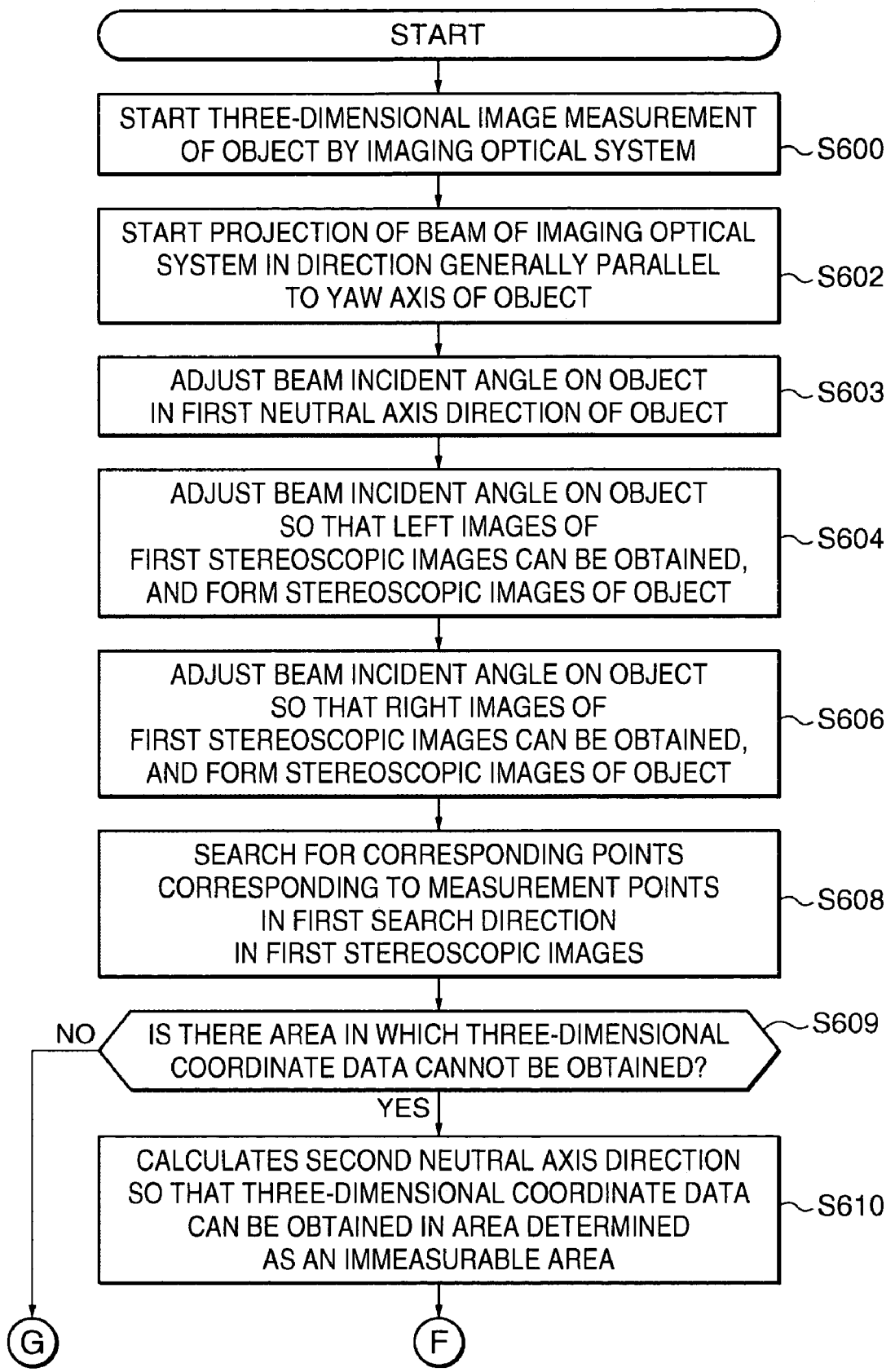
FIGS. 36A and 36B are flowcharts for explaining the operation of the apparatus shown in FIG. 35.
Figure 36B:
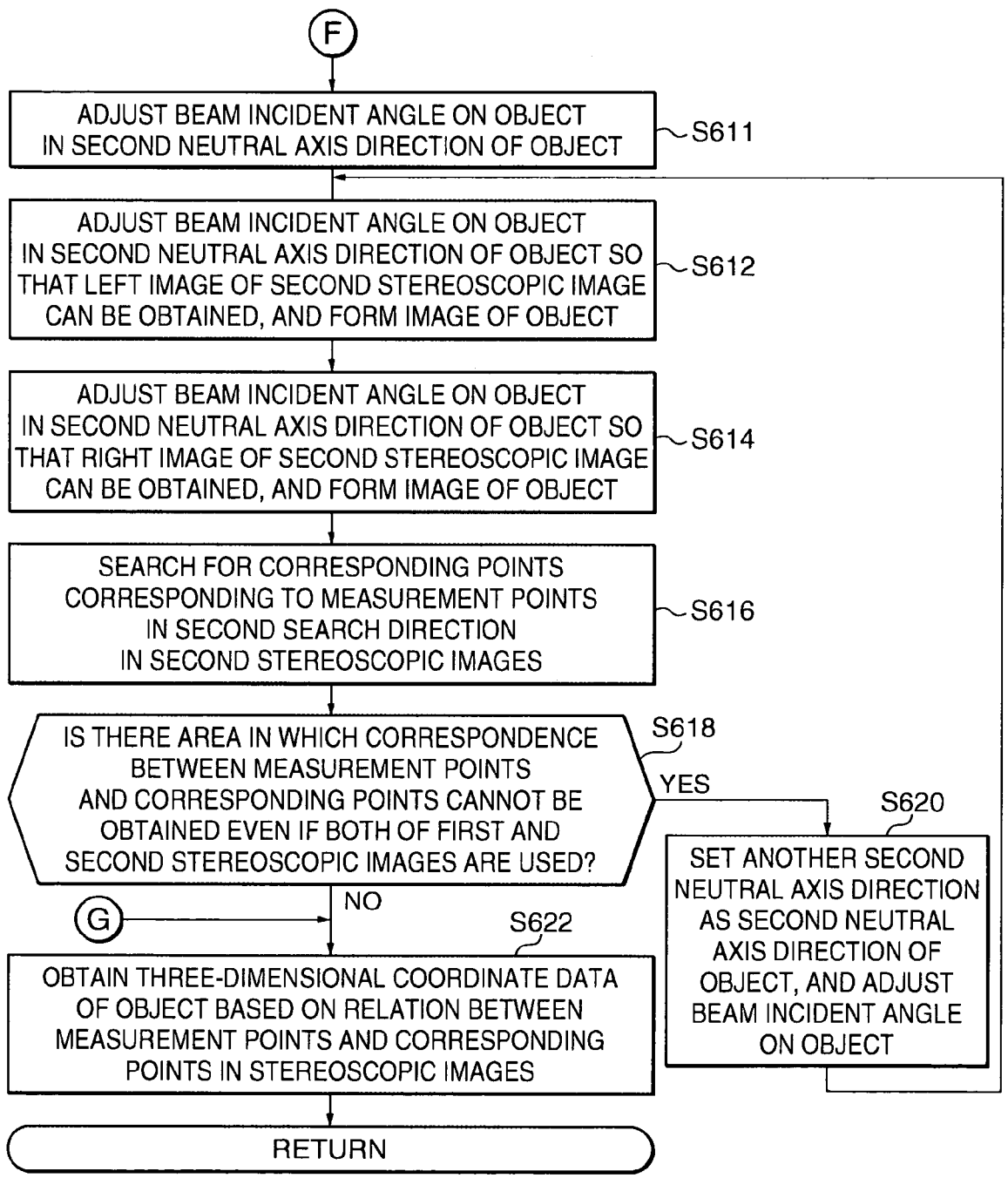

Description will be made of the operation of the apparatus constituted as described above. FIG. 36 is a flowchart for explaining the operation of the apparatus shown in FIG. 35. Three-dimensional image measurement of the object 9 by the electron beam device 10 as an imaging optical system is started (S600). Then, projection of the beam 7 of the electron beam device 10 in a direction generally parallel to the yaw axis of the object 9 is started (S602). The first incident angle adjusting section 21 sends an attitude control signal to the holder tilt control section 5b to adjust the attitude of the object 9 in the first neutral axis direction (S603). The first incident angle adjusting section 21 causes the holder tilt control section 5b to adjust the incident angle of the beam 7 relative to the object 9 so that a left image of a first stereoscopic image can be obtained, and the image forming section 24 forms an image of the object (S604). The first incident angle adjusting section 21 causes the holder tilt control section 5b to adjust the incident angle of the beam 7 relative to the object 9 so that a right image of the first stereoscopic image can be obtained, and the image forming section 24 forms an image of the object (S606). The matching process section 30 searches for corresponding points corresponding to measurement points in a first search direction generally perpendicular to the first neutral axis in the first stereoscopic image (S608), and the search result is stored in the measurement point/corresponding point database 32, for example.

The immeasurable area detecting section 37 judges whether there is an area in which the shape measuring section 34 cannot obtain three-dimensional coordinate data in the first stereoscopic image received by the first image detecting section 26 (S609). The incident angle instruction calculating section 39 calculates a second neutral axis direction so that the shape measuring section 34 can measure three-dimensional coordinate data in the area determined as an immeasurable area by the immeasurable area detecting section 37, and the second incident angle adjusting section 22 adjusts the attitude of the object 9 in the second neutral axis direction calculated in the incident angle instruction calculating section 39 so that a second stereoscopic image of the object 9 can be formed (S610). When there is no area determined as an immeasurable area by the immeasurable area detecting section 37 in S609, the process jumps to S622.

The second incident angle adjusting section 22 causes the holder tilt control section 5b to adjust the incident angle of the beam 7 relative to the object 9 so that a left image of a second stereoscopic image can be obtained, and the image forming section 24 forms an image of the object (S612). The second incident angle adjusting section 22 causes the holder tilt control section 5b to adjust the incident angle of the beam 7 relative to the object 9 so that a right image of the second stereoscopic image can be obtained, and the image forming section 24 forms an image of the object (S614). The matching process section 30 searches for corresponding points corresponding to measurement points in a second search direction generally perpendicular to the second neutral axis in the second stereoscopic image (S616), and the search result is stored in the measurement point/corresponding point database 32, for example.

The shape measuring section 34 judges whether there is an area in which correspondence between measurement points and corresponding points cannot be obtained even if the first and second stereoscopic images are used (S618). When it is determined in S618 that there remains an area in which correspondence between measurement points and corresponding points cannot be obtained, the immeasurable area detecting section 37, the incident angle instruction calculating section 39 and the second incident angle adjusting section 22 set the second neutral axis to another direction to change the incident angle of the beam 7 relative to the object 9 so that correspondence between measurement points and corresponding points can be obtained in the remaining area (S620). Then, the process is returned to S612.

When it is determined in S618 that correspondence between measurement points and corresponding points is obtained in every area, the shape measuring section 34 obtains three-dimensional coordinate data of the object from a synthesized image 31 based on the relation between the measurement points and the corresponding points in the first and second stereoscopic images (S622). The thus obtained three-dimensional coordinate data are stored in the three-dimensional coordinate database 36. The three-dimensional image measurement of the object 9 is thereby completed, and the process is returned.

Although an electron beam is used as the beam in the fifth to seventh embodiments, this invention is not limited thereto. The beam may be a luminous flux. In this case, a projection optical system or a reflection optical system is preferably used in place of the electron beam device as the imaging optical system, and the apparatus is applicable, for example, to a chip inspection apparatus using a telecentric system as shown in FIG. 30.

EFFECT OF THE INVENTION

As has been described previously, the three-dimensional coordinate measuring apparatus of this invention does not show significant differences in measurement accuracy depending upon the measurement direction even in three-dimensional shape measurement using anisotropic shape measurement in which measuring accuracy varies depending upon the measurement direction within a surface of an object. Also, the three-dimensional coordinate measuring apparatus according to the fourth embodiment of this invention can measure the dimensions of rises and falls in the out-of plane directions on a surface of an object.

Further, the three-dimensional coordinate measuring apparatus of this invention does not show significant differences in measurement accuracy depending upon the measurement direction even in three-dimensional shape measurement of an object using anisotropic shape measurement in which measuring accuracy varies depending upon the measurement direction within a surface of the object since an operator can observe a first stereoscopic image obtained using a first neutral axis set in advance and properly determine the direction in which the incident angle is to be adjusted as a second neutral axis direction.

What is claimed is:

1. A three-dimensional coordinate measuring apparatus comprising:
   an imaging optical system for projecting a beam in a direction generally parallel to a yaw axis of an object to form an image of the object;
   a first incident angle adjusting section for adjusting an attitude of the object in a direction of a first neutral axis to adjust an incident angle of the beam relative to the object so that a first stereoscopic image of the object can be formed;
   a first image detecting section for receiving the first stereoscopic image of the object formed by the imaging optical system with the incident angle adjusted by the first incident angle adjusting section;
   a second incident angle adjusting section for adjusting the attitude of the object in a direction of a second neutral axis including an in-plane tilt axis to adjust the incident angle of the beam relative to the object so that a second stereoscopic image of the object can be formed;
   a second image detecting section for receiving the second stereoscopic image of the object formed by the imaging optical system with the incident angle adjusted by the second incident angle adjusting section;
   a matching process section for searching for corresponding points corresponding to measurement points in a first search direction generally perpendicular to the first neutral axis in the first stereoscopic image and searching for corresponding points corresponding to measurement points in a second search direction generally perpendicular to the second neutral axis in the second stereoscopic image; and
   a shape measuring section for obtaining three-dimensional coordinate data of the object based on relation between the measurement points and the corresponding points in the first and second stereoscopic images.

2. The three-dimensional coordinate measuring apparatus as claimed in claim 1, wherein the second incident angle adjusting section adjusts the attitude of the object in a direction of a second neutral axis formed in a plane determined by the in-plane tilt axis and the first neutral axis and extending in a direction different from that of the first neutral axis.

3. The three-dimensional coordinate measuring apparatus as claimed in claim 2, wherein the second incident angle adjusting section adjusts the attitude of the object in a direction of a second neutral axis extending in the direction of the in-plane tilt axis.

4. The three-dimensional coordinate measuring apparatus as claimed in claim 1, further comprising a tilt center axis direction setting section for extracting linear image components included in an image formed by the imaging optical system or the first image detecting section and calculating directions to be tilt center axis directions of the first and second stereoscopic images.

5. The three-dimensional coordinate measuring apparatus as claimed in claim 1, incorporated in a scanning electron microscope, wherein the imaging optical system comprises an electronic lens section and the first and second incident angle adjusting sections comprise deflector control units for sending a control signal to a deflector for deflecting an electron beam emitted from an electron gun.

6. The three-dimensional coordinate measuring apparatus as claimed in claim 1, incorporated in a scanning electron microscope, wherein the imaging optical system comprises a telecentric system and the first and second incident angle adjusting sections comprise deflector control units for sending a control signal to a deflector for deflecting an electron beam emitted from an electron gun.

7. A three-dimensional coordinate measuring method that makes a computer perform the steps of:
   causing a first incident angle adjusting section to adjust an attitude of an object in a direction of a first neutral axis;
   adjusting an incident angle of a beam projected from an imaging optical system in a direction generally parallel to a yaw axis of the object relative to the object to form a first stereoscopic image of the object;
   searching for corresponding points corresponding to measurement points in a first search direction generally perpendicular to the first neutral axis in the first stereoscopic image;
   causing a second incident angle adjusting section to adjust the attitude of the object in a direction of a second neutral axis including an in-plane tilt axis of the object;
   adjusting the incident angle of the beam relative to the object to form a second stereoscopic image of the object;
   searching for corresponding points corresponding to measurement points in a second search direction generally perpendicular to the second neutral axis in the second stereoscopic image; and
   obtaining three-dimensional coordinate data of the object based on relation between the measurement points and the corresponding points in the first and second stereoscopic images.

8. A three-dimensional coordinate measuring apparatus comprising:
   an imaging optical system for projecting a beam in a direction generally parallel to a yaw axis of an object to form an image of the object;
   a neutral axis direction setting section for extracting linear image components included in the image of the object formed by the imaging optical system and calculating directions of first and second neutral axis in first and second stereoscopic images of the object;
   a first neutral axis adjusting section for adjusting an attitude of the object in the direction of the first neutral axis to adjust an incident angle of the beam relative to the object so that a first stereoscopic image of the object can be formed;
   a first image detecting section for receiving the first stereoscopic image of the object formed by the imaging optical system with the incident angle adjusted by the first neutral axis adjusting section;
   a second neutral axis adjusting section for adjusting the attitude of the object in a direction of the second neutral axis to adjust the incident angle of the beam relative to the object so that a second stereoscopic image of the object can be formed;
   a second image detecting section for receiving the second stereoscopic image of the object formed by the imaging optical system with the incident angle adjusted by the second neutral axis adjusting section;
   a matching process section for searching for corresponding points corresponding to measurement points in a first search direction generally perpendicular to the first neutral axis in the first stereoscopic image and searching for corresponding points corresponding to measurement points in a second search direction generally perpendicular to the second neutral axis in the second stereoscopic image; and a shape measuring section for obtaining three-dimensional coordinate data of the object based on relation between the measurement points and the corresponding points in the first and second stereoscopic images.

9. The three-dimensional coordinate measuring apparatus as claimed in claim 8, incorporated in a scanning electron microscope, wherein the imaging optical system comprises an electronic lens section and the first and second neutral axis adjusting sections comprise deflector control units for sending a control signal to a deflector for deflecting an electron beam emitted from an electron gun.

10. The three-dimensional coordinate measuring apparatus as claimed in claim 8, incorporated in a scanning electron microscope, wherein the imaging optical system comprises a telecentric system and the first and second neutral axis adjusting sections comprise deflector control units for sending a control signal to a deflector for deflecting an electron beam emitted from an electron gun.

11. A three-dimensional coordinate measuring method that makes a computer perform the steps of:
    extracting linear image components included in an image of an object formed by an imaging optical system and calculating directions of first and second neutral axes in first and second stereoscopic images of the object;
    causing a first neutral axis adjusting section to adjust an attitude of the object in the first neutral axis direction;
    adjusting an incident angle of a beam projected from the imaging optical system in a direction generally parallel to a yaw axis of the object relative to the object to form a first stereoscopic image of the object;
    searching for corresponding points corresponding to measurement points in a first search direction generally perpendicular to the first neutral axis in the first stereoscopic image;
    causing a second neutral axis adjusting section to adjust the attitude of the object in the second neutral axis direction;
    adjusting the incident angle of the beam relative to the object to form a second stereoscopic image of the object;
    searching for corresponding points corresponding to measurement points in a second search direction generally perpendicular to the second neutral axis in the second stereoscopic image; and
    obtaining three-dimensional coordinate data of the object based on relation between the measurement points and the corresponding points in the first and second stereoscopic images.

12. A three-dimensional coordinate measuring apparatus comprising:
    an imaging optical system for projecting a beam in a direction generally parallel to a yaw axis of an object to form an image of the object;
    a neutral axis direction setting section for extracting linear image components included in the image of the object formed by the imaging optical system and calculating directions of first and second neutral axes in first and second stereoscopic images of the object;
    a tilt angle multiple setting section for setting a plurality of tilt angles of the object in at least one of the first and second neutral axis directions depending upon tilt directions of slopes on the object;
    a first neutral axis adjusting section for adjusting an attitude of the object in the direction of the first neutral axis to adjust an incident angle of the beam relative to the object so that first stereoscopic images of the object can be formed from images of the object photographed at one or the plurality of tilt angles of the object;
    a first image detecting section for receiving the first stereoscopic images of the object formed by the imaging optical system with the incident angle adjusted by the first neutral axis adjusting section;
    a second neutral axis adjusting section for adjusting the attitude of the object in the direction of the second neutral axis to adjust the incident angle of the beam relative to the object so that second stereoscopic images of the object can be formed from images of the object photographed at one or the plurality of tilt angles of the object;
    a second image detecting section for receiving the second stereoscopic images of the object formed by the imaging optical system with the incident angle adjusted by the second neutral axis adjusting section;
    a slope image extracting section for extracting images including images of the slopes on the object suitable for three-dimensional shape measurement from the images of the object photographed at the plurality of tilt angles and stored in the first image detecting section and the second image detecting section;
    a matching process section for searching for corresponding points corresponding to measurement points in a first search direction generally perpendicular to the first neutral axis in the first stereoscopic image extracted by the slope image extracting section and searching for corresponding points corresponding to measurement points in a second search direction generally perpendicular to the second neutral axis in the second stereoscopic image extracted by the slope image extracting section; and
    a shape measuring section for obtaining three-dimensional coordinate data of the object based on relation between the measurement points and the corresponding points in the first and second stereoscopic images.

13. The three-dimensional coordinate measuring apparatus as claimed in claim 12, incorporated in a scanning electron microscope, wherein the imaging optical system comprises an electronic lens section and the first and second neutral axis adjusting sections comprise deflector control units for sending a control signal to a deflector for deflecting an electron beam emitted from an electron gun.

14. The three-dimensional coordinate measuring apparatus as claimed in claim 12, incorporated in a scanning electron microscope, wherein the imaging optical system comprises a telecentric system and the first and second neutral axis adjusting sections comprise deflector control units for sending a control signal to a deflector for deflecting an electron beam emitted from an electron gun.

15. A three-dimensional coordinate measuring method that makes a computer perform the steps of:
    extracting linear image components included in an image of an object formed by an imaging optical system and calculating directions of first and second neutral axes in first and second stereoscopic images of the object;
    setting a plurality of tilt angles of the object in at least one of the first and second neutral axis directions depending upon tilt directions of slopes on the object;
    causing a first neutral axis adjusting section to adjust an attitude of the object in the first neutral axis direction;
    adjusting an incident angle of a beam projected from the imaging optical system in a direction generally parallel to a yaw axis of the object relative to the object to form first stereoscopic images of the object;

searching for corresponding points corresponding to measurement points in a first search direction generally perpendicular to the first neutral axis in the first stereoscopic images;

causing a second neutral axis adjusting section to adjust the attitude of the object in the second neutral axis direction;

adjusting the incident angle of the beam relative to the object to form second stereoscopic images of the object;

searching for corresponding points corresponding to measurement points in a second search direction generally perpendicular to the second neutral axis in the second stereoscopic images;

extracting images including images of the slopes on the object suitable for three-dimensional shape measurement from the first and second stereoscopic images of the object photographed at the plurality of tilt angles of the object; and obtaining three-dimensional coordinate data of the object based on relation between the measurement points and the corresponding points in the extracted first and second stereoscopic images including the images of the slopes.

16. A three-dimensional coordinate measuring apparatus comprising:

an imaging optical system for projecting a beam in a direction generally parallel to a yaw axis of an object to form an image of the object;

a first incident angle adjusting section for adjusting an attitude of the object in a direction of a first neutral axis to adjust an incident angle of the beam relative to the object so that a first stereoscopic image of the object can be formed;

a first image detecting section for receiving the first stereoscopic image of the object formed by the imaging optical system with the incident angle adjusted by the first incident angle adjusting section;

an image displaying section for displaying the first stereoscopic image detected by the first image detecting section;

an angle adjustment instructing section for outputting an instruction signal for instructing a direction, in which the incident angle is to be adjusted, determined based on the stereoscopic image displayed on the image displaying section;

a second incident angle adjusting section for adjusting the attitude of the object in a direction of a second neutral axis according to the instruction signal for instructing the direction, in which the incident angle is to be adjusted, to adjust the incident angle of the beam relative to the object so that a second stereoscopic image of the object can be formed;

a second image detecting section for receiving the second stereoscopic image of the object formed by the imaging optical system with the incident angle adjusted by the second incident angle adjusting section;

a matching process section for searching for corresponding points corresponding to measurement points in a first search direction generally perpendicular to the first neutral axis in the first stereoscopic image and searching for corresponding points corresponding to measurement points in a second search direction generally perpendicular to the second neutral axis in the second stereoscopic image; and a shape measuring section for obtaining three-dimensional coordinate data of the object based on relation between the measurement points and the corresponding points in the first and second stereoscopic images.

17. The three-dimensional coordinate measuring apparatus as claimed in claim 16, incorporated in a scanning electron microscope, wherein the imaging optical system comprises an electronic lens section and the first and second incident angle adjusting sections comprise deflector control units for sending a control signal to a deflector for deflecting an electron beam emitted from an electron gun.

18. The three-dimensional coordinate measuring apparatus as claimed in claim 16, incorporated in a scanning electron microscope, wherein the imaging optical system comprises a telecentric system and the first and second incident angle adjusting sections comprise deflector control units for sending a control signal to a deflector for deflecting an electron beam emitted from an electron gun.

19. A three-dimensional coordinate measuring method that makes a computer perform the steps of:

causing a first incident angle adjusting section to adjust an attitude of an object in a direction of a first neutral axis;

adjusting an incident angle of a beam projected from an imaging optical system in a direction generally parallel to a yaw axis of the object relative to the object to form a first stereoscopic image of the object;

searching for corresponding points corresponding to measurement points in a first search direction generally perpendicular to the first neutral axis in the first stereoscopic image;

displaying the first stereoscopic image on an image displaying section;

inputting an instruction signal for instructing a direction, in which the incident angle is to be adjusted, determined based on the displayed stereoscopic image;

causing a second incident angle adjusting section to adjust the attitude of the object in a direction of a second neutral axis according to the instruction signal for instructing the direction, in which the incident angle is to be adjusted;

adjusting the incident angle of the beam relative to the object to form a second stereoscopic image of the object;

searching for corresponding points corresponding to measurement points in a second search direction generally perpendicular to the second neutral axis in the second stereoscopic image; and obtaining three-dimensional coordinate data of the object based on relation between the measurement points and the corresponding points in the first and second stereoscopic images.

20. A three-dimensional coordinate measuring apparatus comprising:

an imaging optical system for projecting a beam in a direction generally parallel to a yaw axis of an object to form an image of the object;

a first incident angle adjusting section for adjusting an attitude of the object in a direction of a first neutral axis so that a first stereoscopic image of the object can be formed;

a first image detecting section for receiving the first stereoscopic image of the object formed by the imaging optical system with an incident angle adjusted by the first incident angle adjusting section;

a shape measuring section for obtaining three-dimensional coordinate data of the object based on relation between measurement points and corresponding points in first and second stereoscopic images;

an immeasurable area detecting section for judging whether there is an area in which the shape measuring section cannot obtain three-dimensional coordinate data in the first stereoscopic image received by the first image detecting section;

an incident angle instruction calculating section for calculating a direction of a second neutral axis such that the shape measuring section can measure three-dimensional coordinate data in the area determined as an immeasurable area by the immeasurable area detecting section;

a second incident angle adjusting section for adjusting the attitude of the object in the direction of the second neutral axis calculated in the incident angle instruction calculating section so that a second stereoscopic image of the object can be formed;

a second image detecting section for receiving the second stereoscopic image of the object formed by the imaging optical system with the incident angle adjusted by the second incident angle adjusting section; and a matching process section for searching for corresponding points corresponding to measurement points in a first search direction generally perpendicular to the first neutral axis in the first stereoscopic image and searching for corresponding points corresponding to measurement points in a second search direction generally perpendicular to the second neutral axis in the second stereoscopic image.

21. The three-dimensional coordinate measuring apparatus as claimed in claim 20, incorporated in a scanning electron microscope, wherein the imaging optical system comprises an electronic lens section and the first and second incident angle adjusting sections comprise deflector control units for sending a control signal to a deflector for deflecting an electron beam emitted from an electron gun.

22. The three-dimensional coordinate measuring apparatus as claimed in claim 20, incorporated in a scanning electron microscope, wherein the imaging optical system comprises a telecentric system and the first and second incident angle adjusting sections comprise deflector control units for sending a control signal to a deflector for deflecting an electron beam emitted from an electron gun.

23. A three-dimensional coordinate measuring method that makes a computer perform the step of:

causing a first incident angle adjusting section to adjust an attitude of an object in a direction of a first neutral axis;

adjusting an incident angle of a beam projected from an imaging optical system in a direction generally parallel to a yaw axis of the object relative to the object to form a first stereoscopic image of the object;

searching for corresponding points corresponding to measurement points in a first search direction generally perpendicular to the first neutral axis direction in the first stereoscopic image;

judging whether there is an area in which a shape measuring section cannot obtain three-dimensional coordinate data in the first stereoscopic image;

adjusting the attitude of the object in a direction of a second neutral axis so that the shape measuring section can measure three-dimensional coordinate data in the area determined as an immeasurable area;

adjusting the incident angle of the beam relative to the object to form a second stereoscopic image of the object;

searching for corresponding points corresponding to measurement points in a second search direction generally perpendicular to the second neutral axis in the second stereoscopic image; and obtaining three-dimensional coordinate date of the object based on relation between the measurement points and the corresponding points in the first and second stereoscopic images.

\* \* \* \* \*